United States Patent
Kim et al.

(10) Patent No.: US 11,968,824 B2
(45) Date of Patent: Apr. 23, 2024

(54) SEMICONDUCTOR MEMORY DEVICES

(71) Applicant: Samsung Electronics Co., Ltd., Suwon-si (KR)

(72) Inventors: Youngjun Kim, Osan-si (KR); Seokhyun Kim, Incheon (KR); Jinhyung Park, Bucheon-si (KR); Hoju Song, Seongnam-si (KR); Hyeran Lee, Hwaseong-si (KR); Sungwoo Kim, Hwaseong-si (KR); Bongsoo Kim, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 18/137,169

(22) Filed: Apr. 20, 2023

(65) Prior Publication Data

US 2023/0255021 A1 Aug. 10, 2023

Related U.S. Application Data

(63) Continuation of application No. 17/667,697, filed on Feb. 9, 2022, now Pat. No. 11,678,478, which is a (Continued)

(30) Foreign Application Priority Data

Jun. 21, 2019 (KR) .......................... 10-2019-0074000

(51) Int. Cl.
*H01L 27/10* (2006.01)
*H01L 21/768* (2006.01)
*H10B 12/00* (2023.01)

(52) U.S. Cl.
CPC ..... *H10B 12/485* (2023.02); *H01L 21/76829* (2013.01); *H10B 12/0335* (2023.02); *H10B 12/09* (2023.02); *H10B 12/315* (2023.02)

(58) Field of Classification Search
CPC .. H10B 12/485; H10B 12/0335; H10B 12/09; H10B 12/315; H10B 12/482;
(Continued)

(56) References Cited

U.S. PATENT DOCUMENTS 6,589,837 B1 7/2003 Ban et al.
9,825,146 B2 11/2017 Lim
(Continued)

FOREIGN PATENT DOCUMENTS

KR 10-2000-0056158 A 9/2000
KR 10-0330714 B1 4/2002
(Continued)

*Primary Examiner* — Shouxiang Hu
(74) *Attorney, Agent, or Firm* — Muir Patent Law, PLLC

(57) ABSTRACT

A semiconductor device includes a bit line structure, first and second capping patterns, first and second contact plug structures, and a capacitor. The bit line structure extends on a cell region and a dummy region. The first capping pattern is adjacent the bit line structure on the cell region. The second capping pattern is adjacent the bit line structure on the dummy region. The first contact plug structure is adjacent the bit line structure and the first capping pattern on the cell region, and includes a lower contact plug and a first upper contact plug sequentially stacked. The second contact plug structure is adjacent the bit line structure and the second capping pattern on the dummy region, and includes a dummy lower contact plug and a second upper contact plug sequentially stacked. The capacitor contacts an upper surface of the first contact plug structure on the cell region.

20 Claims, 57 Drawing Sheets

Related U.S. Application Data continuation of application No. 16/832,268, filed on Mar. 27, 2020, now Pat. No. 11,264,392.

(58) Field of Classification Search
CPC ........ H10B 12/50; H10B 12/33; H10B 12/31; H01L 21/76829; H01L 21/76897; H01L 27/10855; H01L 27/10888; H01L 27/10814; H01L 27/10894; H01L 27/10885; H01L 27/10897; H01L 27/1082; H01L 27/10808

See application file for complete search history.

(56) References Cited

U.S. PATENT DOCUMENTS

| | | |
|---|---|---|
| 9,947,668 B2 | 4/2018 | Lee et al. |
| 10,109,529 B2 | 10/2018 | Koh et al. |
| 10,847,651 B2 | 11/2020 | Iwaki |
| 2004/0031980 A1 | 2/2004 | Narui et al. |
| 2013/0029470 A1 | 1/2013 | Hataya et al. |
| 2015/0371685 A1* | 12/2015 | Shin ............... H10B 12/315 257/773 |
| 2016/0118331 A1* | 4/2016 | Kim ................ H10B 12/09 257/401 |
| 2017/0025420 A1 | 1/2017 | Park et al. |
| 2018/0084731 A1 | 3/2018 | Harris et al. |
| 2018/0350905 A1* | 12/2018 | Yoon ............... H01L 29/0649 |
| 2019/0027482 A1 | 1/2019 | Kim et al. |

FOREIGN PATENT DOCUMENTS

| | | |
|---|---|---|
| KR | 10-2004-0067021 A | 7/2004 |
| KR | 10-2009-0054725 A | 6/2009 |
| KR | 10-0945510 B1 | 3/2010 |
| KR | 10-2013-0128502 A | 11/2013 |

* cited by examiner

SEMICONDUCTOR MEMORY DEVICES

CROSS-REFERENCE TO RELATED APPLICATION

This application is a continuation application of U.S. patent application Ser. No. 17/667,697, filed Feb. 9, 2022, which is a continuation application of U.S. patent application Ser. No. 16/832,268, filed Mar. 27, 2020, which claims priority under 35 USC § 119 to Korean Patent Application No. 10-2019-0074000, filed on Jun. 21, 2019 in the Korean Intellectual Property Office (KIPO), the contents of each of which are herein incorporated by reference in their entirety.

BACKGROUND

1. Field

Example embodiments relate to a semiconductor device. More particularly, example embodiments relate to a dynamic random access memory (DRAM) device.

2. Description of the Related Art

In a DRAM device, a dummy region may be formed between a cell region where memory cells are formed and a peripheral circuit region where peripheral circuit patterns are formed. Active patterns where transistors are formed may be formed in the cell region, however, some portions of the active patterns may remain in the dummy region, and when conductive materials are formed on the portions of the active patterns in the dummy region, electrical shorts may be generated between neighboring structures, e.g., bit line structures.

SUMMARY

Example embodiments provide a semiconductor device having improved characteristics.

According to example embodiments, a semiconductor device includes a bit line structure, a first capping pattern, a second capping pattern, a first contact plug structure, a second contact plug structure, and a capacitor. The bit line structure extends in a second direction on a cell region and a dummy region of a substrate including the cell region, a peripheral circuit region surrounds the cell region, and the dummy region is between the cell region and the peripheral circuit region. The first capping pattern is adjacent the bit line structure in a first direction perpendicular to the second direction on the cell region of the substrate. The second capping pattern is adjacent the bit line structure on the dummy region of the substrate. The first contact plug structure is adjacent the bit line structure and the first capping pattern on the cell region of the substrate, and includes a lower contact plug and a first upper contact plug sequentially stacked in a vertical direction substantially perpendicular to an upper surface of the substrate. The second contact plug structure is adjacent the bit line structure and the second capping pattern on the dummy region of the substrate, and includes a dummy lower contact plug and a second upper contact plug sequentially stacked in the vertical direction. The capacitor contacts an upper surface of the first contact plug structure on the cell region of the substrate.

According to example embodiments, which may include the above-listed embodiments, a semiconductor device includes a gate structure, a bit line structure, a first contact plug structure, a second contact plug structure, and a capacitor. The gate structure extends in a first direction at a cell region of the substrate including the cell region and a dummy region surrounding the cell region, and the first direction is parallel to an upper surface of the substrate. The bit line structure extends in a second direction on the cell region and the dummy region of the substrate, and the second direction is parallel to the upper surface of the substrate and crosses the first direction. The first contact plug structure is adjacent the bit line structure in the first direction on the cell region of the substrate, and includes a lower contact plug and a first upper contact plug stacked in a vertical direction substantially perpendicular to an upper surface of the substrate. The second contact plug structure is adjacent the bit line structure in the first direction and the second capping pattern on the dummy region of the substrate, and may include a dummy lower contact plug and a second upper contact plug sequentially stacked in the vertical direction. The capacitor contacts an upper surface of the first contact plug structure on the cell region of the substrate. The dummy lower contact plug is adjacent in the first direction to an end of the bit line structure in the second direction on the dummy region of the substrate.

According to example embodiments, which may include one or more of the above-listed embodiments, a semiconductor device includes a bit line structure, a first contact plug structure, a second contact plug structure, and a capacitor. The bit line structure extends on a cell region and a dummy region of a substrate including the cell region and the dummy region surrounding the cell region, and an active pattern is defined at an upper portion of the substrate by an isolation pattern on the substrate. The first contact plug structure is adjacent the bit line structure on the cell region of the substrate, and includes a lower contact plug and a first upper contact plug sequentially stacked in a vertical direction perpendicular to an upper surface of the substrate. The second contact plug structure is adjacent the bit line structure on the dummy region of the substrate, and includes a dummy lower contact plug and a second upper contact plug sequentially stacked in the vertical direction. The capacitor contacts an upper surface of the first contact plug structure on the cell region of the substrate. The dummy lower contact plug is formed on the isolation pattern and includes doped polysilicon. The semiconductor device further includes an etch stop layer including a nitride between the dummy lower contact plug and the isolation pattern.

According to example embodiments, which may include one or more of the above-listed embodiments, a semiconductor device includes a bit line structure, capping patterns, contact plug structures, and for each contact plug structure on the cell region of the substrate, a capacitor. The bit line structure extends in a direction on a cell region and a dummy region of a substrate including the cell region and the dummy region surrounding the cell region, and active patterns may be defined at an upper portion of the substrate by an isolation pattern on the substrate. Some of the capping patterns are adjacent the bit line structure on the cell region of the substrate, and some of the capping patterns adjacent the bit line structure on the dummy region of the substrate. The contact plug structures may be formed between the capping patterns on the cell region and between the capping patterns on the dummy region of the substrate, and each of the contact plug structures may include lower and upper contact plugs sequentially stacked in a vertical direction perpendicular to an upper surface of the substrate. For each contact plug structure on the cell region of the substrate, a capacitor contacts an upper surface of the contact plug structure. Ones of the lower contact plugs and ones of the capping patterns on the dummy region of the substrate are formed on the isolation pattern, and an etch stop layer may be formed between the isolation and each of the ones of the lower contact plugs and between the isolation pattern and each of the ones of the capping patterns.

DESCRIPTION OF EMBODIMENTS

Example embodiments will be more clearly understood from the following detailed description taken in conjunction with the accompanying drawings.

Figure 1:
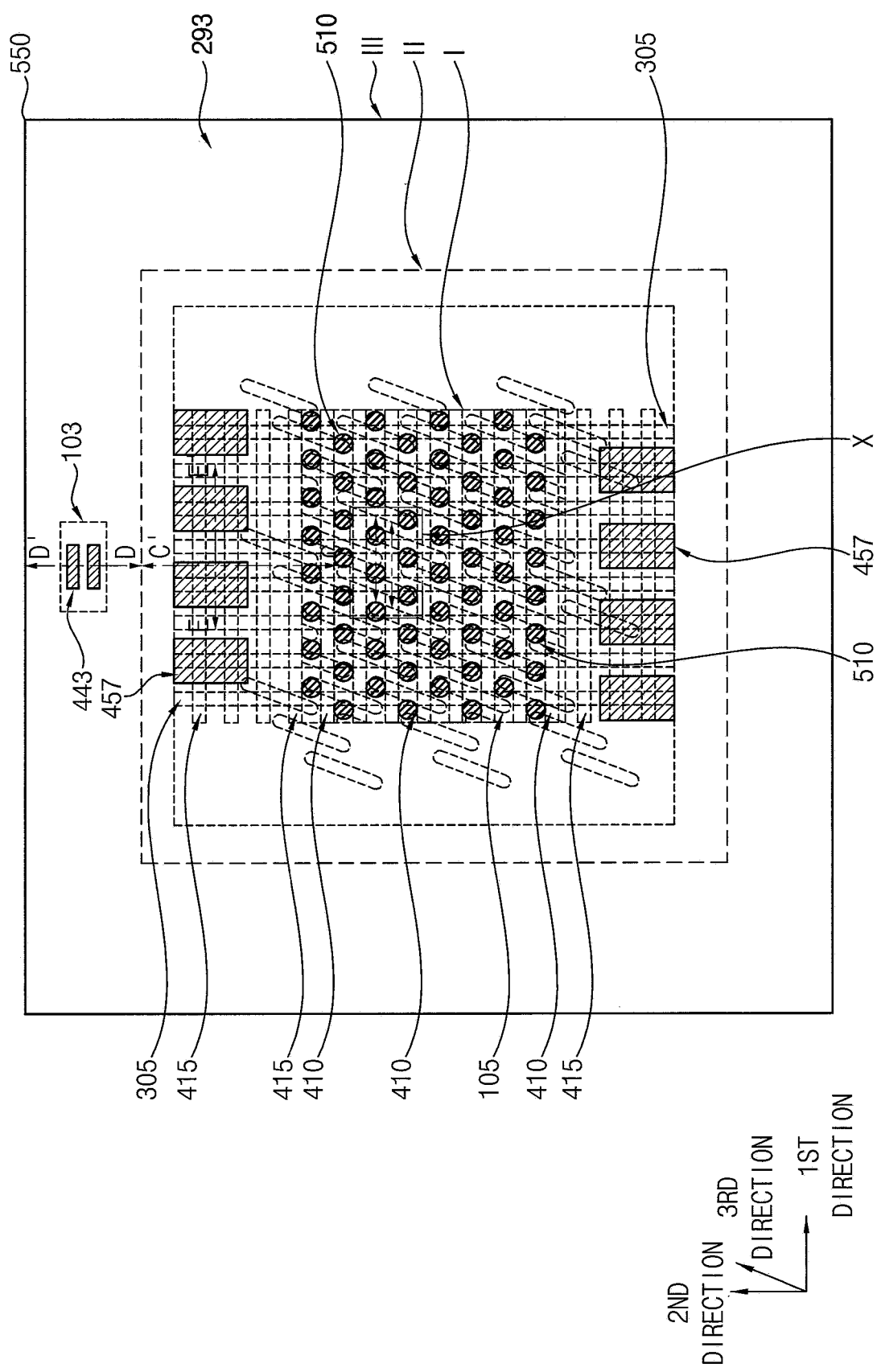
FIGS. 1 to 5 are plan views and cross-sectional views illustrating a semiconductor device in accordance with example embodiments.
Figure 2:
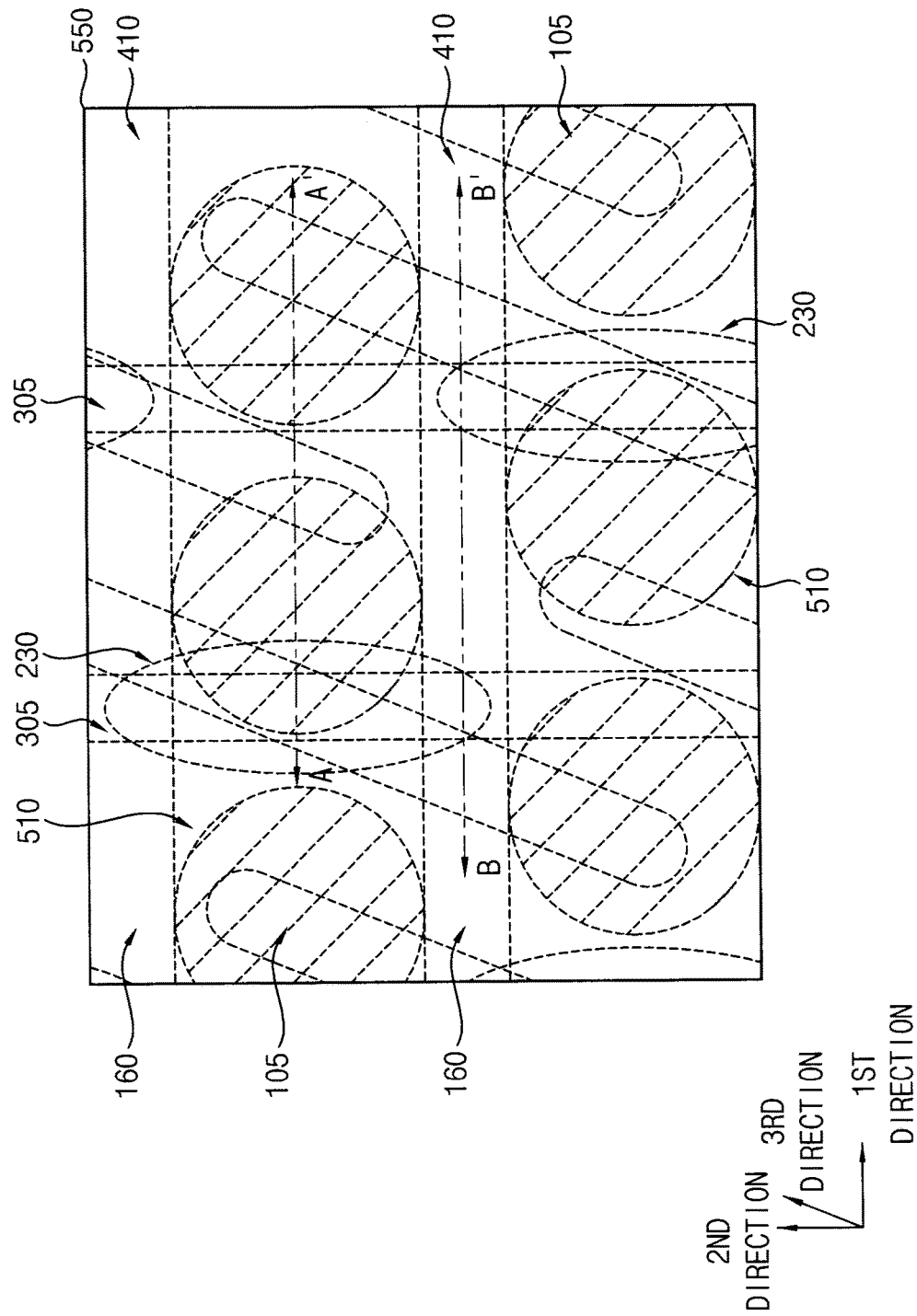
Figure 3:
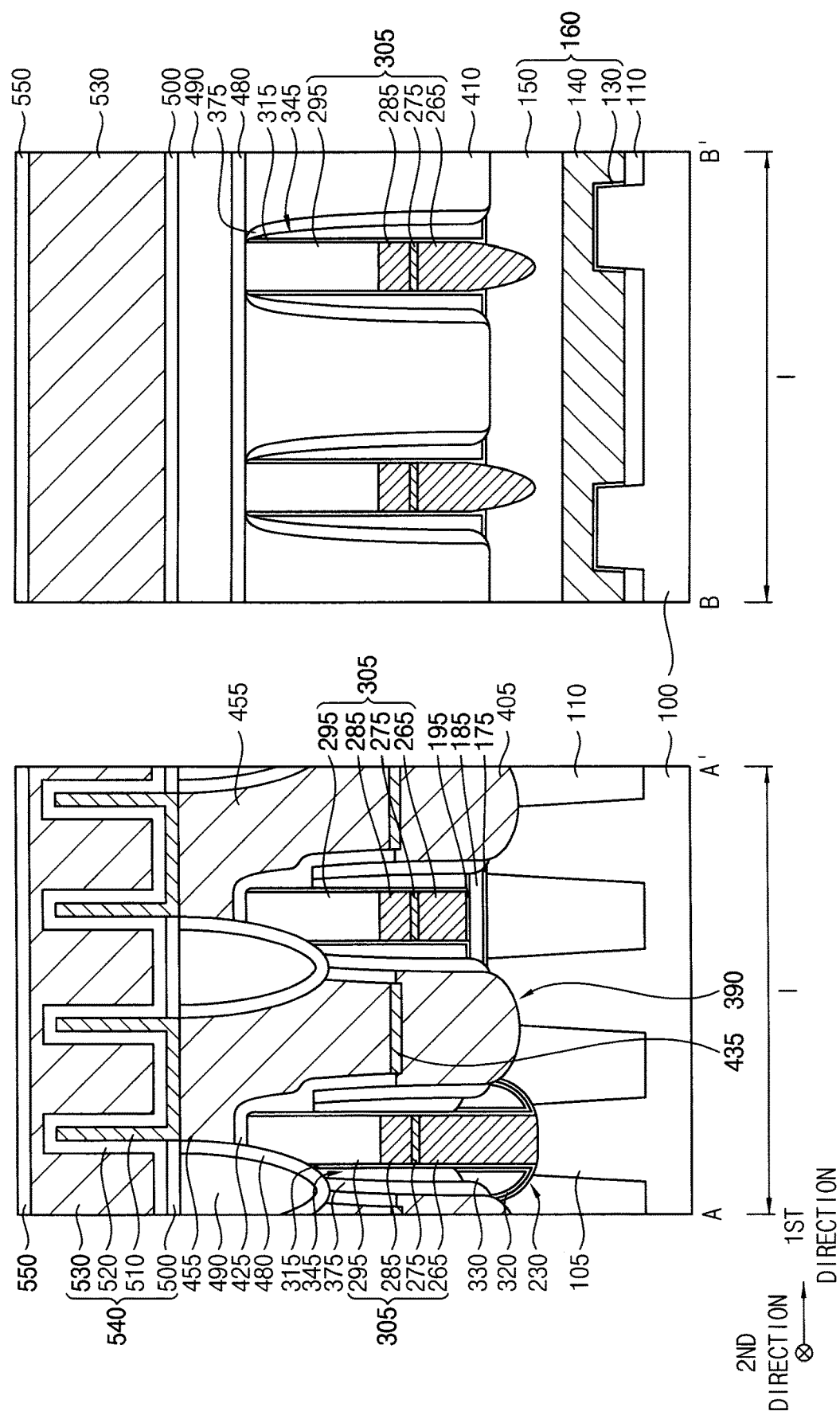
Figure 4:
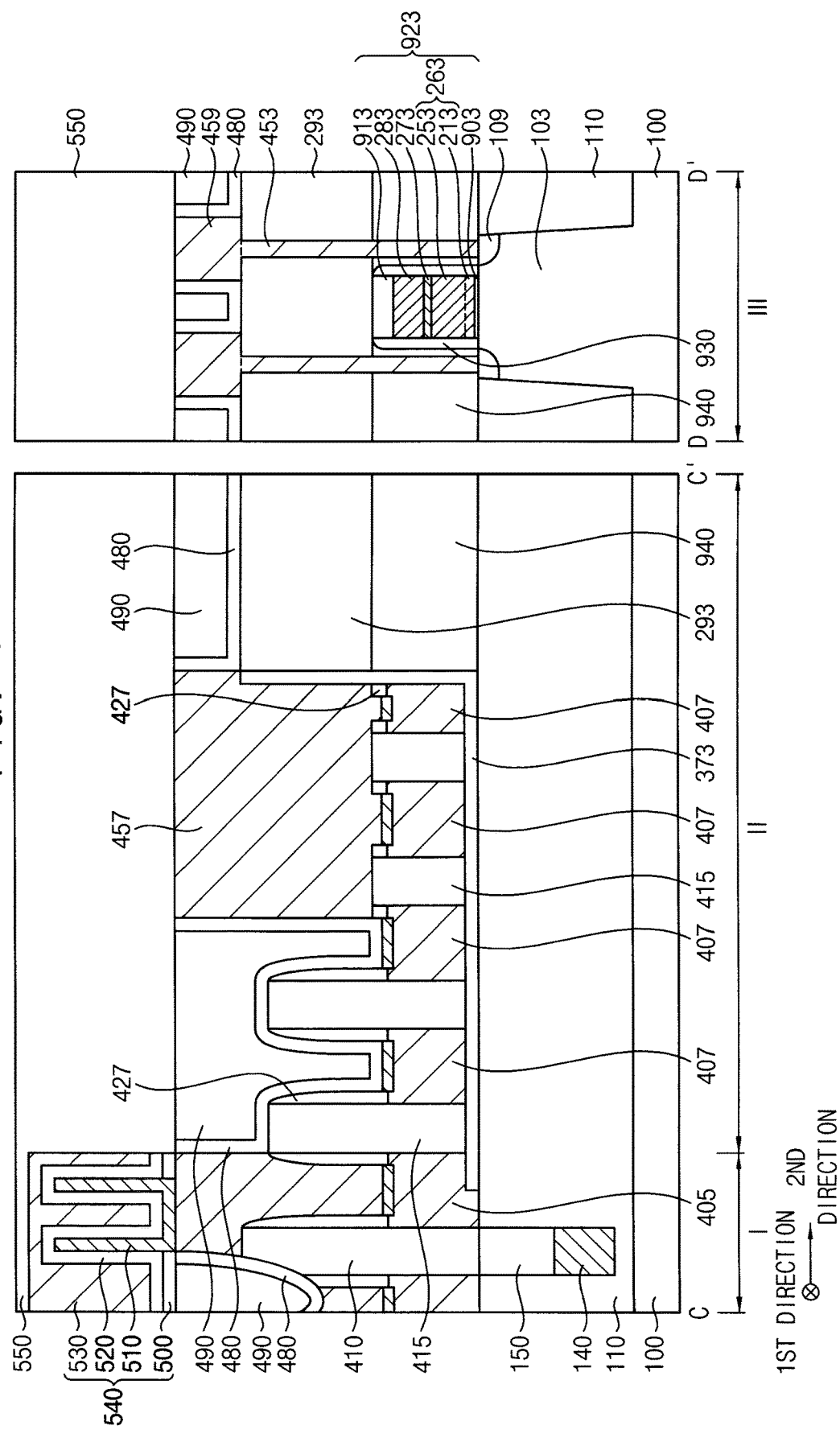
Figure 5:
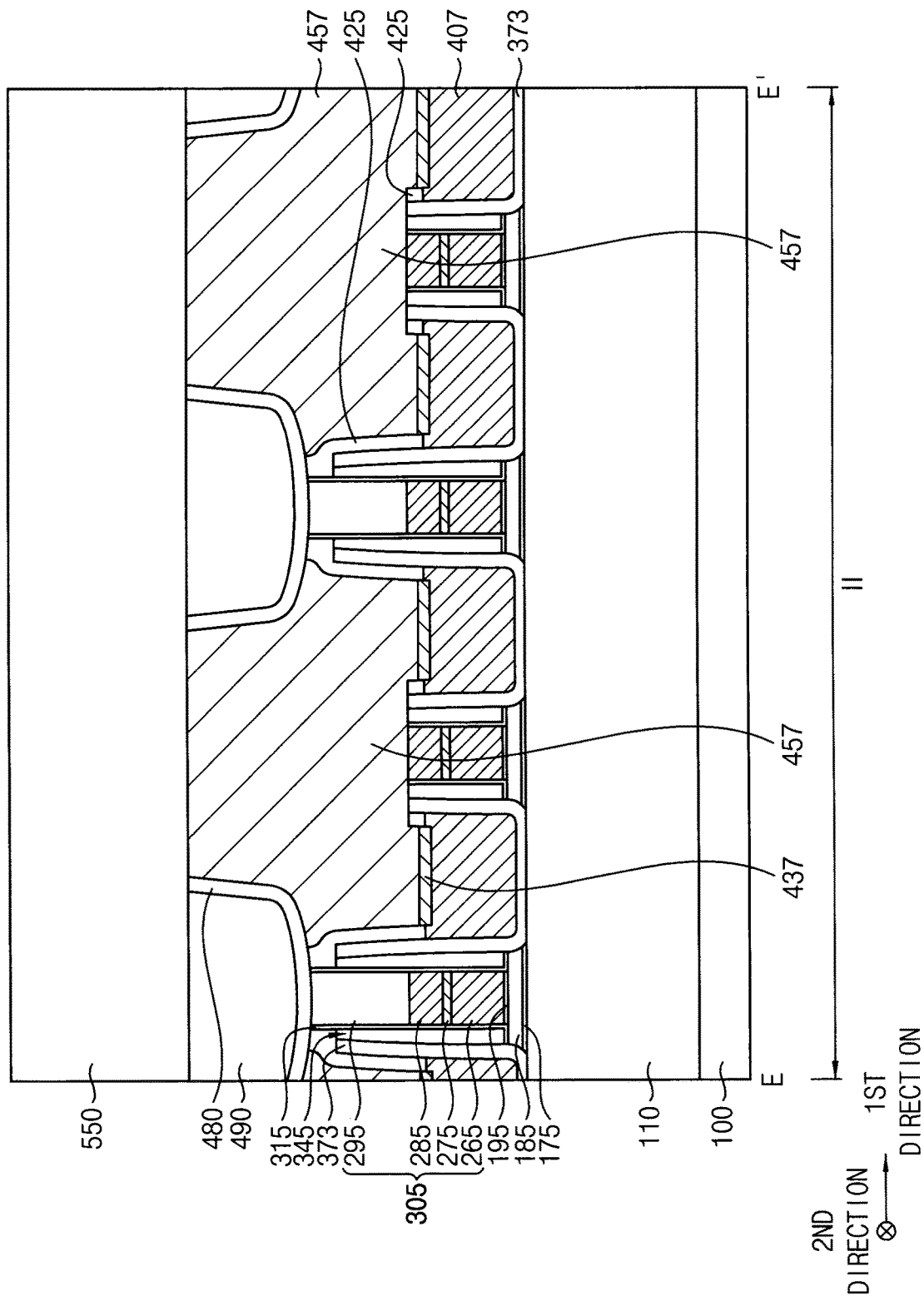

FIGS. 1 to 5 are plan views and cross-sectional views illustrating a semiconductor device in accordance with example embodiments. Particularly, FIGS. 1 and 2 are the plan views, and FIGS. 3 to 5 are the cross-sectional views. FIG. 3 includes cross-sections taken along lines A-A and B-B', respectively, of FIG. 1, FIG. 4 includes cross-sections taken along lines C-C' and D-D', respectively, of FIG. 1, and FIG. 5 includes a cross-section taken along a line E-E' of FIG. 1. FIG. 2 is an enlarged plan view of a region X of FIG. 1. In order to avoid complexity, FIG. 1 does not show the lines A-A' and B-B', which are be referred to in FIG. 6.

Hereinafter, two directions substantially parallel to an upper surface of the substrate 100 and substantially perpendicular to each other may be referred as first and second directions, respectively, and a direction substantially parallel to the upper surface of the substrate 100 and having an acute angle with respect to each of the first and second directions may be referred to as a third direction. However, the terms "first," "second," and "third," may refer to other directions depending on their context. In general, the terms "first," "second," "third," etc., are used herein merely as a naming convention, unless the context indicates otherwise. As such, certain items described as "first" or "second" in one section of the specification or claims, may be described as "third," or "fourth," etc., in another section of the specification or claims.

Referring to FIGS. 1 to 5, the semiconductor device may include first and second gate structures 160 and 923, a bit line structure 305, a spacer structure, first and second contact plug structures, and a capacitor 540 on or in a substrate 100. The semiconductor device may further include first, third and fourth capping patterns 293, 410 and 415, first to fifth insulation patterns 175, 185, 195, 320 and 330, first and second etch stop layers 373 and 550, a fifth spacer 427, a third contact plug 453, a source/drain layer 109, a gate spacer 930, a first insulating interlayer pattern 940, and second to fourth insulating interlayers 480, 490 and 550. It should be noted that the layer 550 includes two portions—an etch stop portion, designated as etch stop layer 550 (e.g., the thinner portion shown in FIG. 3 and on the left of FIG. 4), and an insulating interlayer portion, designated as insulating interlayer 550 (e.g., the thicker portion shown in FIGS. 4 and 5).

The substrate 100 may include and be formed of a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

The substrate 100 may include first to third regions I, II and III. In example embodiments, the first region I is a cell region in which memory cells may be formed, the third region III surrounds the first region I and is a region in which perpendicular circuit patterns may be formed, and the second region II is formed between the first and third regions I and III and may be a dummy region in which wirings of the memory cells and the peripheral circuit patterns contact each other. The second region II may have an area greater than those of the first and third regions I and III, however, the inventive concept should not be limited thereto. In some embodiments, the second region II (e.g., dummy region) immediately surrounds the first region I (e.g., cell region), and from a top down view, and does not include any transistors or memory cells, from a top down view.

An isolation pattern 110 may be formed on the substrate 100, and first and second active patterns 103 and 105 of which sidewalls may be covered by the isolation pattern 110 may be defined at upper portions of the substrate 100. The isolation pattern 110 may include an oxide, e.g., silicon oxide.

The first active pattern 103 may be formed in the third region III of the substrate 100, and the second active pattern 105 may be formed in the first region I of the substrate 100. However, some of the second active patterns 105 may be formed in a portion of the second region II of the substrate 100 adjacent the first region I of the substrate 100.

In the drawings, one first active pattern 103 is formed in the third region III of the substrate 100, however, the inventive concept is not limited thereto, and a plurality of first active patterns 103 may be formed in the third region III of the substrate 100.

In example embodiments, a plurality of second active patterns 105 may be formed in each of the first and second directions, and each of the second active patterns 105 may extend in the third direction to a given length.

The first gate structure 160 may extend in the first direction through the second active pattern 105 and the isolation pattern 110 on the first region I of the substrate 100, and a plurality of first gate structures 160 may be formed to be spaced apart from each other in the second direction. The first gate structure 160 may include a first gate insulation layer 130, a first gate electrode 140 and a first gate mask 150 sequentially stacked in a vertical direction substantially perpendicular to an upper surface of the substrate 100.

The first gate insulation layer 130 may be formed on a surface of the second active pattern 105, the first gate electrode 140 may extend on the first gate insulation layer 130 and the isolation pattern 110 in the first direction, and the first gate mask 150 may cover an upper surface of the first gate electrode 140.

The first gate insulation layer 130 may include an oxide, e.g., silicon oxide, the first gate electrode 140 may include a metal, e.g., tungsten, titanium, tantalum, etc., or a metal nitride, e.g., tungsten nitride, titanium nitride, tantalum nitride, etc., and the first gate mask 150 may include a nitride, e.g., silicon nitride.

The second gate structure 923 may include a second gate insulation pattern 903, a first conductive pattern 213, a third conductive pattern 253, a first barrier pattern 273, a first metal pattern 283, and a second gate mask 913 sequentially stacked on the first active pattern 103 on the third region III of the substrate 100.

The second gate insulation pattern 903 may include an oxide, e.g., silicon oxide, the first and third conductive patterns 213 and 253 may include, e.g., doped polysilicon, the first barrier pattern 273 may include a metal, e.g., titanium, tantalum, etc., and/or a metal nitride, e.g., titanium nitride, tantalum nitride, etc., and the first metal pattern 283 may include a metal, e.g., tungsten. The first and third conductive patterns 213 and 253 sequentially stacked may include substantially the same material, and thus may be merged with each other (e.g., to be continuously and/or integrally formed) to form a second gate electrode 263. Terms such as "same," "equal," "planar." or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The source/drain layer 109 may be formed on the first active pattern 103 adjacent the second gate structure 923, and the second gate structure 923 and the source/drain layer 109 may form a transistor.

A sidewall of the second gate structure 923 may be covered by the gate spacer 930, and an outer sidewall of the gate spacer 930 may be covered by the first insulating interlayer pattern 940. The gate spacer 930 may include a nitride, e.g., silicon nitride.

The first insulating interlayer pattern 940 may be formed on the second and third regions II and III of the substrate 100, and the first capping pattern 293 may be formed on the first insulating interlayer pattern 940. In example embodiments, the first insulating interlayer pattern 940 and the first capping pattern 293 may be formed on the entire third region III of the substrate 100 and a portion of the second region II of the substrate 100. The first capping pattern 293 may include a nitride. e.g., silicon nitride.

In example embodiments, the first etch stop layer 373 may be formed on sidewalls of the first insulating interlayer pattern 940 and the first capping pattern 293. Further, the first etch stop layer 373 may be formed on a portion of the isolation pattern 110 on the second region III of the substrate 100, and an edge portion of the first region I of the substrate 100 adjacent thereto. The first etch stop layer 373 may include a nitride, e.g., silicon nitride.

The bit line structure 305 may extend in the vertical direction on the first region I of the substrate 100 and a portion of the second region II of the substrate 100 adjacent thereto, and may include a conductive structure 265, a second barrier pattern 275, a second metal pattern 285, and a second capping pattern 295 sequentially stacked in the vertical direction. In example embodiments, the bit line structure 305 may extend in the second direction on the second active pattern 105, the isolation pattern 110 and the first gate structure 160.

Figure 24:
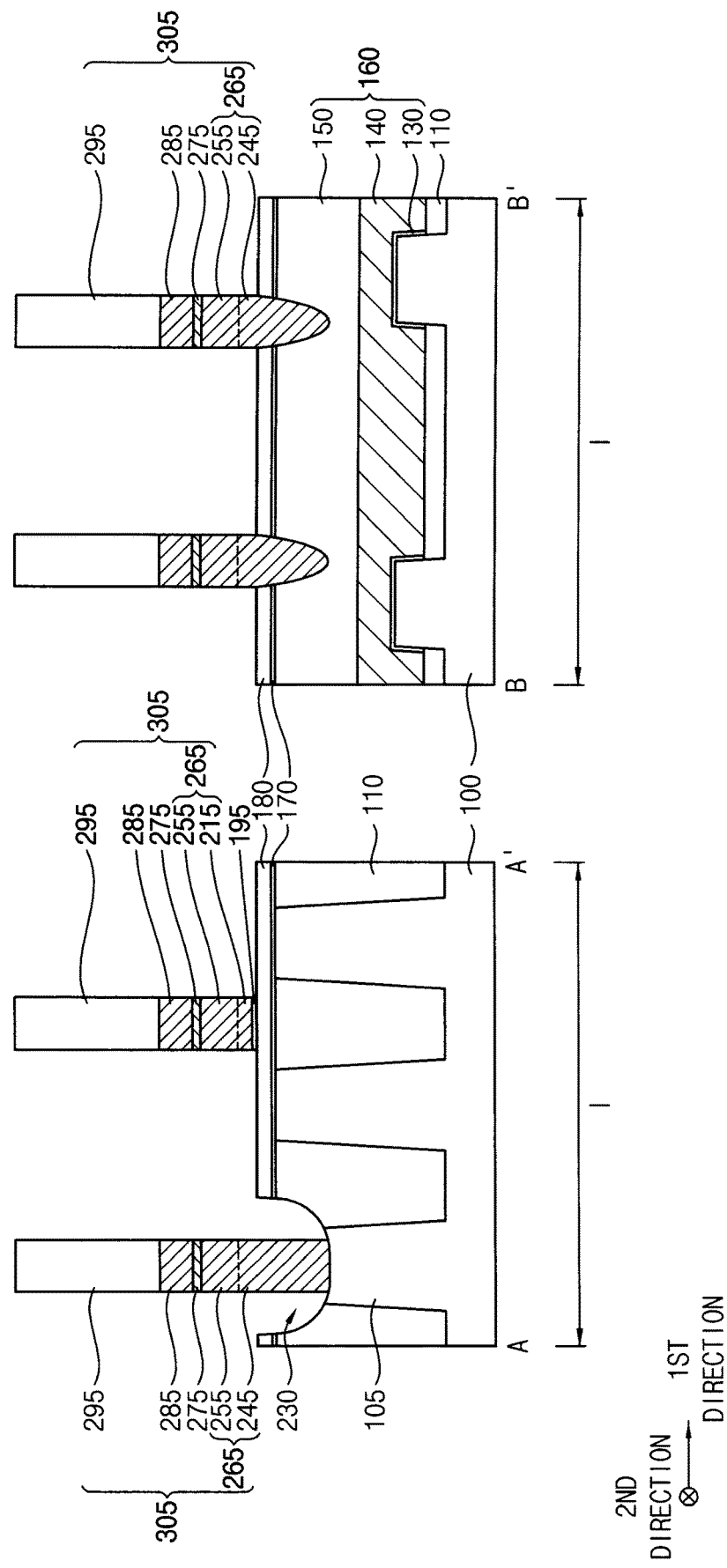
Figure 25:
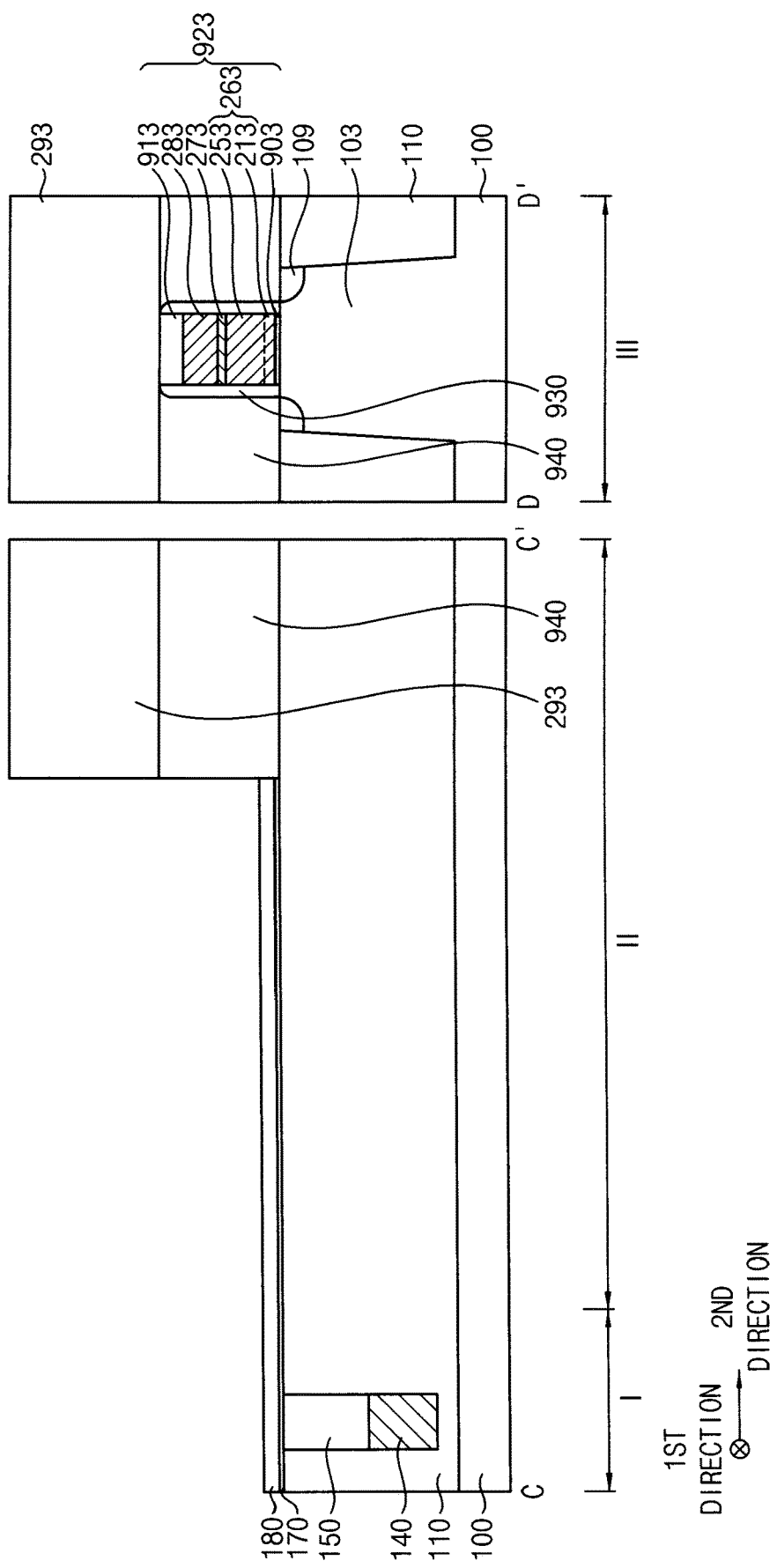

The conductive structure 265 may include fourth and fifth conductive patterns 245 and 255 (refer to FIG. 24) sequentially stacked or second and fifth conductive patterns 215 and 255 sequentially stacked (refer to FIG. 24). A plurality of fourth conductive patterns 245 may be formed to be spaced apart from each other in each of the first and second directions. For example, each of the fourth conductive patterns 245 may be formed in a third recess 230 on an upper surface of the second active pattern 105, and on upper surfaces of the isolation pattern 110 and the first gate mask 150 adjacent thereto, and the second conductive pattern 215 may be formed outside of the third recess 230.

The fifth conductive pattern 255 may extend in the second direction on the second and fourth conductive patterns 215 and 245 disposed in the second direction. The fourth and fifth conductive patterns 245 and 255 may include a material substantially the same as those of the first and third conductive patterns 213 and 253, respectively. e.g., doped polysilicon, and thus may be merged with each other (e.g., to be continuously and/or integrally formed).

In example embodiments, an end portion of the bit line structure 305 in the second direction contacts the first etch stop layer 373 on sidewalls of the first insulating interlayer pattern 940 the first capping pattern 293. The term "contact," as used herein, refers to a direct connection (e.g., touching).

Each of the second barrier pattern 275, the second metal pattern 285 and the second capping pattern 295 may extend in the second direction on the fifth conductive pattern 255. The second barrier pattern 275 may include a material substantially the same as that of the first metal pattern 283, and the second capping pattern 295 may include a material substantially the same as that of the first capping pattern 293.

The spacer structure may be formed on each of opposite sidewalls of the bit line structure 305, and thus may extend in the second direction. The spacer structure may include a first spacer 315, an air spacer 345, a third spacer 375 and a fourth spacer 425 sequentially stacked on each of opposite sidewalls of the bit line structure 305.

The first spacer 315 may contact a sidewall of the bit line structure 305 in the first direction, the air spacer 345 may contact an outer sidewall of the first spacer 315, the third spacer 375 may contact an outer sidewall of the air spacer 345, the fourth spacer 425 may contact an upper surface of the second capping pattern 295, an upper surface and an upper outer sidewall of the first spacer 315, an upper surface of the air spacer 345, and an upper and upper outer sidewall of the third spacer 375. However, at an area where a sidewall of the bit line structure 305 in the first direction is covered by the third capping pattern 410, the air spacer 345 and the third spacer 375 may be sequentially stacked in the first direction on an outer sidewall of the first spacer 315, and the fourth spacer 425 may not be formed.

In example embodiments, uppermost surfaces of the air spacer 345 and the third spacer 375 may be lower than an upper surface of the first spacer 315 and higher than an upper surface of the second metal pattern 285.

However, unlike the third spacers 375 on the sidewalls of the bit line structures 305, respectively, which may be spaced apart from each other in the first direction, on the first region I of the substrate 100, the first etch stop layer 373 may be formed not only on the sidewalls of the bit line structures 305 but also on the isolation pattern 110. For example, the spacer structure may include the first etch stop layer 373 on the second region II of the substrate 100 instead of the third spacer 375.

Each of the first, third and fourth spacers 315, 375 and 425 may include a nitride, e.g., silicon nitride, and the air spacer 345 may include air (e.g., atmospheric air, or other gases present during the manufacturing process that fill in the space).

A sidewall of a portion of the bit line structure 305 in the third recess 230 and a bottom surface of the third recess 230 may be covered by the first spacer 315. The fourth insulation pattern 320 may be formed on a portion of the first spacer 315 in the third recess 230, and the fifth insulation pattern 330 may be formed on the fourth insulation pattern 320 to fill a remaining portion of the third recess 230. In example embodiments, the air spacer 345 may contact upper surfaces of the fourth and fifth insulation patterns 320 and 330, and the third spacer 375 may contact an upper surface of the fifth insulation pattern 330.

An insulation pattern structure including the first to third insulation patterns 175, 185 and 195 sequentially stacked in the vertical direction may be formed between portions of the second active pattern 105 and the isolation pattern 110 on which the third recess 230 is not formed and the bit line structure 305. The second insulation pattern 185 may contact a bottom surface of the first spacer 315 having a cross-section of an "L" shape, and the third insulation pattern 195 may contact a bottom surface of the bit line structure.

The first, third and fifth insulation patterns 175, 195 and 330 may include a nitride, e.g., silicon nitride, and the second and fourth insulation patterns 185 and 320 may include an oxide, e.g., silicon oxide.

The third capping pattern 410 may extend in the first direction to overlap the first gate structure 160 extending through the first region I of the substrate 100, and may partially cover an outer sidewall of the spacer structure on the sidewall of the bit line structure 305 in the first direction. The fourth capping pattern 415 may extend in the first direction on a portion of the second region II of the substrate 100 adjacent the first region I of the substrate, and may partially cover the outer sidewall of the spacer structure on the sidewall of the bit line structure 305 in the first direction.

In example embodiments, the third and fourth capping patterns 410 and 415 may be spaced apart from each other in the second direction by a given distance, and upper surfaces of the third and fourth capping patterns 410 and 415 may be substantially coplanar with each other. However, unlike the third capping pattern 410 on the first gate structure 160, the fourth capping pattern 415 may be formed on the isolation pattern 110 and the first etch stop layer 373 sequentially stacked.

The second and fourth capping patterns 410 may include or be formed of substantially the same material, e.g., a nitride such as silicon nitride.

The fifth spacer 427 may be formed on a sidewall of each of the third and fourth capping patterns 410 and 415 in the second direction. The fifth spacer 427 may include or be formed of a material substantially the same as that of the fourth spacer 425.

The first contact plug structure on the first region I of the substrate 100 may include a lower contact plug 405, a first metal silicide pattern 435 and a first upper contact plug 455 sequentially stacked in the vertical direction.

The lower contact plug 405 may be formed on a fourth recess 390 on the second active pattern 105 and the isolation pattern 110 between neighboring ones of the bit line structures in the first direction and neighboring ones of the third capping patterns 410 in the second direction, and may contact an outer sidewall of the third spacer 375 of the spacer structure and a sidewall of each of the third capping patterns 410. Thus, a plurality of lower contact plugs 405 may be formed in each of the first and second directions. In an example embodiment, an uppermost surface of the lower contact plug 405 may be lower than those of the air spacer 345 and the third spacer 375.

The lower contact plug 405 may include, e.g., doped polysilicon. An air gap (not shown) may be formed in the lower contact plug 405. The various contact plugs and contact plug structures described herein may be formed of a conductive material or materials, such as one or more of doped polysilicon, metal silicide, and metal.

The first metal silicide pattern 435 may be formed on the lower contact plug 405. In an example embodiment, the first metal silicide pattern 435 is formed on a central portion of the lower contact plug 405 not overlapping the fourth and fifth spacers 425 and 427 in the vertical direction.

The first metal silicide pattern 435 may include, e.g., cobalt silicide, nickel silicide, etc.

The first upper contact plug 455 may be formed on the first metal silicide pattern 435, and may contact upper surfaces and outer sidewalls of the fourth and fifth spacers 425 and 427 and an upper surface of the third capping pattern 410. Thus, an upper surface of the first upper contact plug 455 may be higher than those of the bit line structure 305 and the third and fourth capping patterns 410 and 415.

In example embodiments, a plurality of first upper contact plugs 455 may be formed in each of the first and second directions, and may be spaced apart from each other by the second and third insulating interlayers 480 and 490 sequentially stacked. The second insulating interlayer 480 may partially extend through an upper portion of the spacer structure on an upper surface and a sidewall of the second capping pattern 295 of the bit line structure 305. The second insulating interlayer 480 may include an insulating material having a low gap filling characteristics, and the third insulating interlayer 490 may include a nitride, e.g., silicon nitride.

In example embodiments, the first upper contact plugs 455 may be disposed in a honeycomb pattern when viewed in a plan view. Each of the upper contact plugs 455 may have a circular shape, an elliptical shape or a polygonal shape in a plan view. The first upper contact plug 455 may include a metal, e.g., tungsten, aluminum, copper etc., and/or doped polysilicon.

The second contact plug structure on the second region II of the substrate 100 may include a dummy lower contact plug 407, a second metal silicide pattern 437 and a second upper contact plug 457.

The dummy lower contact plug 407 may be formed on a portion of the isolation pattern 110 between neighboring ones of the bit line structures in the first direction and neighboring ones of the fourth capping patterns 415 in the second direction, and may contact an outer sidewall of the third spacer 375 of the spacer structure and a sidewall of each of the fourth capping patterns 415. Thus, a plurality of dummy lower contact plugs 407 may be formed in each of the first and second directions. In an example embodiment, an uppermost surface of the dummy lower contact plug 407 may be lower than upper surfaces of the air spacer 345 and the third spacer 375.

In example embodiments, the dummy lower contact plug 407 may be formed on the isolation pattern 110, and the first etch stop layer 373 may be formed between a bottom surface of the dummy lower contact plug 407 and the isolation pattern 110. Thus, the bottom surface of the dummy lower contact plug 407 may be higher than a bottom surface of the lower contact plug 405 in the fourth recess 390 on the second active pattern 105 and the isolation pattern 110 on the first region I of the substrate 100.

In example embodiments, the last one of the dummy lower contact plugs 407 in the second direction may be close to the end portion of the bit line structure 305 in the second direction, and an end portion of the dummy lower contact plug 407 in the second direction may be formed in the same position in the second direction as that of the bit line structure 305.

The dummy lower contact plug 407 may include a material substantially the same as that of the lower contact plug 405 (e.g., a conductive material). An air gap (not shown) may be formed in the dummy lower contact plug 407. As can be seen, in certain embodiments, the dummy lower contact plugs 407 are isolated (e.g., electrically isolated) from any active patterns.

The second metal silicide pattern 437 may be formed on the dummy lower contact plug 407. In an example embodiment, the second metal silicide 437 may be formed on a central portion of the dummy contact plug 407 not overlapping the fourth and fifth spacers 425 and 427 in the vertical direction.

The second metal silicide pattern 437 may include a material substantially the same as that of the first metal silicide pattern 435.

The second upper contact plug 457 may be formed on the second metal silicide pattern 437, and may contact upper surfaces and outer sidewalls of the fourth and fifth spacers 425 and 427 and an upper surface of the fourth capping pattern 415. An upper surface of the second upper contact plug 457 may be substantially coplanar with that of the first upper contact plug 455.

In example embodiments, the second upper contact plug 457 may extend through each of the second capping pattern 295 of even-numbered ones of the bit line structures 305 in the first direction on a portion of the second region II adjacent a first sidewall of the first region I of the substrate 100 in the second direction to contact the second metal pattern 285, and may extend through each of the second capping pattern 295 of odd-numbered ones of the bit line structures 305 in the first direction on a portion of the second region II adjacent a second sidewall of the first region I of the substrate 100 in the second direction, which may be opposite to the first sidewall thereof, to contact the second metal pattern 285. For example, the second upper contact plug 457 may contact the second capping patterns 295 of the bit line structures 305, respectively, on the portions of the second region II of the substrate 100 adjacent the first and second sidewalls, respectively, of the first region I of the substrate 100 in a zigzag pattern.

In example embodiments, a plurality of second upper contact plugs 457 may be formed on the portions of the second region II of the substrate 100 adjacent the first and second sidewalls of the first region I of the substrate 100 in the second direction, which may be spaced apart from each other in the first direction by the second and third insulating interlayers 480 and 490 sequentially stacked. The second insulating interlayer 480 may contact an upper surface of the second capping pattern 295 of the bit line structure 305 and upper surfaces of the first and fourth spacers 315 and 425 on the sidewall of the bit line structure 305.

The capacitor 540 may include a lower electrode 510, a dielectric layer 520 and an upper electrode 530 sequentially stacked. The lower and upper electrodes 510 and 530 may include substantially the same material, e.g., doped polysilicon and/or a metal. The dielectric layer 520 may include an oxide, e.g., silicon oxide, metal oxide and/or a nitride, e.g., silicon nitride, metal nitride, etc. The metal may include, e.g., aluminum, zirconium, titanium, hafnium, etc.

The second etch stop layer 550 may be formed between the second and third insulating interlayers 480 and 490, and may include a nitride, e.g., silicon nitride.

The fourth insulating interlayer 550 may be formed on the second and third insulating interlayers 480 and 490 and the second upper contact plug 457 to cover the capacitor 540, and may include an oxide, e.g., silicon oxide.

In the semiconductor device, like the first contact plug structures and the third capping patterns 410 on the first region I, i.e., the cell region of the substrate 100, the second contact plug structures and the fourth capping patterns 415 may be formed on a portion of the second region II, i.e., the dummy region of the substrate 100 adjacent thereto in the second direction.

However, the dummy lower contact plug 407 of each of the second contact plug structures may be formed on the isolation pattern 110 not to contact the second active pattern 105, and the first etch stop layer 373 may be formed between the isolation pattern 110 and the dummy lower contact plug 407. Thus, the second contact plug structure on the dummy region may not contact the second active pattern 105, and thus electrical short between neighboring elements. e.g., bit line structures 305 may be prevented.

Figure 6:
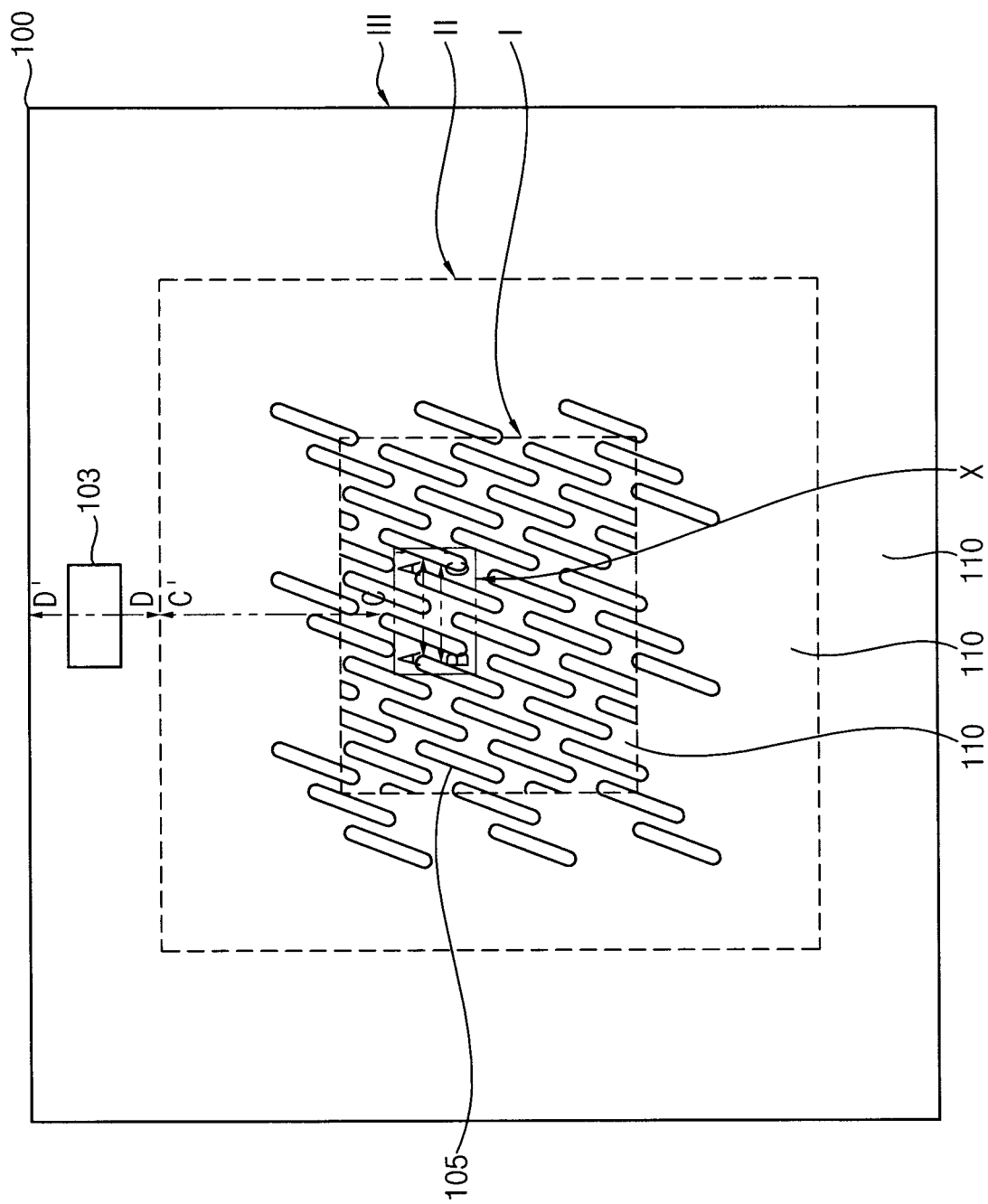
FIGS. 6 to 57 are plan views and cross-sectional views illustrating a semiconductor device in accordance with example embodiments.
Figure 56:
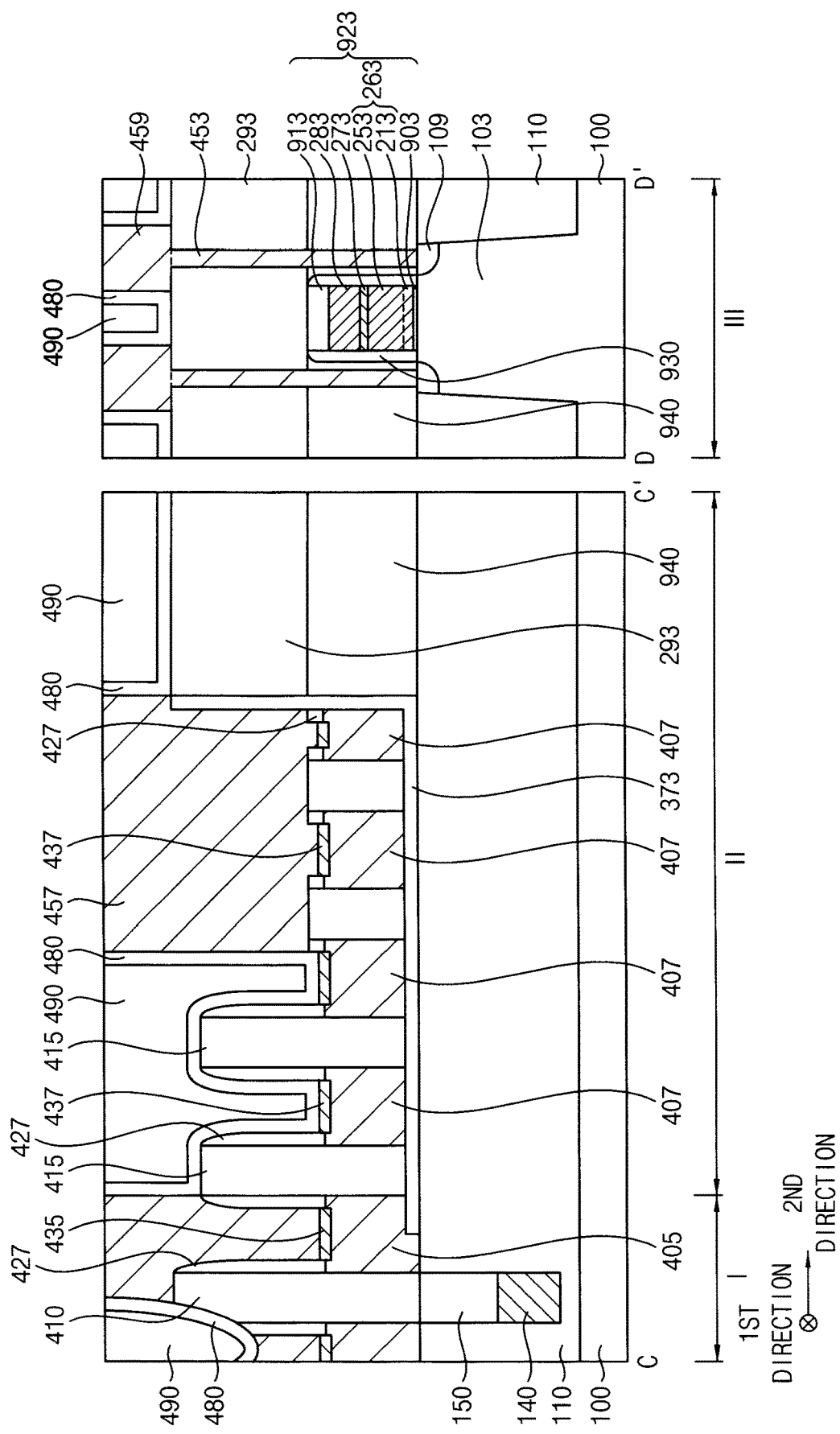
Figure 57:
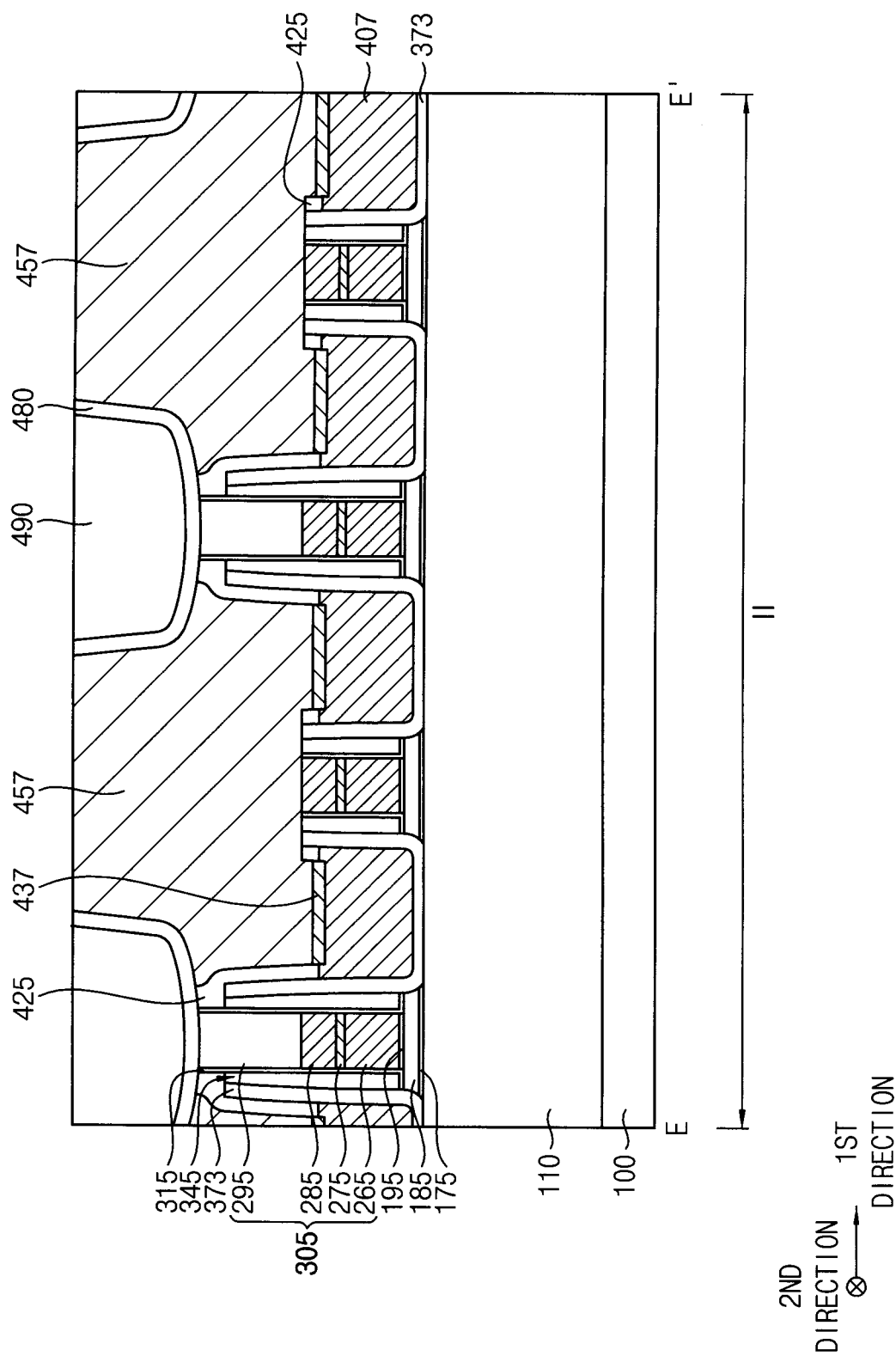

FIGS. 6 to 57 are plan views and cross-sectional views illustrating a semiconductor device in accordance with example embodiments. Particularly, FIGS. 6-7, 9-10, 13, 16, 22-23, 37-38 and 45 are the plan views, and FIGS. 8, 11-12, 14-15, 17-21, 24-36, 39-44 and 46-57 are the cross-sectional views. Each of FIGS. 8, 11, 14, 17-18, 20, 24, 26-27, 29, 31, 33, 35, 39, 41, 43, 46, 49, 52 and 55 includes cross-sections taken along lines A-A' and B-B' of corresponding plan views, respectively, each of FIGS. 12, 15, 19, 21, 25, 28, 30, 32, 34, 36, 40, 42, 44, 47, 50, 53 and 56 includes cross-sections taken along lines C-C' and D-D' of corresponding plan views, respectively, and each of FIGS. 48, 51, 54 and 57 includes a cross-section taken along a line E-E' of corresponding plan views, respectively. Each of FIGS. 7, 10, 13, 16, 23 and 38 is an enlarged plan view of a region X of corresponding plan views, respectively.

Figure 7:
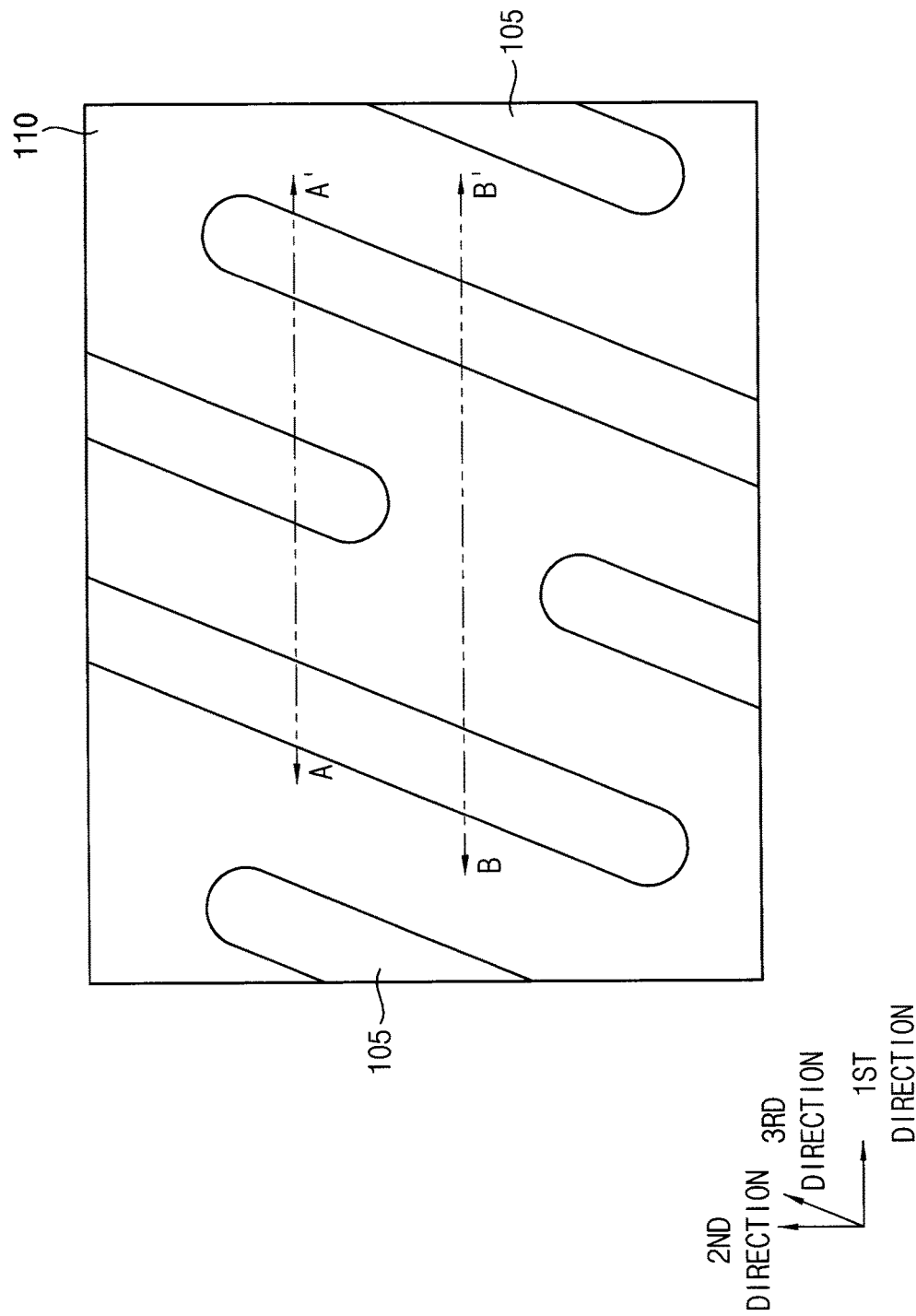
Figure 8:
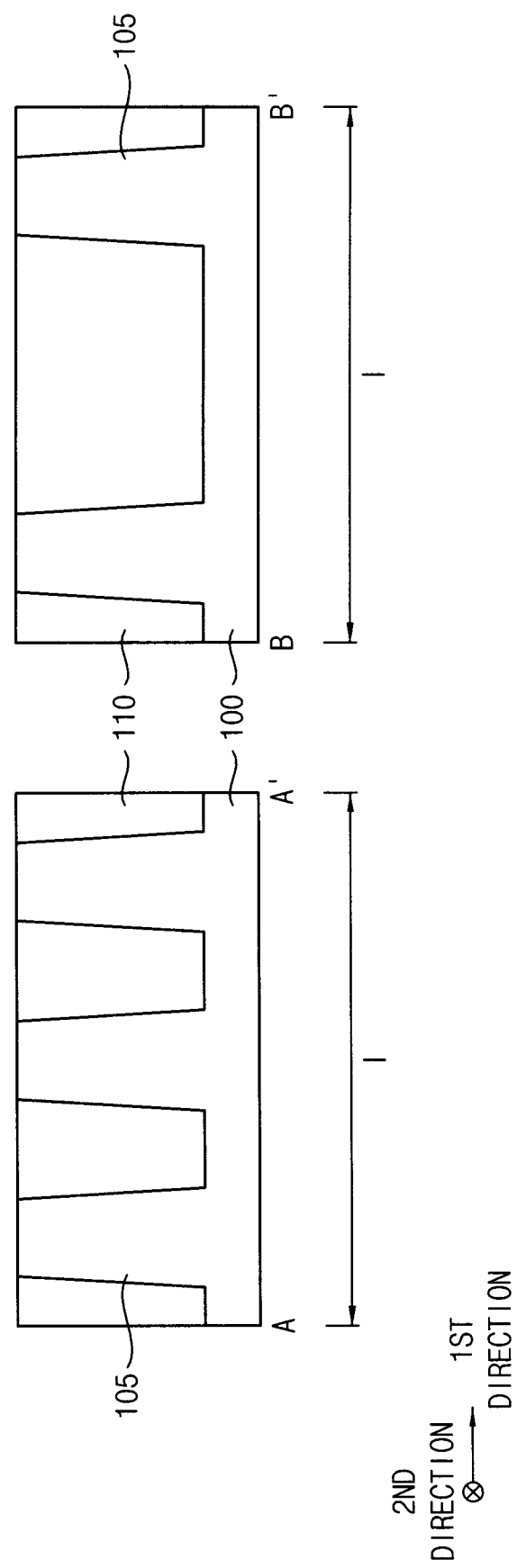
Figure 9:
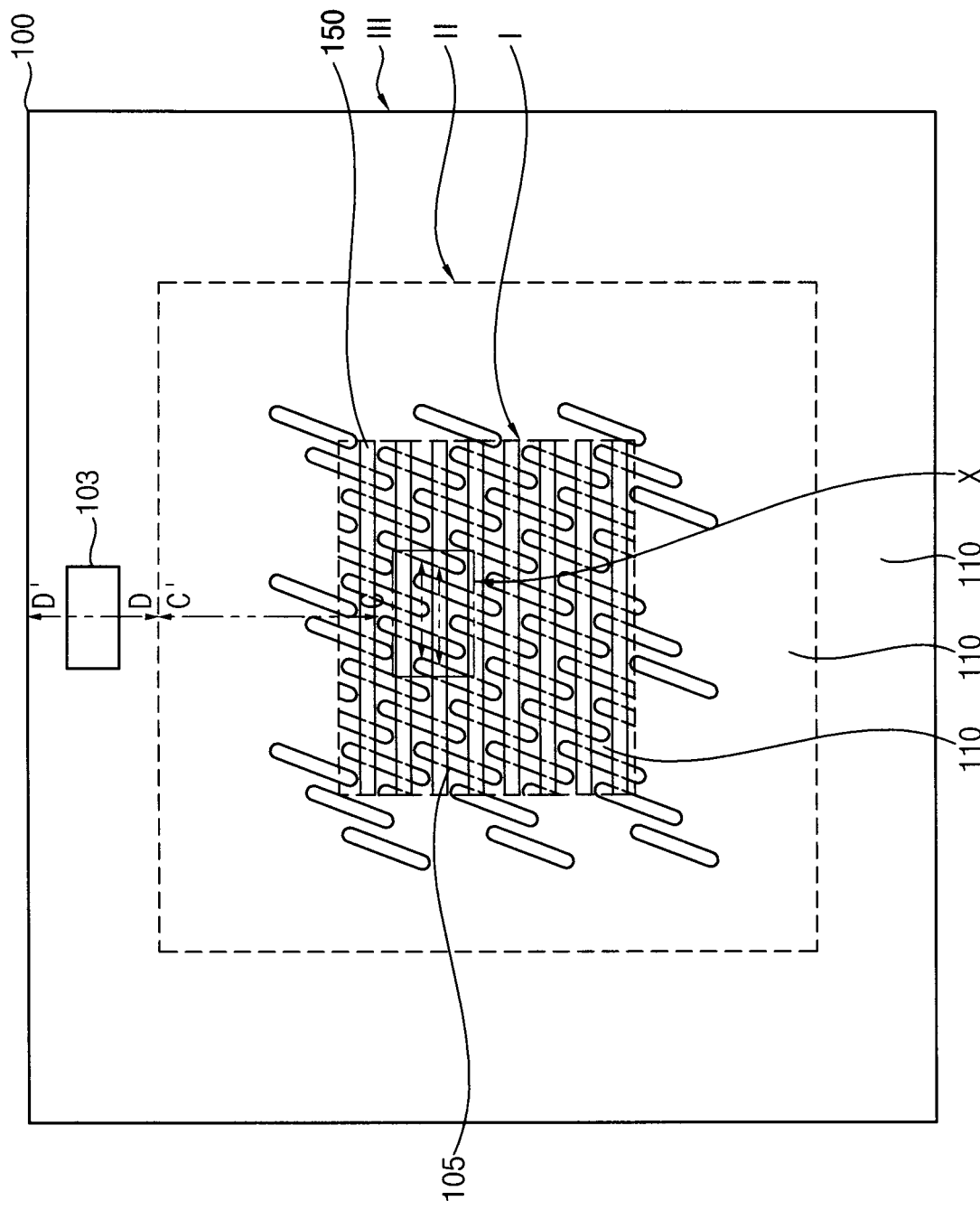
Figure 10:
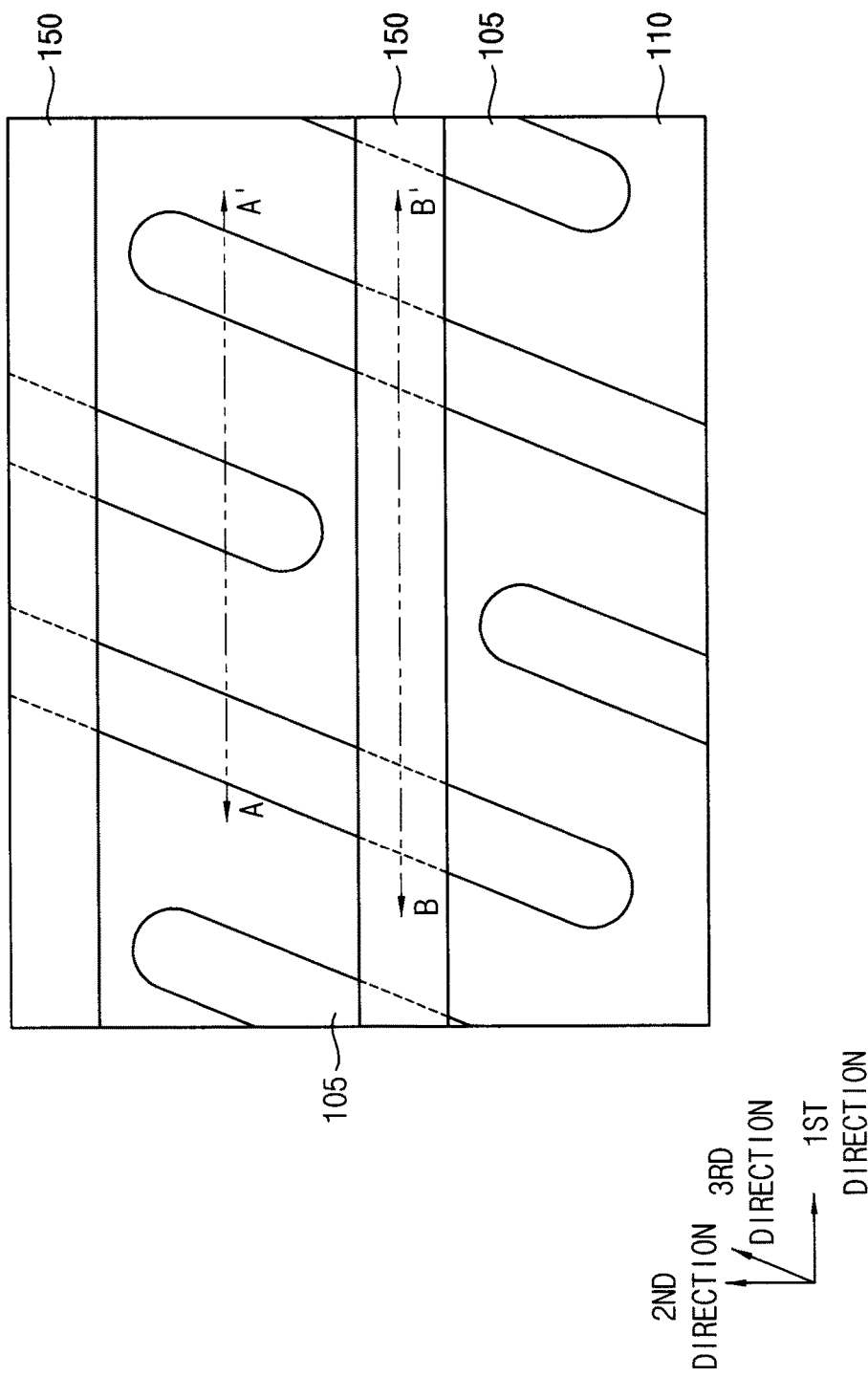
Figure 11:
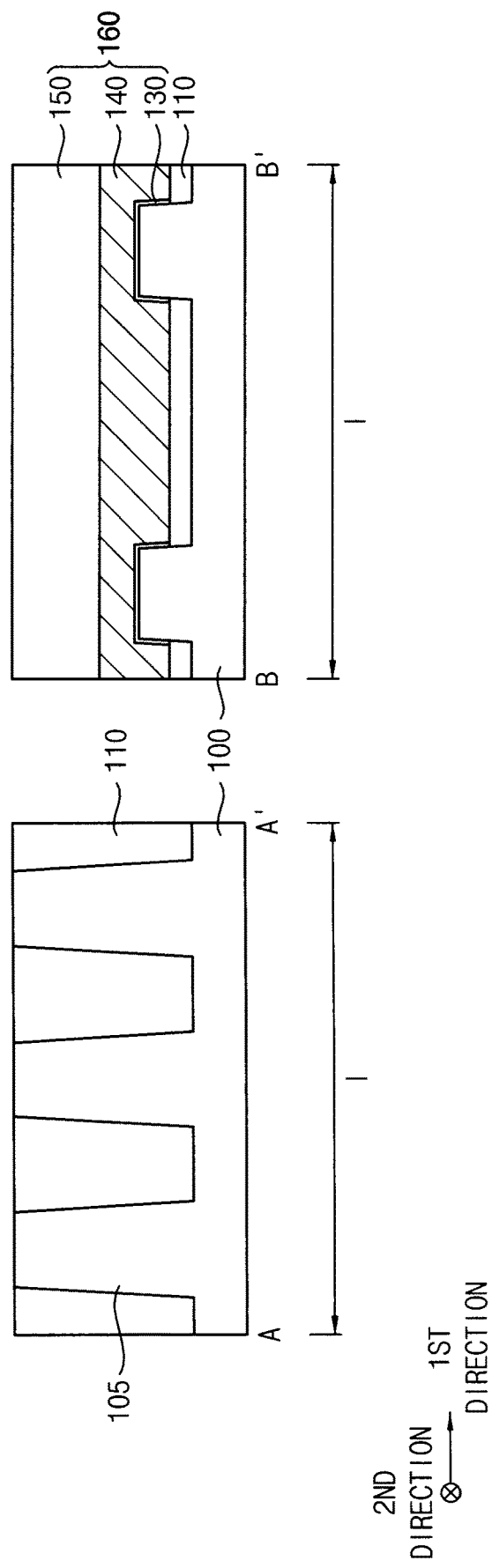
Figure 12:
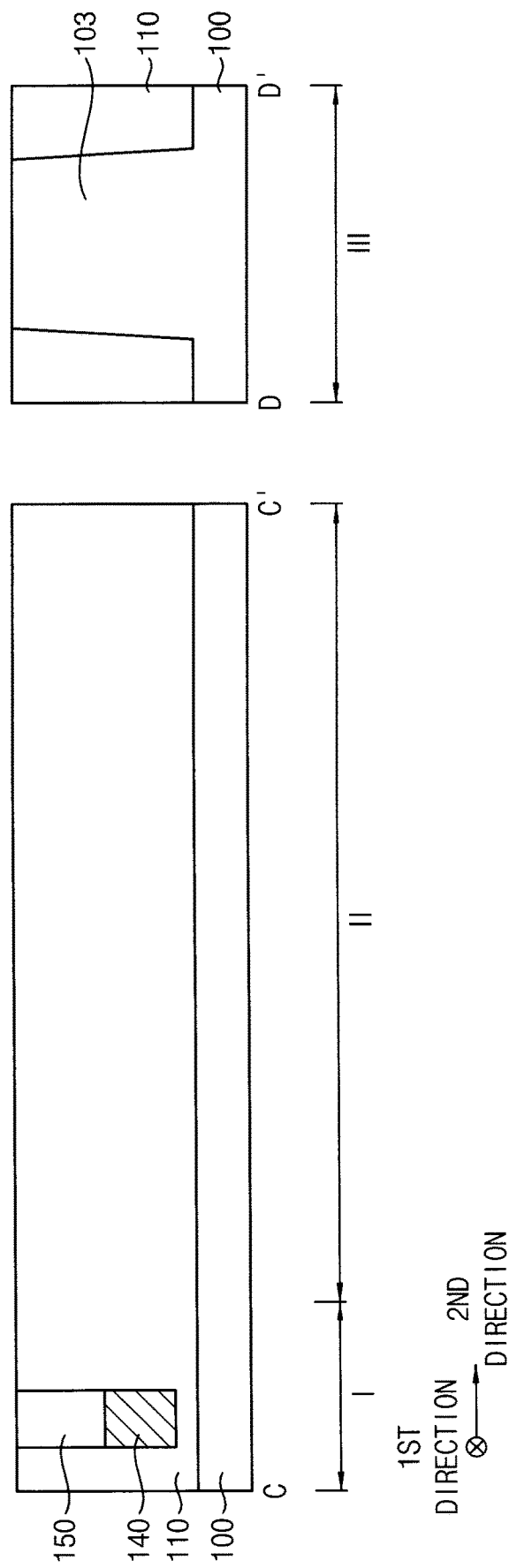

Referring to FIGS. 6 to 8, first and second active patterns 103 and 105 are formed on a substrate 100, and an isolation pattern 110 is formed to cover sidewalls of the first and second active patterns 103 and 105.

The first and second active patterns 103 and 105 may be formed by removing an upper portion of the substrate 100 to form a first recess, and the isolation pattern 110 may be formed by forming an isolation layer on the substrate 100 to fill the first recess and planarizing the isolation layer until upper surfaces of the first and second active patterns 103 and 105 may be exposed. The planarization process may include a chemical mechanical polishing (CMP) process and/or an etch back process. Alternatively, though not shown, the active patterns may be formed by epitaxial growth on a substrate.

Referring to FIGS. 9 to 12, an ion implantation process may be performed onto the substrate 100 to form an impurity region (not shown), and the second active pattern 105 on the first region I of the substrate 100 and the isolation pattern 110 may be partially etched to form a second recess extending in the first direction.

A first gate structure 160 may be formed in the second recess. The first gate structure may include a first gate insulation layer 130 on a surface of the second active pattern 105 exposed by the second recess, a first gate electrode 140 filling a lower portion of the second recess on the first gate insulation layer 130, and a first gate mask 150 filling an upper portion of the second recess on the first gate electrode 140. The first gate structure 160 may extend in the first direction on the first region I of the substrate 100, and a plurality of first gate structures 160 may be formed in the second direction. Though one gate structure 160 is shown, a plurality of gate structures 160 may be formed (e.g., in the first region I), arranged in the second direction and extending in the first direction.

In example embodiments, the first gate insulation layer 130 may be formed by a thermal oxidation process on the surface of the second active pattern 105 exposed by the second recess, and thus may include an oxide, e.g., silicon oxide.

Figure 13:
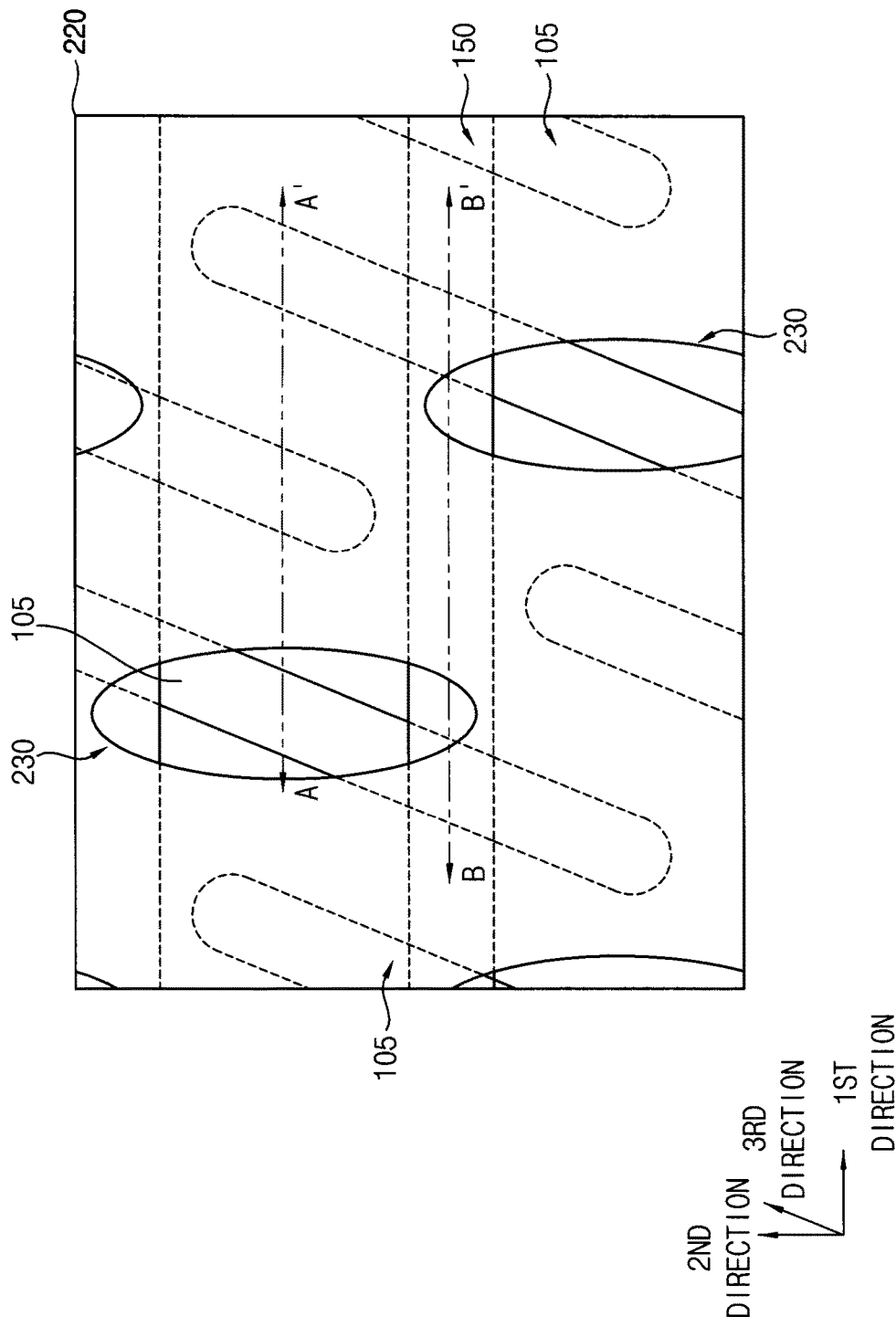
Figure 14:
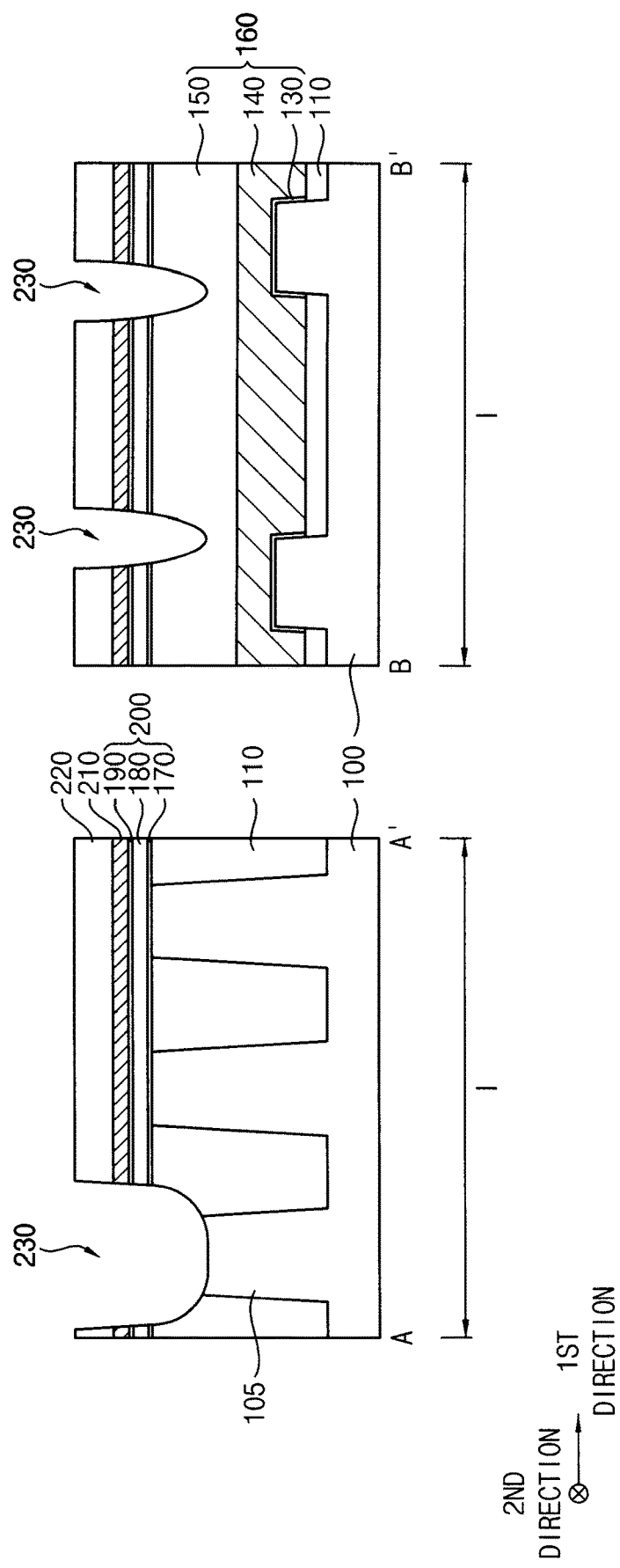
Figure 15:
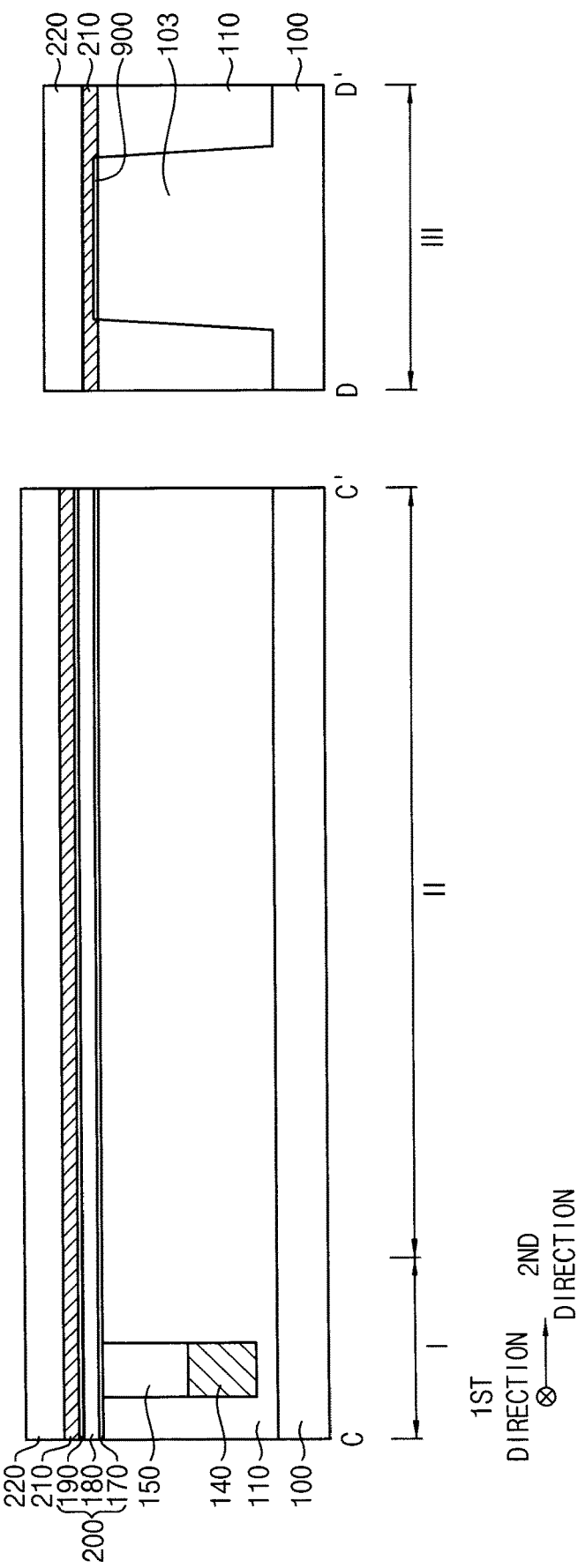

Referring to FIGS. 13 to 15, an upper surface of the first active pattern 103 on the third region III of the substrate 100 may be thermally oxidized to form a second gate insulation layer 900, and an insulation layer structure 200 may be formed on the second active pattern 105 and the isolation pattern 110 on the first and second regions I and II of the substrate 100.

In example embodiments, the insulation layer structure 200 may include first, second and third insulation layers 170, 180 and 190 sequentially stacked. Each of the first and third insulation layers 170 and 190 may include an oxide, e.g., silicon oxide, and the second insulation layer 180 may include a nitride, e.g., silicon nitride.

A first conductive layer 210 and a first mask 220 may be sequentially formed on the insulation layer structure 200, the second gate insulation layer 900 and an isolation pattern 110, and the first conductive layer 210 and the insulation layer structure 200 may be etched using the first mask 220 as an etching mask to form a first opening 230 exposing the second active pattern 105.

The first mask 220 may include a nitride, e.g., silicon nitride.

During the etching process, an upper portion of the second active pattern 105 exposed by the first opening 230 and an upper portion of the isolation pattern 110 adjacent thereto, and an upper portion of the first gate mask 150 may be also etched to form a third recess. That is, a bottom of the first opening 230 may be referred to as the third recess.

In example embodiments, the first opening 230 may expose a central upper surface of each of the second active patterns 105, and thus a plurality of first openings 230 may be formed in each of the first and second directions on the first region I of the substrate 100.

Figure 16:
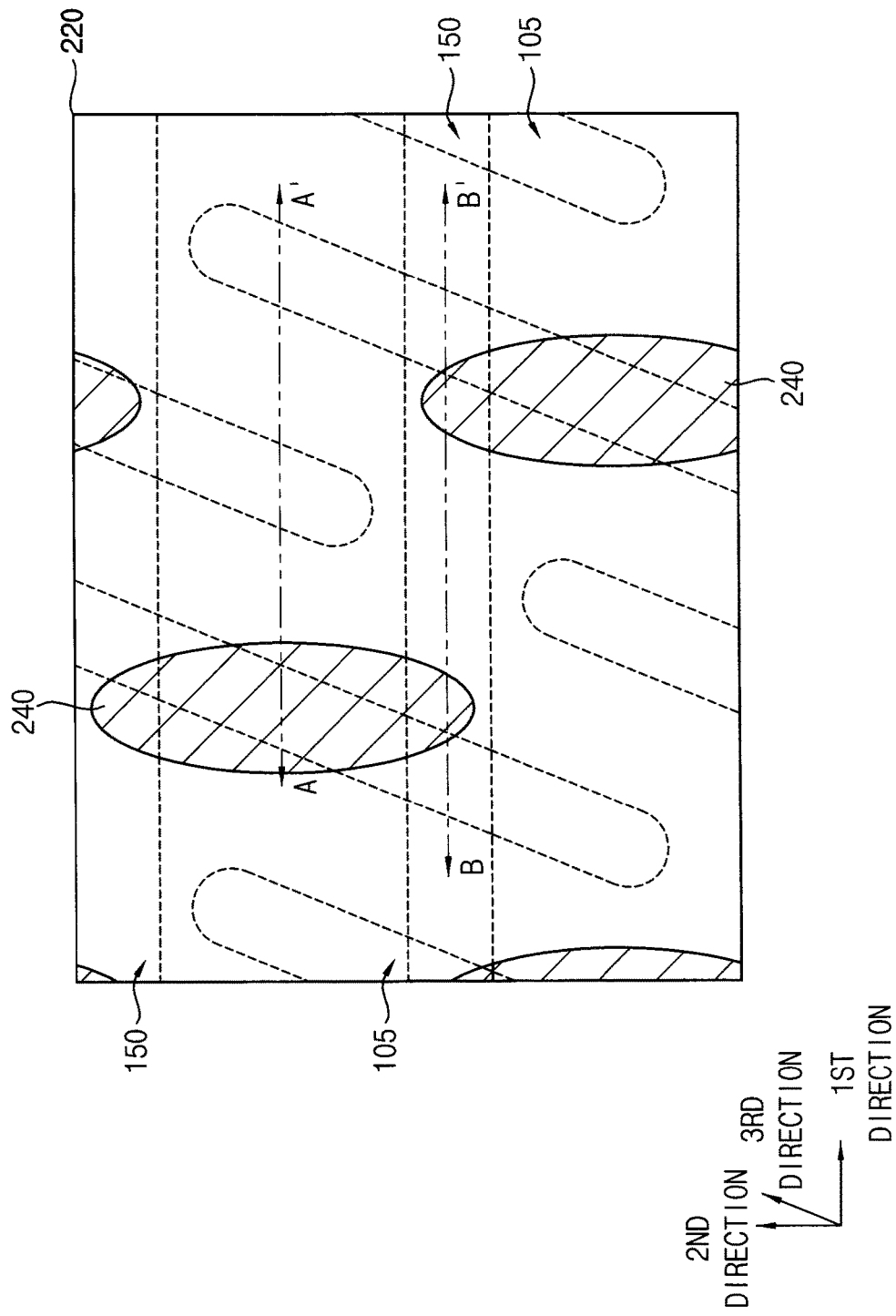
Figure 17:
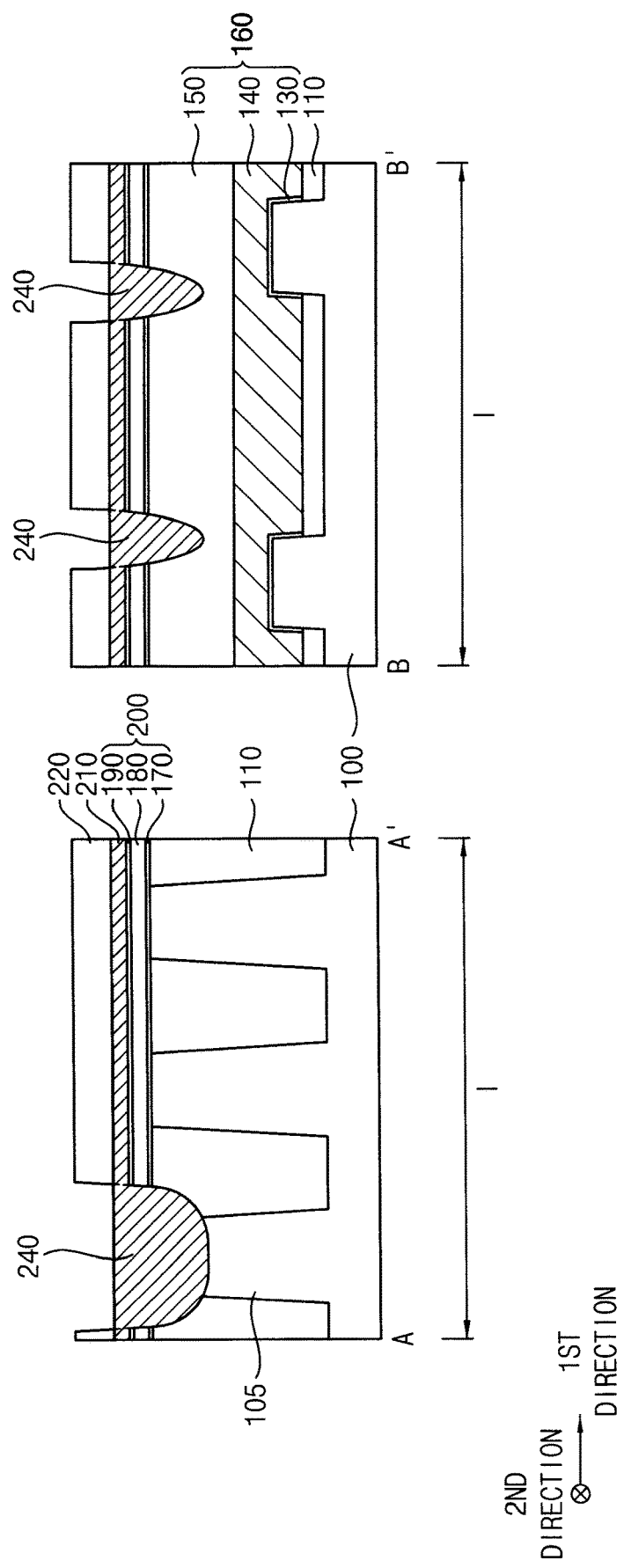

Referring to FIGS. 16 and 17, a second conductive layer 240 may be formed to fill the first opening 230.

In example embodiments, the second conductive layer 240 may be formed by forming a preliminary second conductive layer on the second active pattern 105, the isolation pattern 110, the first gate mask 150, and the first mask 220 to fill the first opening 230, and removing an upper portion of the preliminary second conductive layer by a CMP process and/or an etch back process. The second conductive layer 240 may be formed to have an upper surface substantially coplanar with an upper surface of the first conductive layer 210.

In example embodiments, a plurality of second conductive layers 240 may be formed to be spaced apart from each other in each of the first and second directions. The second conductive layer 240 may include, e.g., doped polysilicon, and thus may be merged with the first conductive layer 210 (e.g., they may be formed of the same material to be continuously formed).

Figure 18:
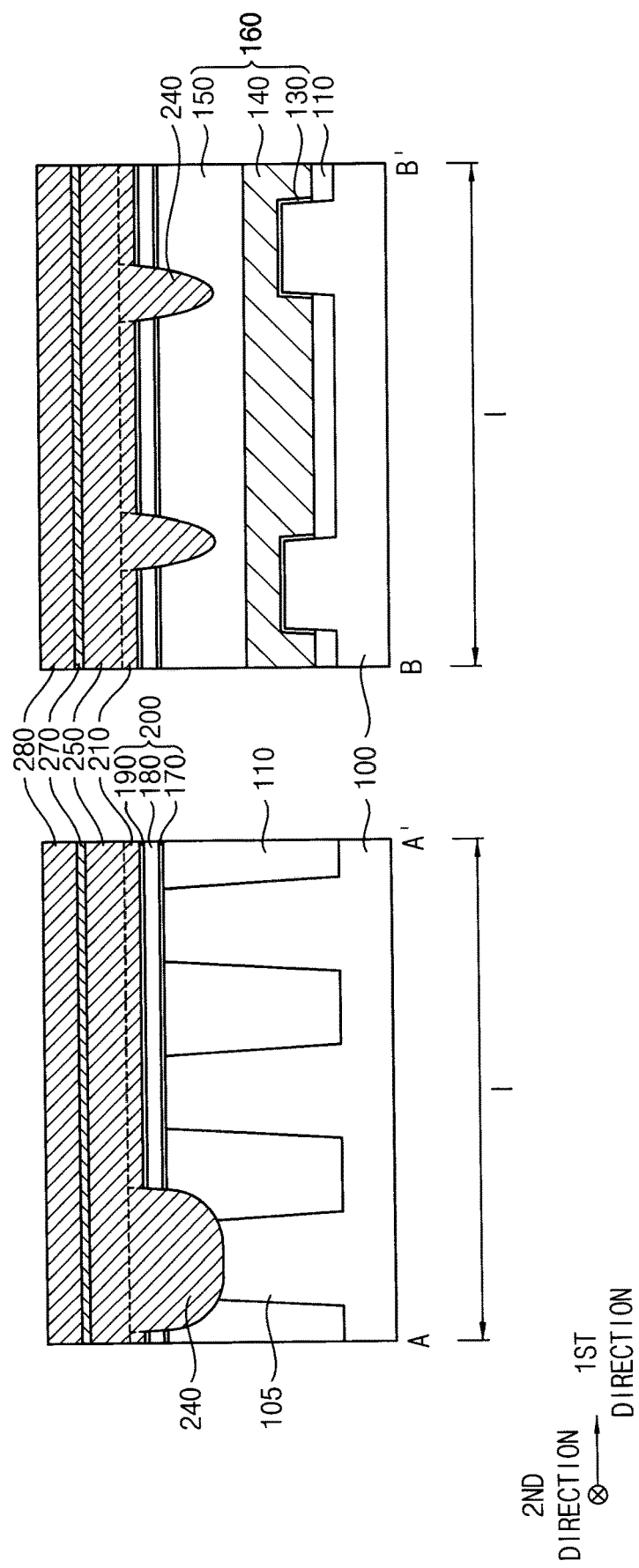
Figure 19:
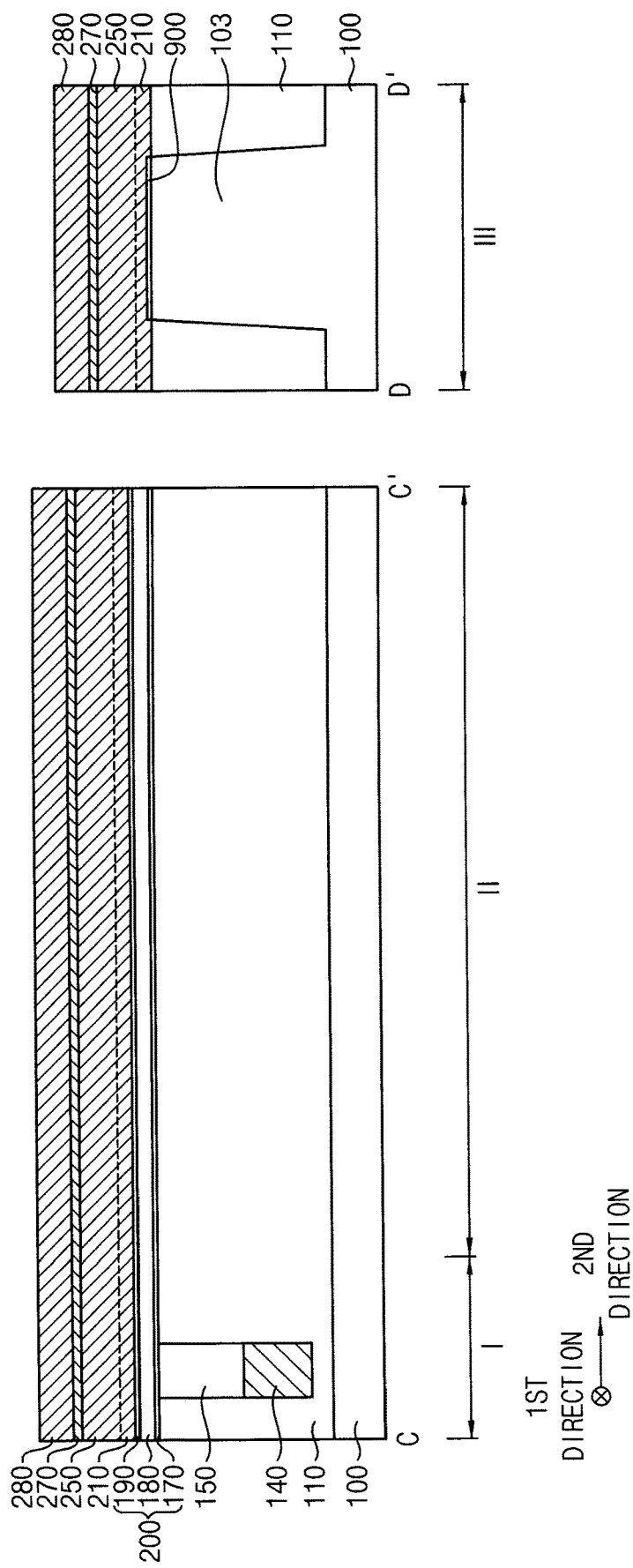

Referring to FIGS. 18 and 19, after removing the first mask 220, a third conductive layer 250, a barrier layer 270, and a first metal layer 280 may be sequentially formed on the first and second conductive layers 210 and 240.

In example embodiments, the third conductive layer 250 may include a material substantially the same as that of the first and second conductive layers 210 and 240. For example, the third conductive layer 250 may include doped polysilicon, and thus may be merged with the first and second conductive layers 210 and 240 (e.g., they may be formed of the same material to be continuously formed).

Figure 20:
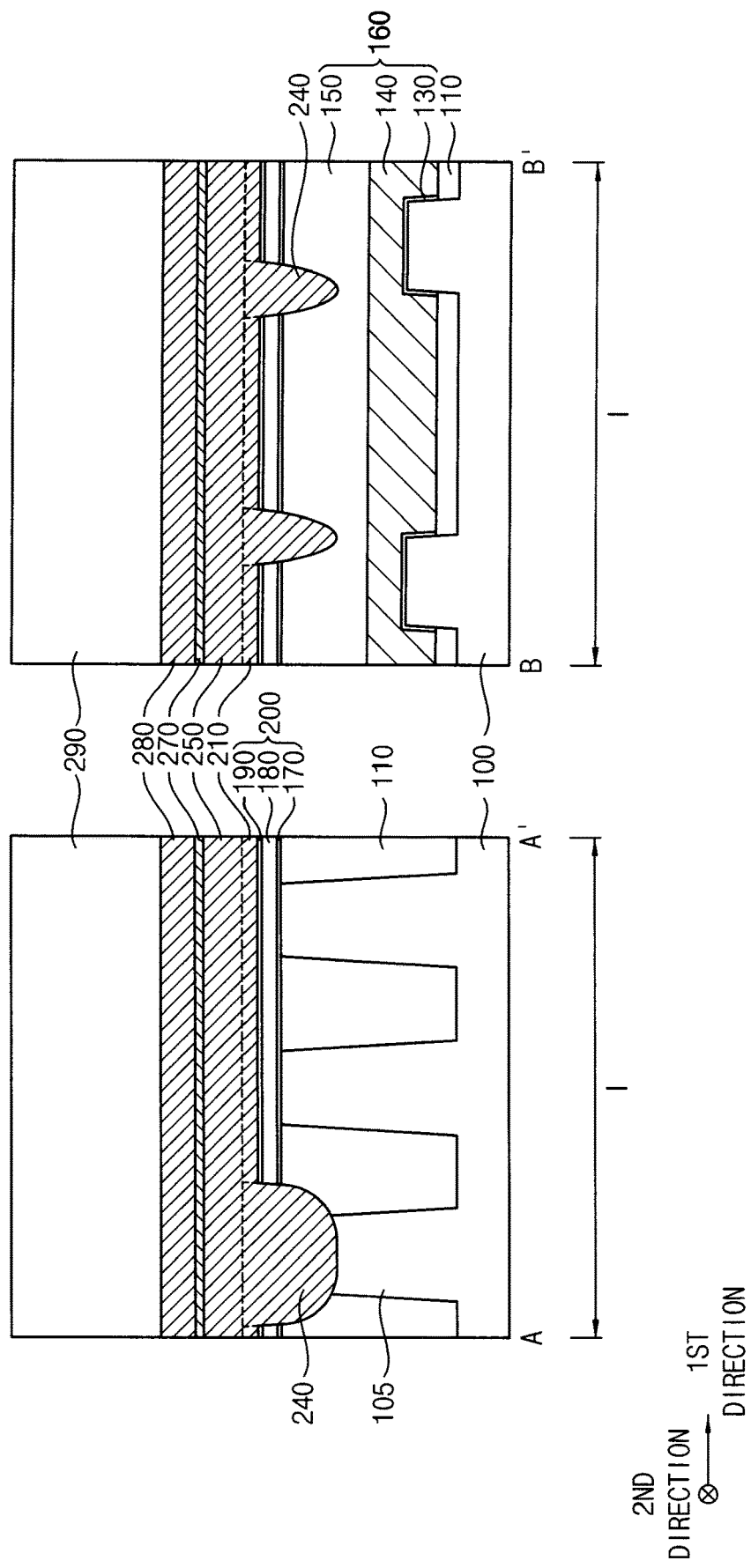
Figure 21:
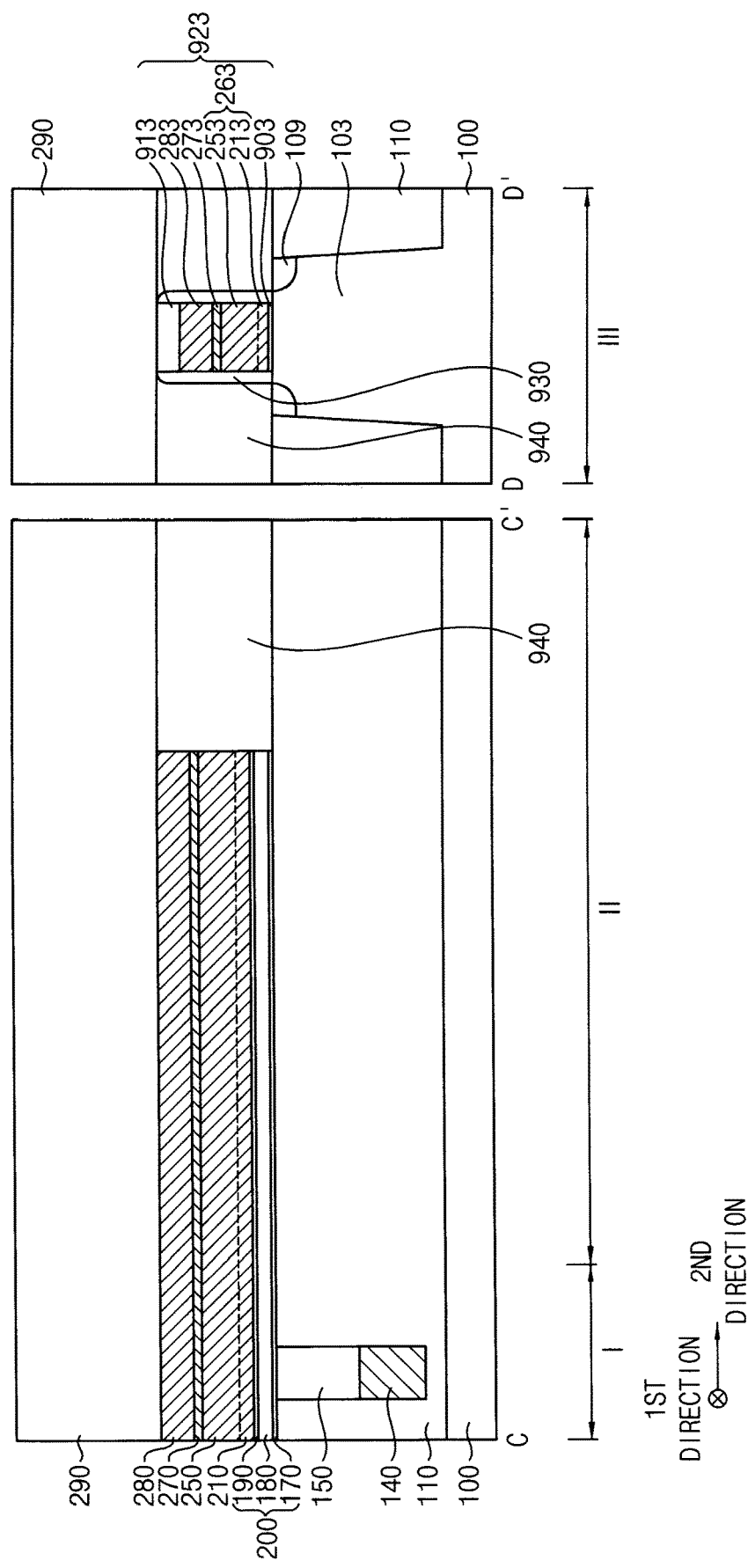
Figure 22:
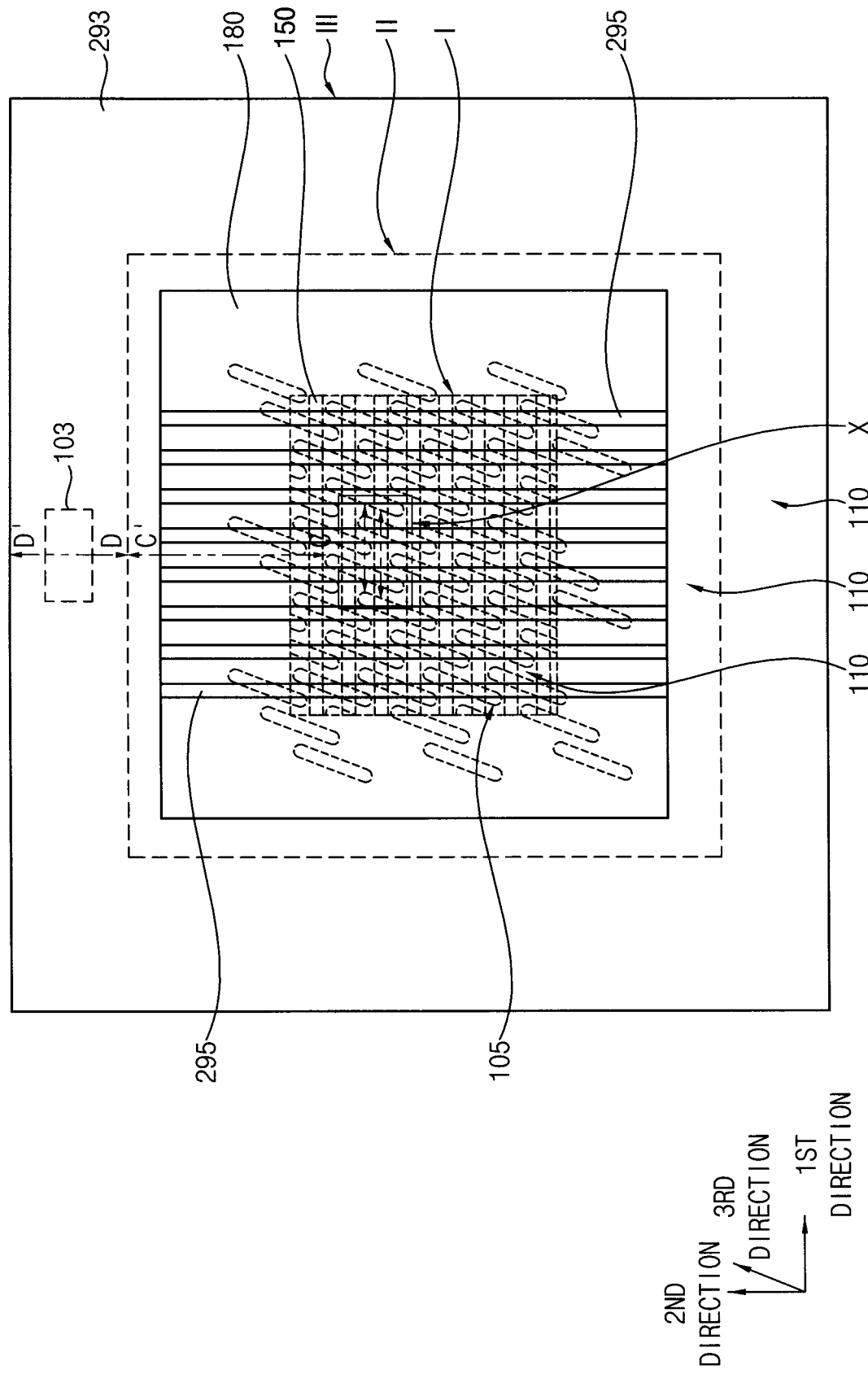
Figure 23:
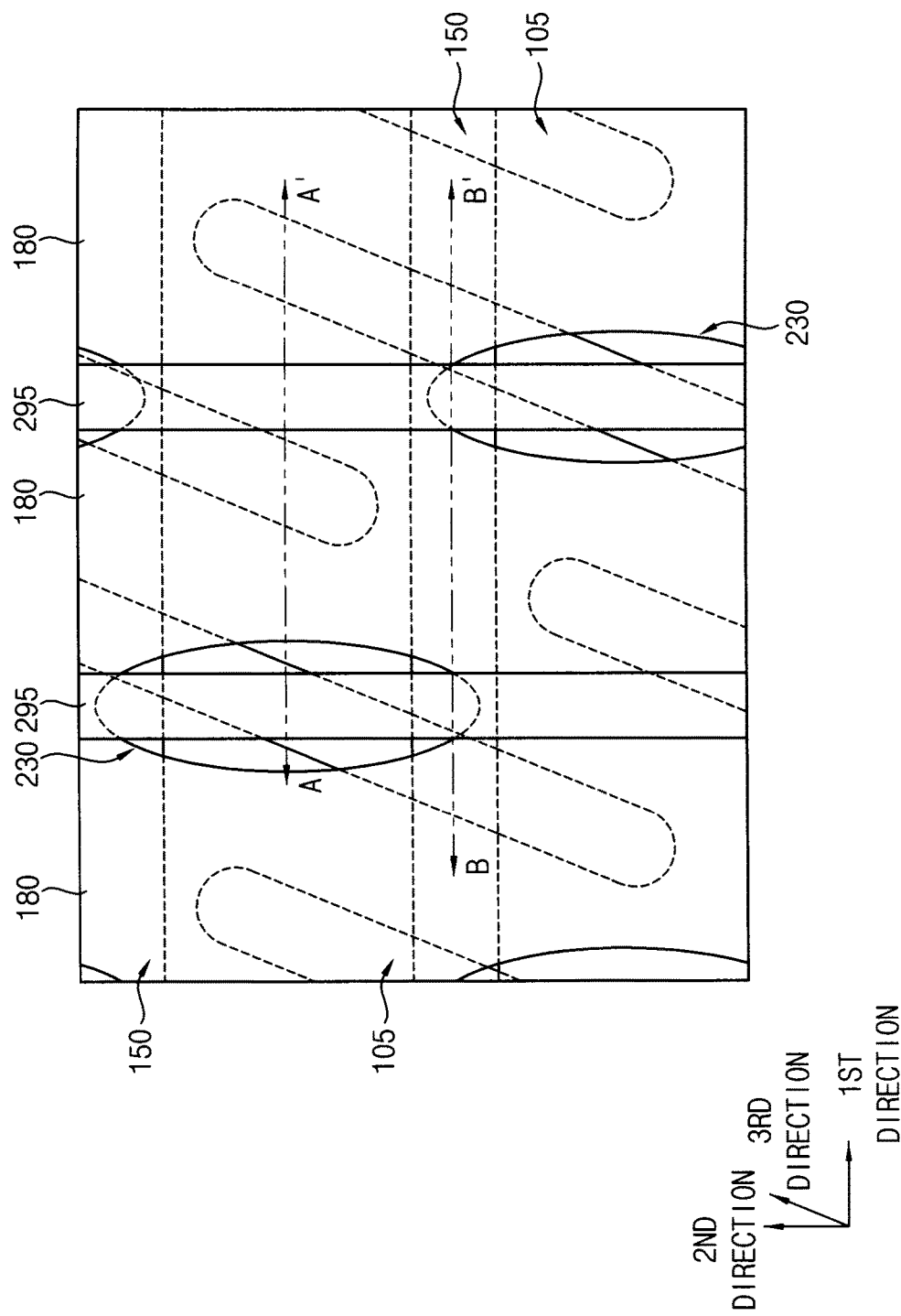

Referring to FIGS. 20 and 21, a second mask (not shown) may be formed to cover a portion of the first metal layer 280 on the first region I of the substrate 100 and a portion of the second region II of the substrate 100 adjacent thereto, a second gate mask 913 may be formed to partially cover a portion of the first metal layer 280 on the third region III of the substrate 100, and the first metal layer 280, the barrier layer 270, the third conductive layer 250, the first conductive layer 210, the insulation layer structure 200, and the second gate insulation layer 900 may be sequentially etched using the second mask and the second gate mask 913 as an etching mask.

Thus, a second opening may be formed to expose the isolation pattern 110 on a portion of the second region II far from the first region I of the substrate 100, and a second gate structure 923 may be formed on the third region III of the substrate 100. The second gate structure 923 may include a second gate insulation pattern 903, the first conductive pattern 213, the third conductive pattern 253, the first barrier pattern 273, the first metal pattern 283 and the second gate mask 913 sequentially stacked on the first active pattern 103. The first and third conductive patterns 213 and 253 sequentially stacked may include substantially the same materials, and thus may be merged with each other to form a second gate electrode 263.

A gate spacer 930 may be formed to cover a sidewall of the second gate structure 923, and impurities may be implanted into an upper portion of the first active pattern 103 adjacent the second gate structure 923 to form a source/drain layer 109.

After removing the second mask, a first insulating interlayer is formed on the first to third regions I, II and III of the substrate 100, and an upper portion of the first insulating interlayer may be planarized until an upper surface of the first metal layer 280 is exposed to form a first insulating interlayer pattern 940 filling the second opening on the second region II of the substrate 100 and surrounding the second gate structure 923 and the gate spacer 930 on the third region III of the substrate 100.

A capping layer 290 is formed on the first metal layer 280, the first insulating interlayer pattern 940 and the second gate mask 913.

Referring to FIGS. 22 to 25, the capping layer 290 may be etched to form a first capping pattern 293 on the third region III of the substrate 100 and a portion of the second region II of the substrate 100 adjacent thereto and to form a second capping pattern 295 on the first region I of the substrate 100 and a portion of the second region II of the substrate 100 adjacent thereto, and the first metal layer 280, the barrier layer 270, the third conductive layer 250, the first and third conductive layers 210 and 240 and the third insulation layer 190 may be sequentially etched using the first and second capping patterns 293 and 295 as an etching mask. The first capping pattern may cover an entire portion of the third region III of the substrate 100 and a portion of the second region II of the substrate 100 adjacent thereto, for example, a portion of the second region II of the substrate 100 where the first insulating interlayer pattern 940 is formed, and a plurality of second capping patterns 295 may be formed to be spaced apart from each other in the first direction, and each of the second capping patterns 295 may extend in the second direction on the first region I of the substrate 100 and the portion of the second region II of the substrate 100 adjacent thereto.

Thus, on the first region I of the substrate 100, a fourth conductive pattern 245, a fifth conductive pattern 255, a second barrier pattern 275, a second metal pattern 285 and the second capping pattern 295 may be sequentially stacked on the second active pattern 105, the isolation pattern 110 and the first gate mask 150 in the first opening 230, and a third insulation pattern 195, a second conductive pattern 215, the fifth conductive pattern 255, the second barrier pattern 275, the first metal pattern 285 and the second capping pattern 295 may be sequentially stacked on the second insulation layer 180 of the insulation layer structure 200 at an outside of the first opening 230.

As illustrated above, the first to third conductive layers 210, 240 and 250 may be merged with each other, and thus the fourth and fifth conductive patterns 245 and 255 sequentially stacked and the second and fifth conductive patterns 215 and 255 sequentially stacked may form one conductive pattern structure 265, respectively. Hereinafter, the conductive pattern structure 265, the second barrier pattern 275, the second metal pattern 285 and the second capping pattern 295 sequentially stacked may be referred to as a bit line structure 305.

In example embodiments, the bit line structure 305 may extend in the second direction on the first region I of the substrate 100 and a portion of the second region II of the substrate 100 adjacent thereto, and a plurality of bit line structures 305 may be formed to be arranged in the first direction.

Figure 26:
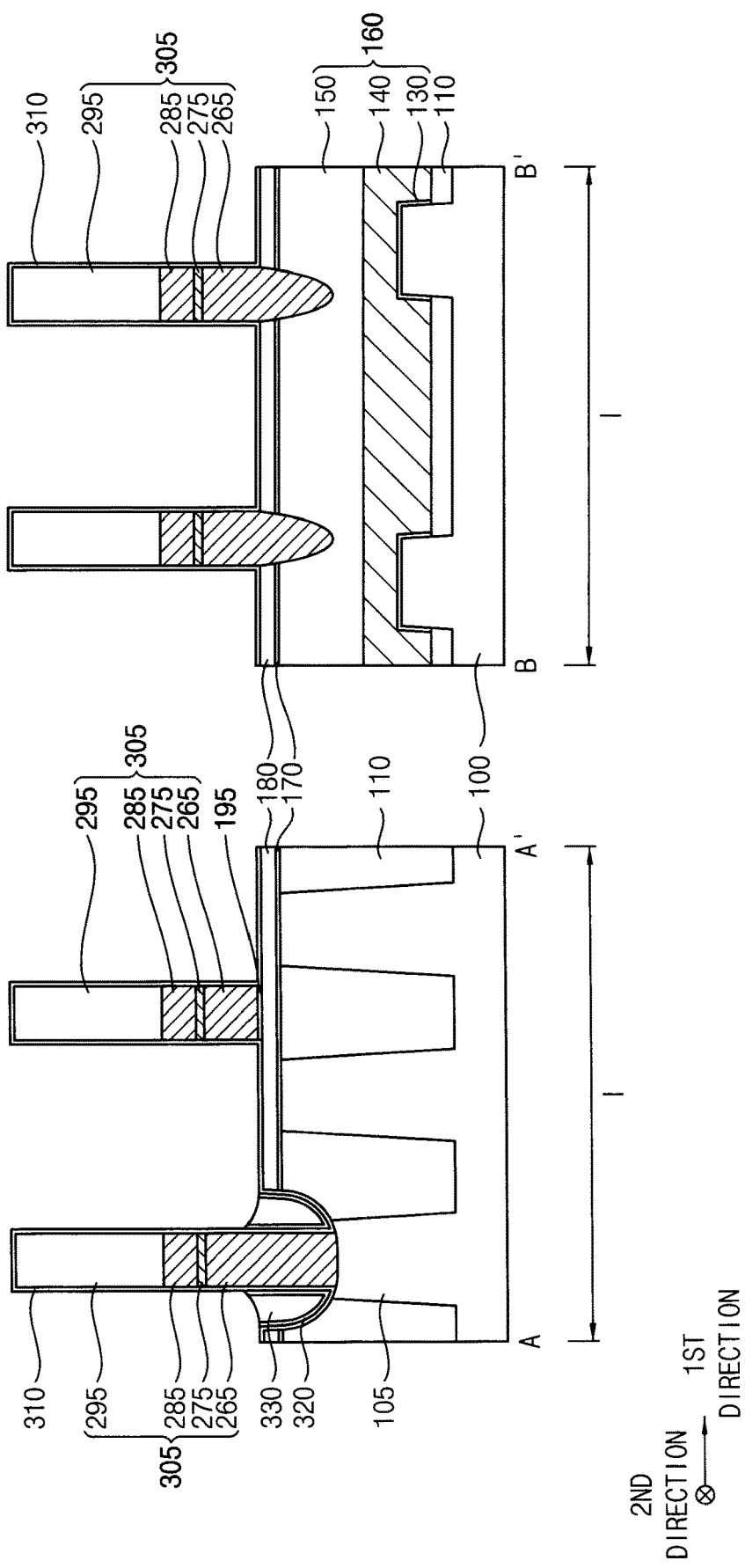

Referring to FIG. 26, a first spacer layer 310 may be formed on the exposed upper surfaces of the second active pattern 105, the isolation pattern 110 and the first gate mask 150, a sidewall of the first opening 230, the second insulation layer 180 and the first capping pattern 293 to cover the bit line structure 305, and fourth and fifth insulation layers may be sequentially formed on the first spacer layer 310.

The first spacer layer 310 may cover a sidewall of the third insulation pattern 195 under the bit line structure 305 on the second insulation layer 180, and the fourth and fifth insulation layers may entirely fill the first opening 230.

The fourth and fifth insulation layers may be etched by an etching process. In example embodiments, the etching process may include a wet etching process, and all portions of the fourth and fifth insulation layers except for a portion thereof in the first opening 230 may be removed. Thus, almost an entire surface of the first spacer layer 310, for example, all portions of the first spacer layer 310 except for a portion thereof in the first opening 230 may be exposed, and portions of the fourth and fifth insulation layers remaining in the first opening 230 may form fourth and fifth insulation patterns 320 and 330, respectively.

Figure 27:
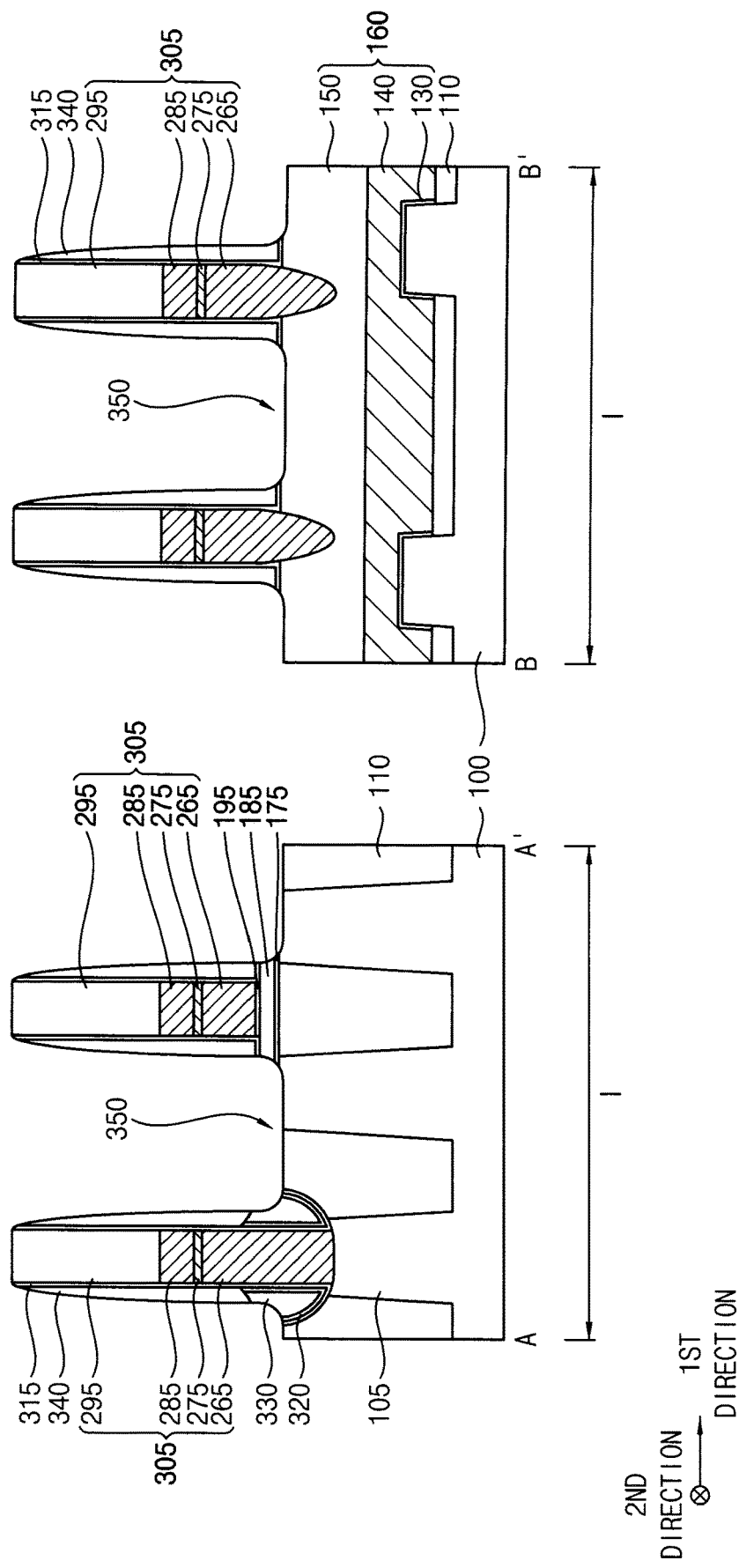
Figure 28:
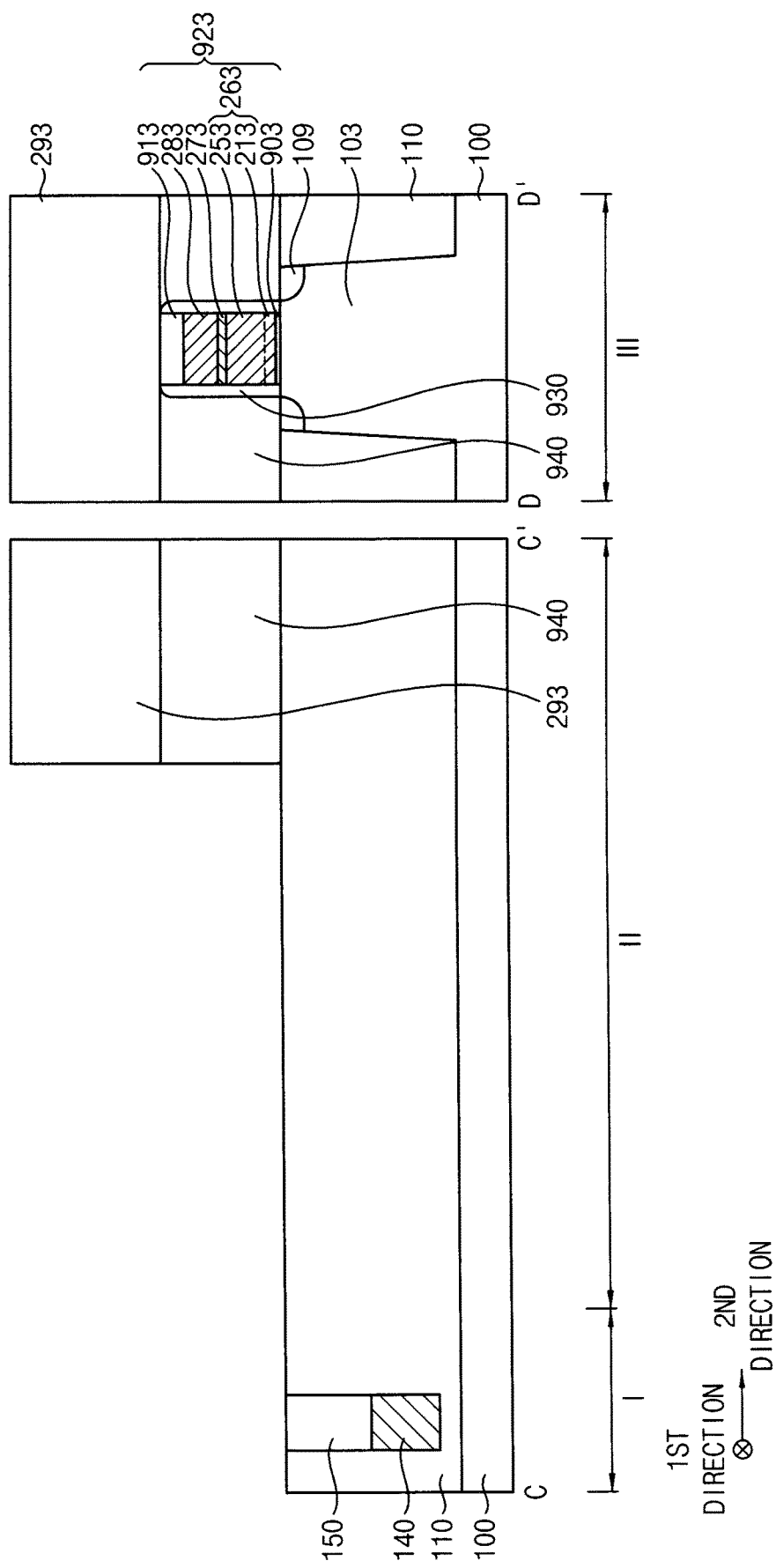

Referring to FIGS. 27 and 28, a second spacer layer may be formed on the exposed surface of the first spacer layer 310 and the portions of the fourth and fifth insulation patterns 320 and 330 in the first opening 230, and may be anisotropically etched to form a second spacer 340 on the surface of the first spacer layer 310 and the fourth and fifth insulation patterns 320 and 330 to cover a sidewall of the bit line structure 305.

A dry etching process may be performed using the first and second capping patterns 293 and 295 and the second spacer 340 as an etching mask to form a third opening 350 exposing an upper surface of the second active pattern 105, and upper surfaces of the isolation pattern 110 and the first gate mask 150 may be also exposed by the third opening 350.

By the dry etching process, portions of the first spacer layer 310 on the upper surfaces of the first and second capping patterns 293 and 295 and the upper surface of the second insulation layer 180 may be removed, and thus a first spacer 315 may be formed to cover the sidewall of the bit line structure 305. During the dry etching process, the first and second insulation layers 170 and 180 may be partially removed to form first and second insulation patterns 175 and 185, respectively, under the bit line structure 305. The first to third insulation patterns 175, 185 and sequentially stacked under the bit line structure 305 may form an insulation pattern structure.

Figure 29:
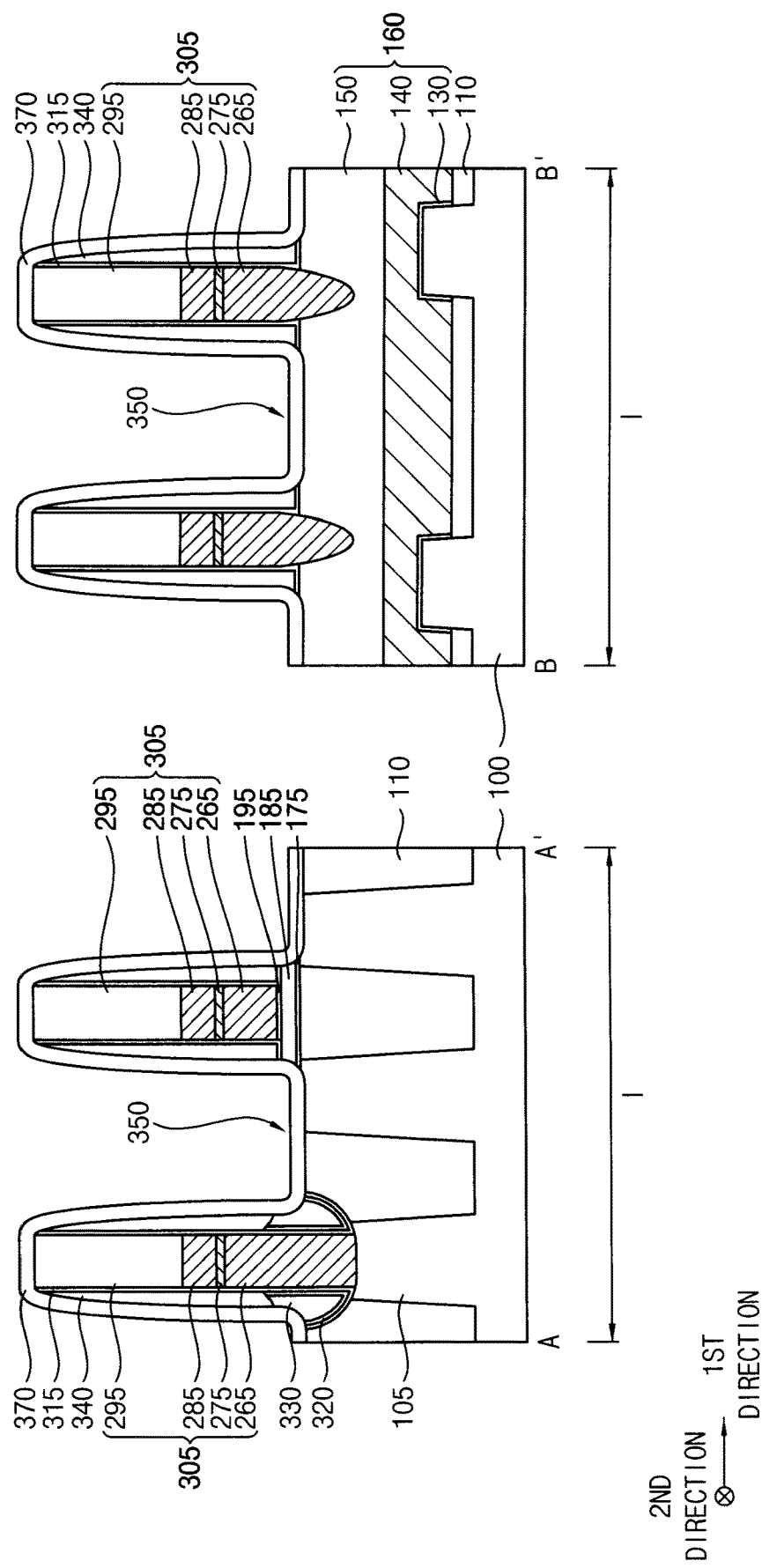
Figure 30:
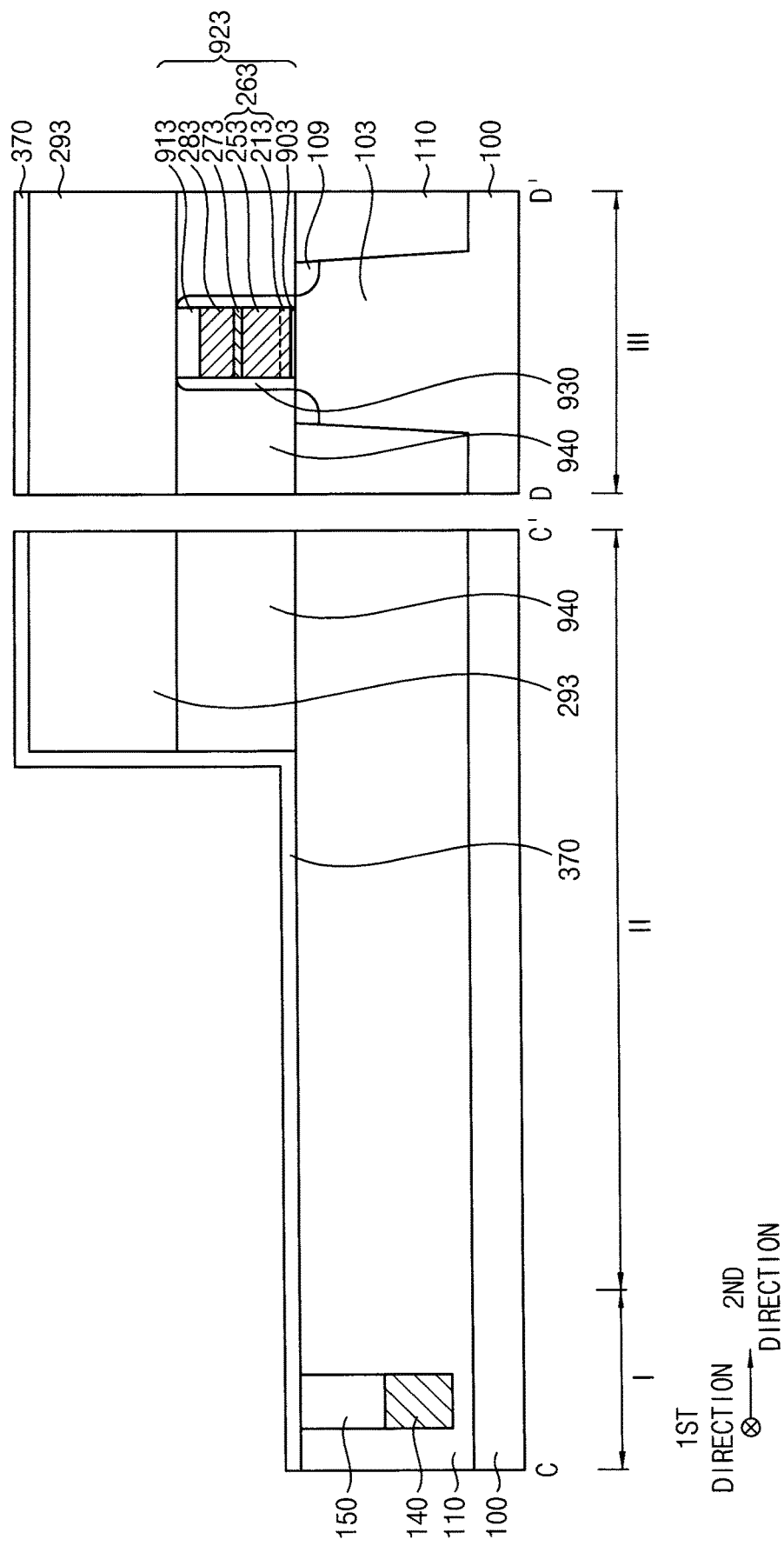

Referring to FIGS. 29 and 30, a third spacer layer 370 IS formed on upper surfaces of the first and second capping patterns 293 and 295, sidewalls of the first capping pattern 293 and the first insulating interlayer pattern 940, an outer sidewall of the second spacer 340, portions of upper surfaces of the fourth and fifth insulation patterns 320 and 330, the second active pattern 105, the isolation pattern 110 and the upper surface of the first gate mask 150 exposed by the third opening 350, and an upper surface of the isolation pattern 110 on a portion of the second region II of the substrate 100 adjacent the first region I of the substrate 100.

The third spacer layer 370 may include a nitride, e.g., silicon nitride, and may be merged with the first capping pattern 293.

Figure 31:
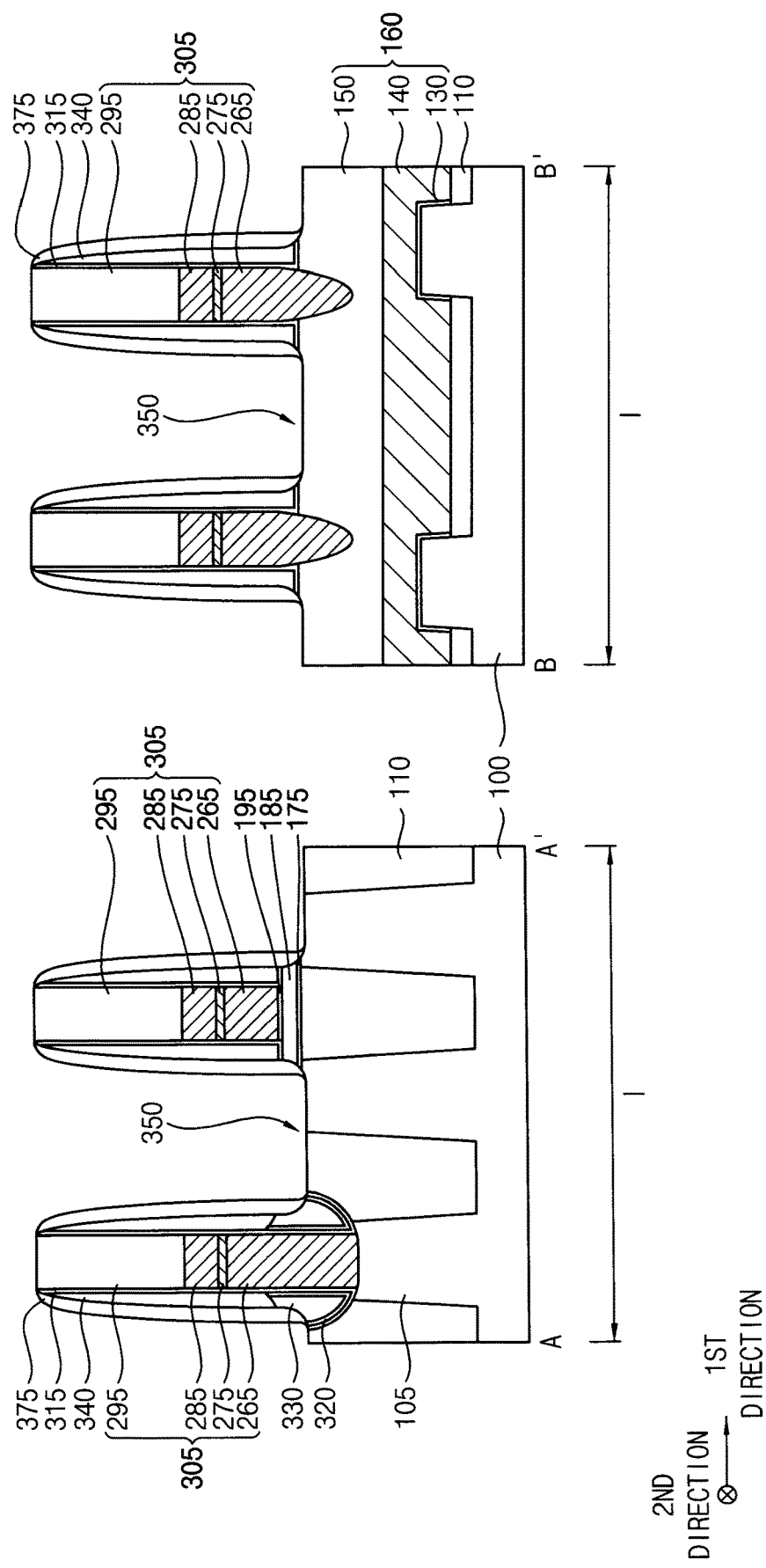
Figure 32:
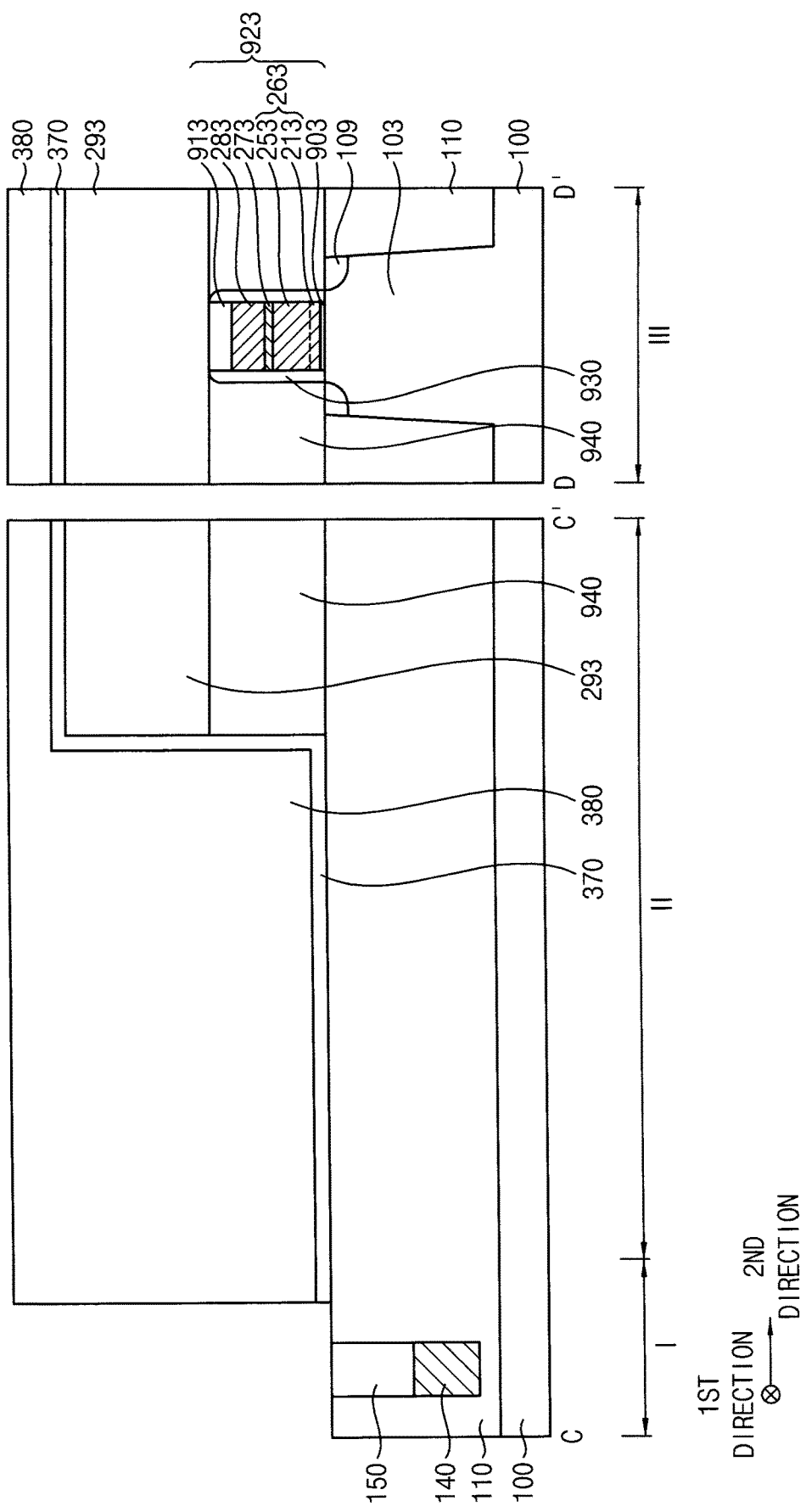

Referring to FIGS. 31 and 32, after forming a third mask 380 to cover the second and third regions II and III of the substrate 100, the third spacer layer 370 is anisotropically etched to form a third spacer 375 covering a sidewall of the bit line structure 305. The third mask 380 may also cover an edge portion of the first region I of the substrate 100 adjacent the second region II of the substrate 100. In example embodiments, the third mask 380 may include a material having an etching selectivity with respect to the third spacer 375, e.g., photoresist pattern.

Due to the etching process, the third spacer 375 is formed on the sidewall of the bit line structure 305 on the first region I of the substrate 100, and the third spacer layer 370 may remain on the upper surface and the sidewall of the bit line structure 305 and the upper surface of the isolation pattern 110 on the second and third regions II and III of the substrate 100 (e.g., where the third mask 380 was located), which may be referred to as a first etch stop layer 373.

The first to third spacers 315, 340 and 375 on the sidewall of the bit line structure 305 sequentially stacked in the horizontal direction on the first region I of the substrate 100 may be referred to as a preliminary spacer structure.

Figure 33:
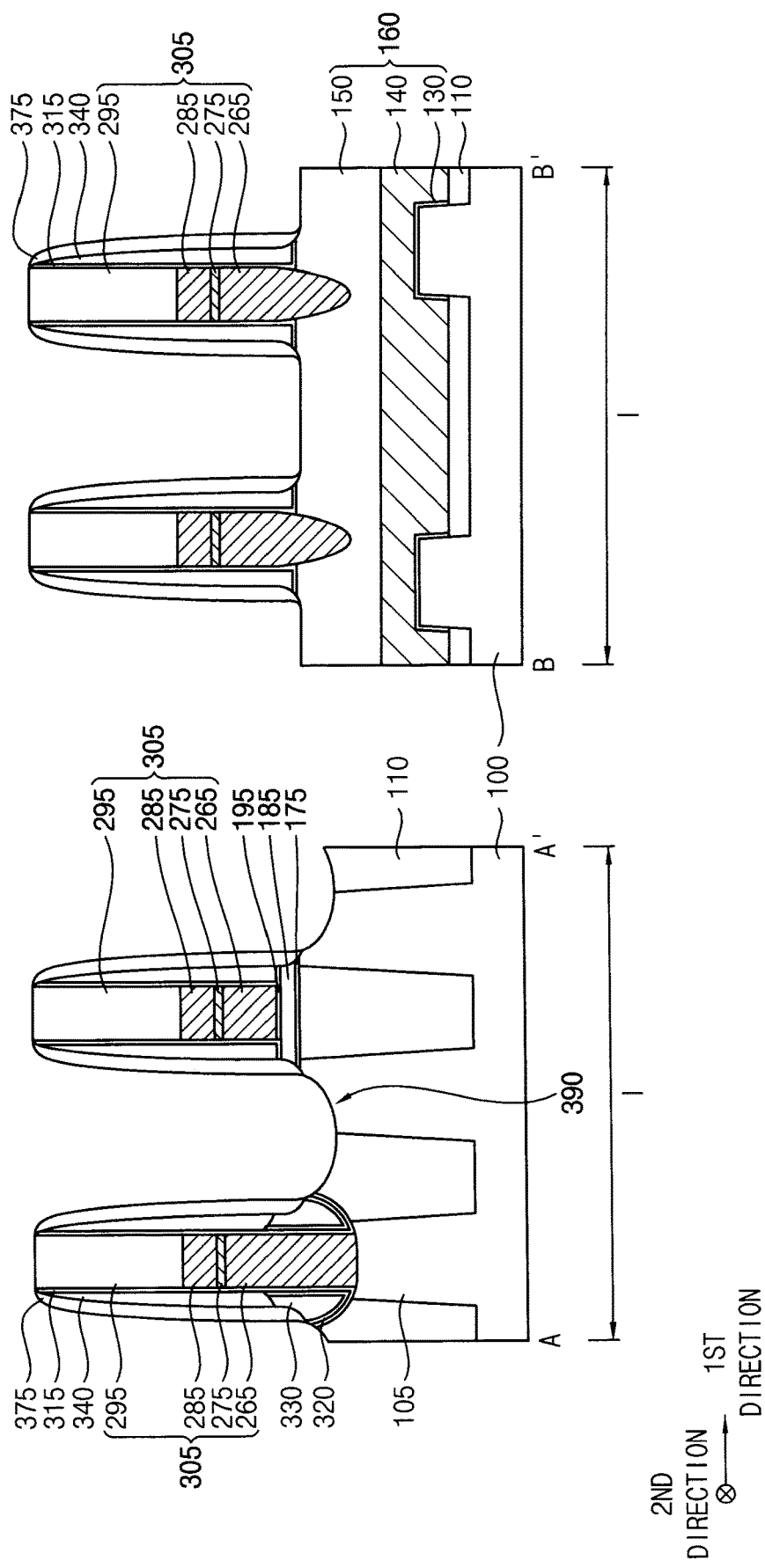
Figure 34:
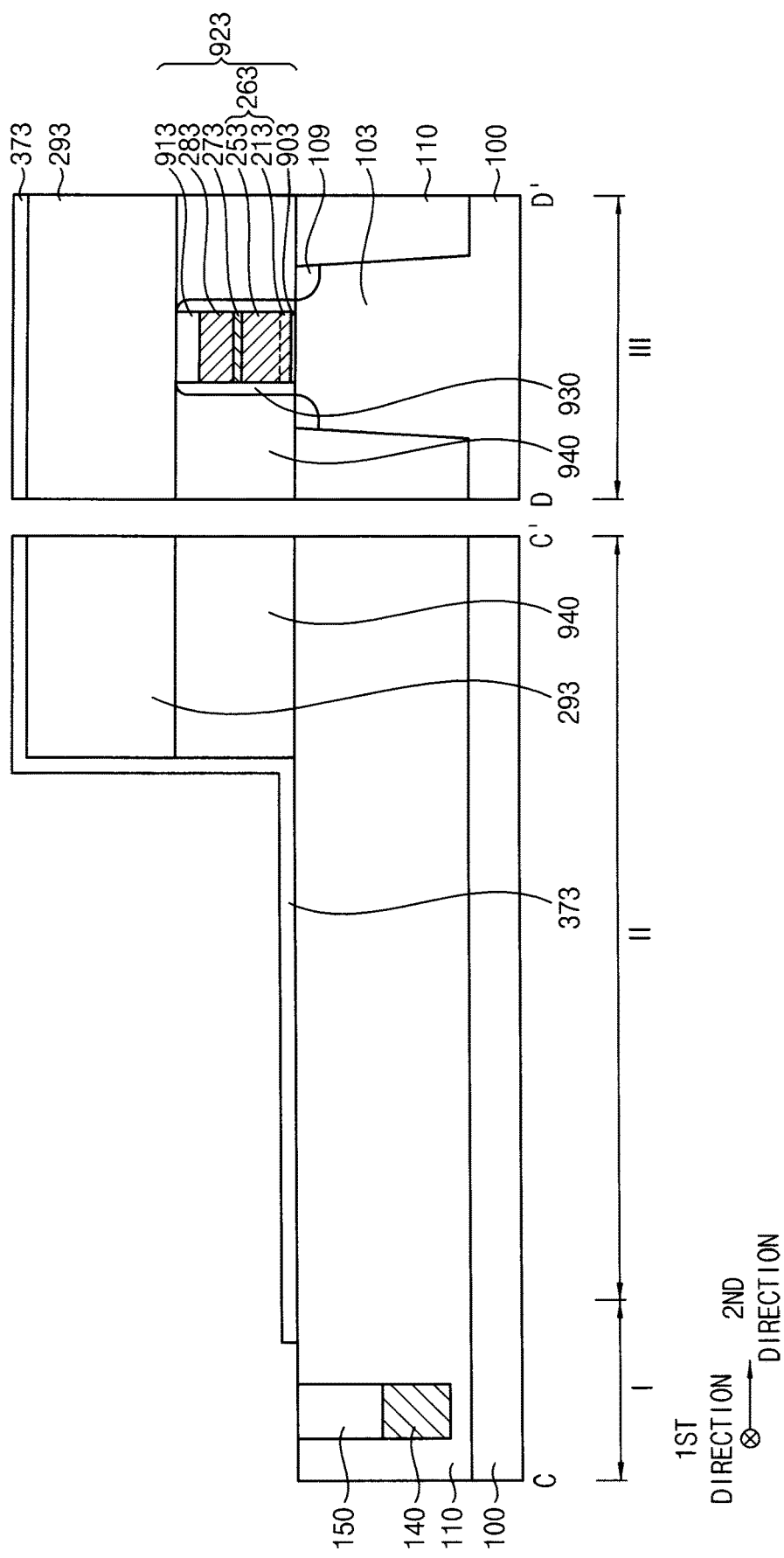

Referring to FIGS. 33 and 34, after removing the third mask 380 by, e.g., an ashing process and/or a stripping process, an upper portion of the second active pattern 105 is etched to form a fourth recess 390 connected to the third opening 350.

In example embodiments, the upper portion of the second active pattern 105 may be removed by a wet etching process. During the wet etching process, an upper portion of the isolation pattern 110 adjacent the upper portion of the second active pattern 105 may be also etched, however, the third spacer 375, the first capping pattern 293, the first gate mask 150 and the first etch stop layer 373 including a material having an etching selectivity with respect to the second active pattern 105 and the isolation pattern 110, e.g., a nitride may be barely etched, and thus a portion of the isolation pattern 110 on the second region II of the substrate 100 covered by the first etch stop layer 373 is not etched but is protected.

Figure 35:
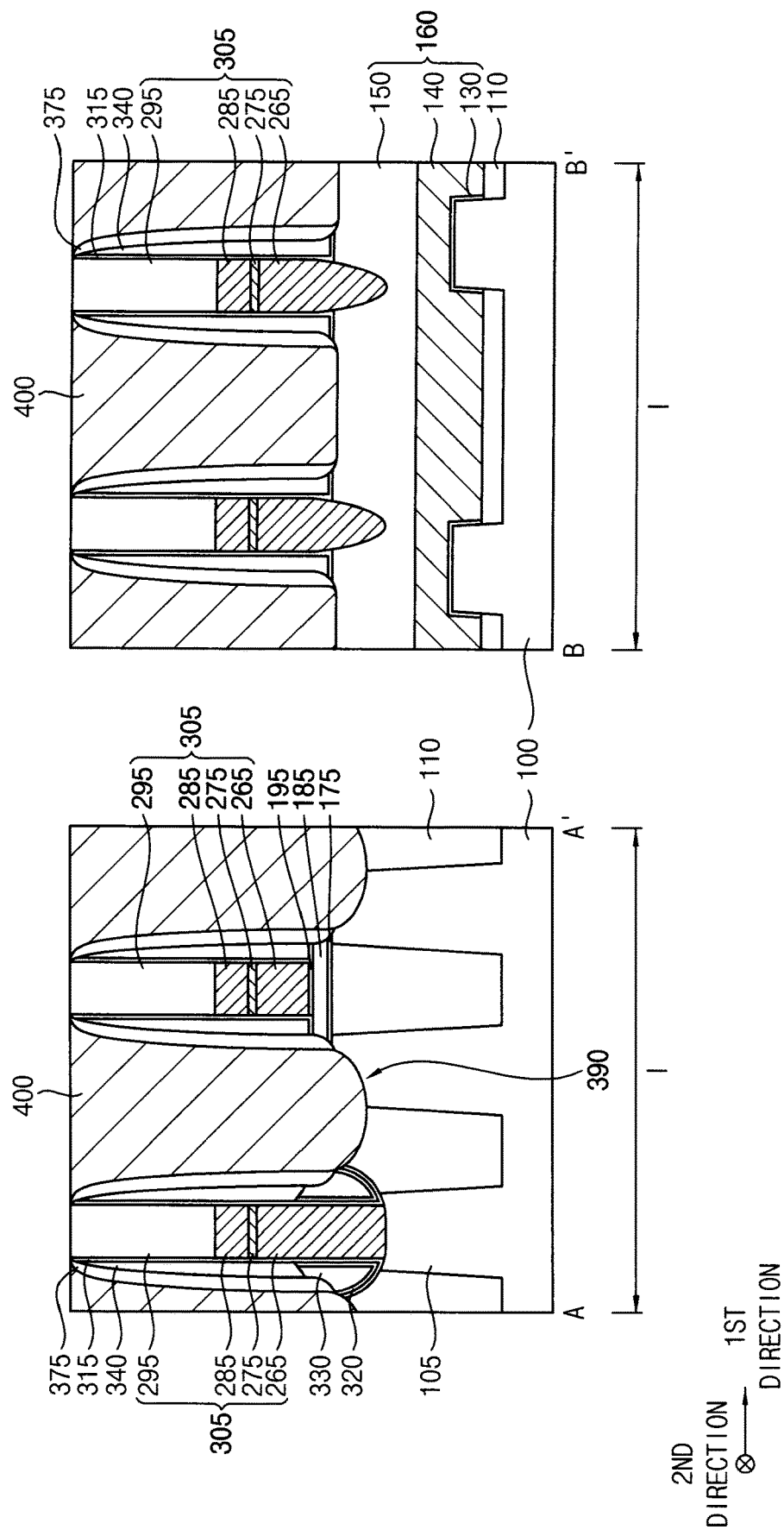
Figure 36:
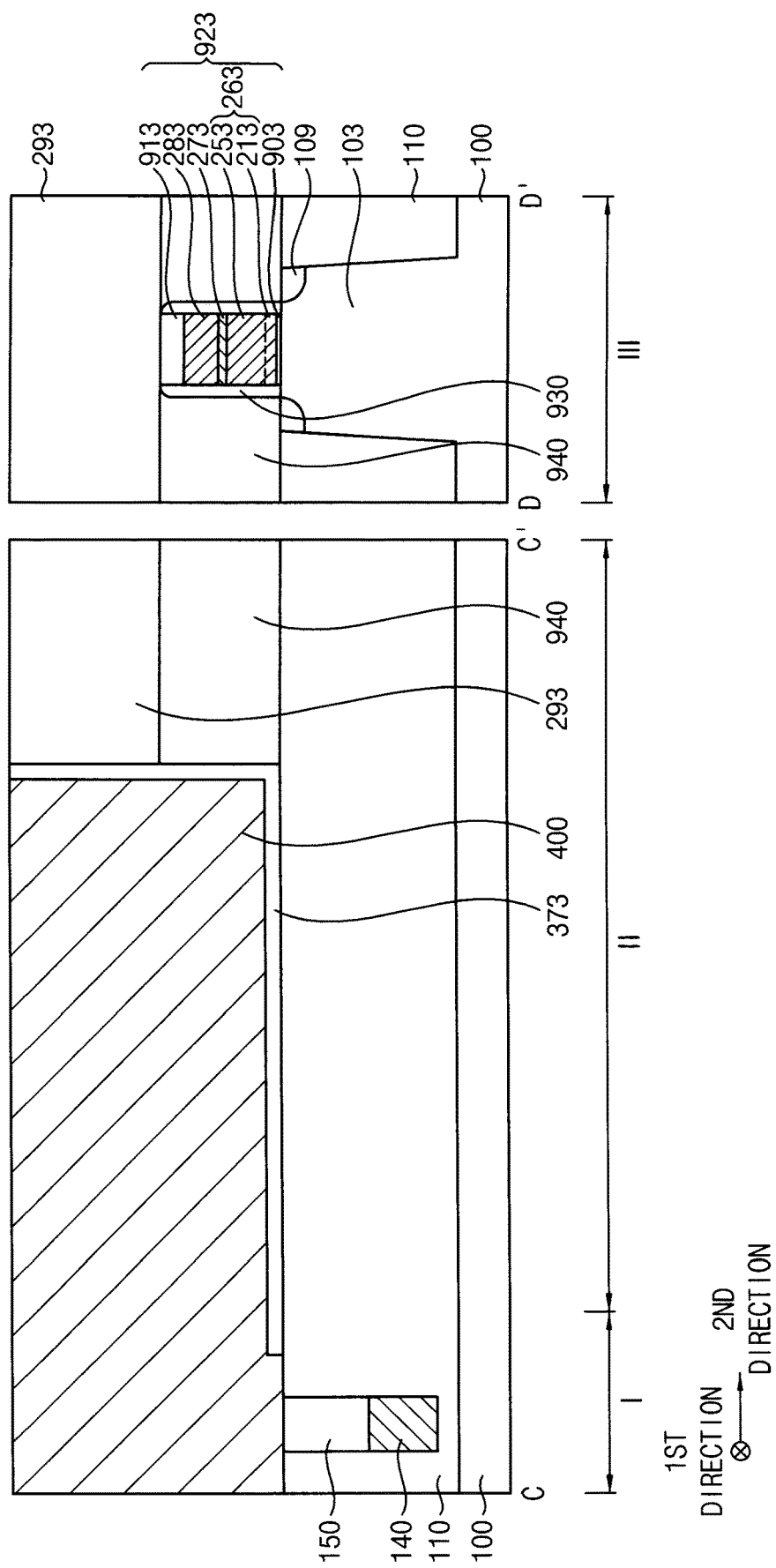
Figure 37:
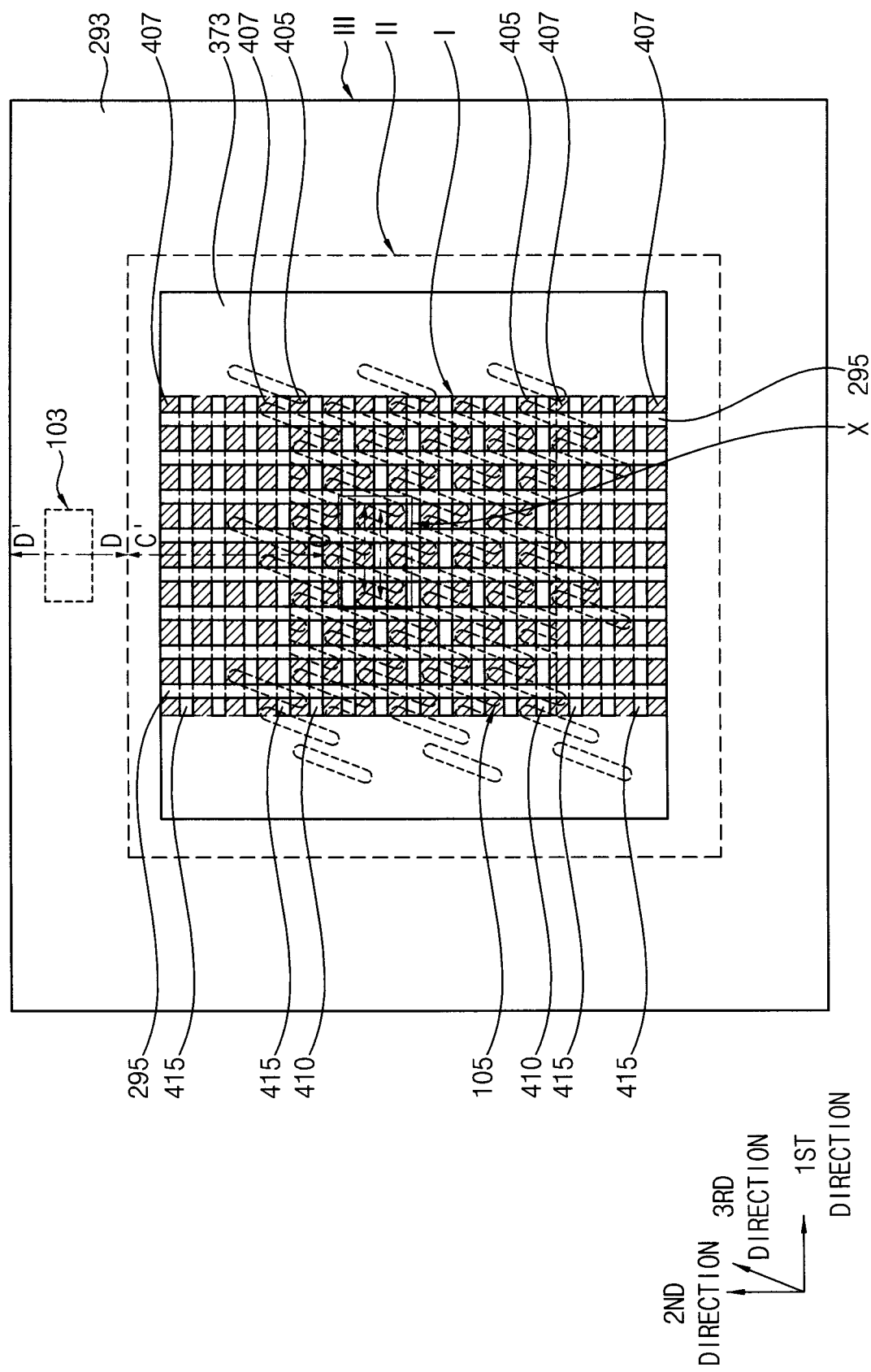
Figure 38:
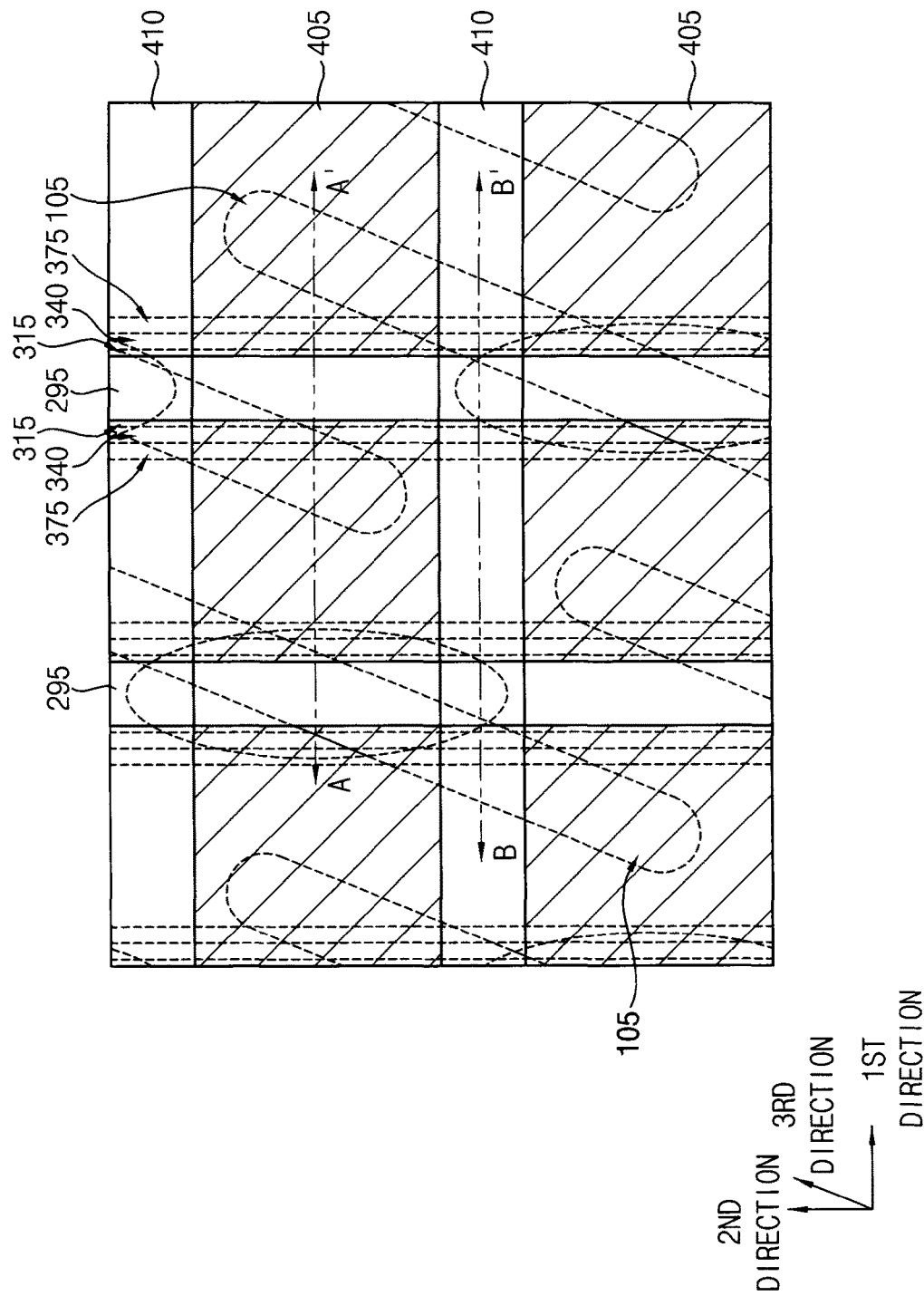
Figure 39:
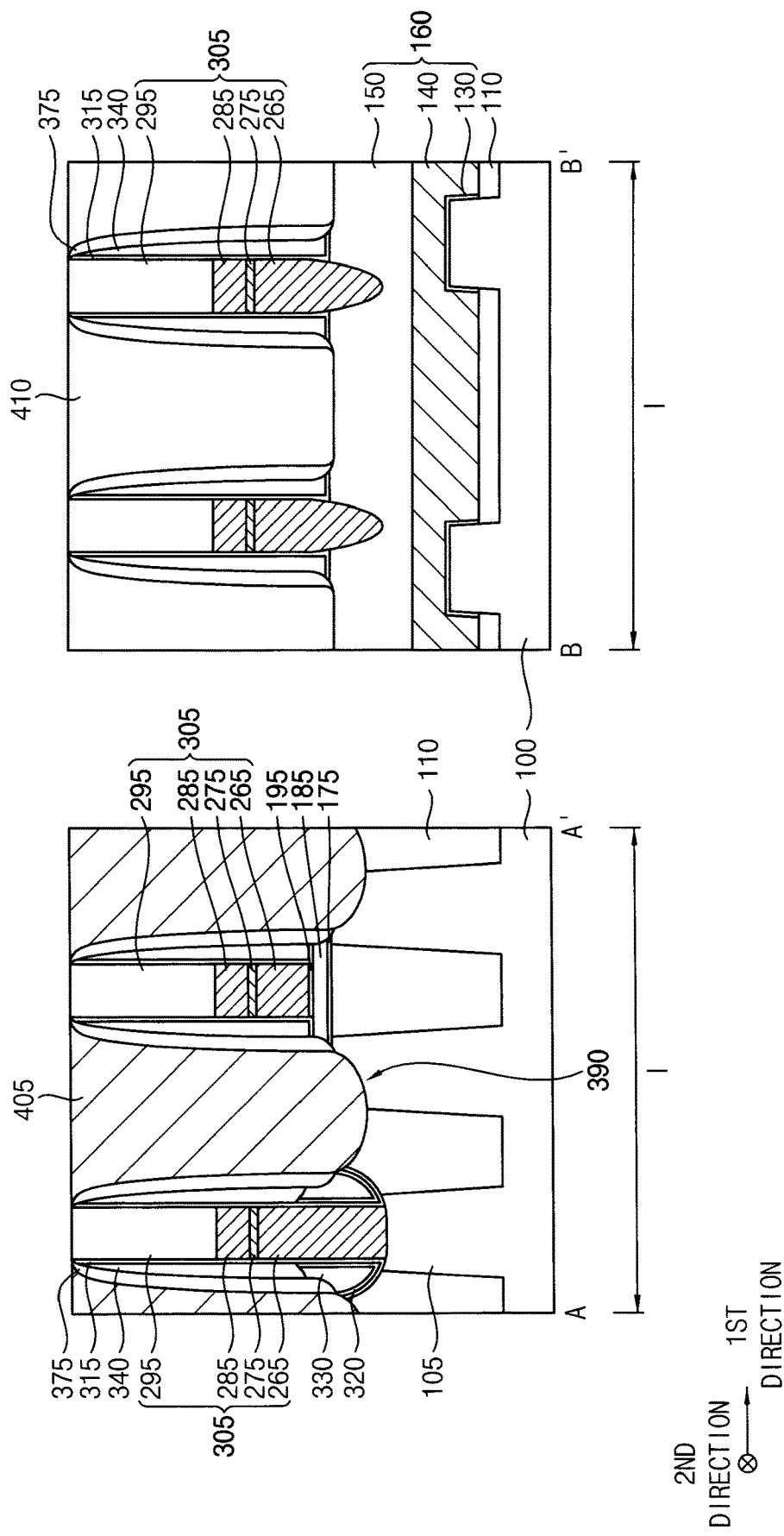
Figure 40:
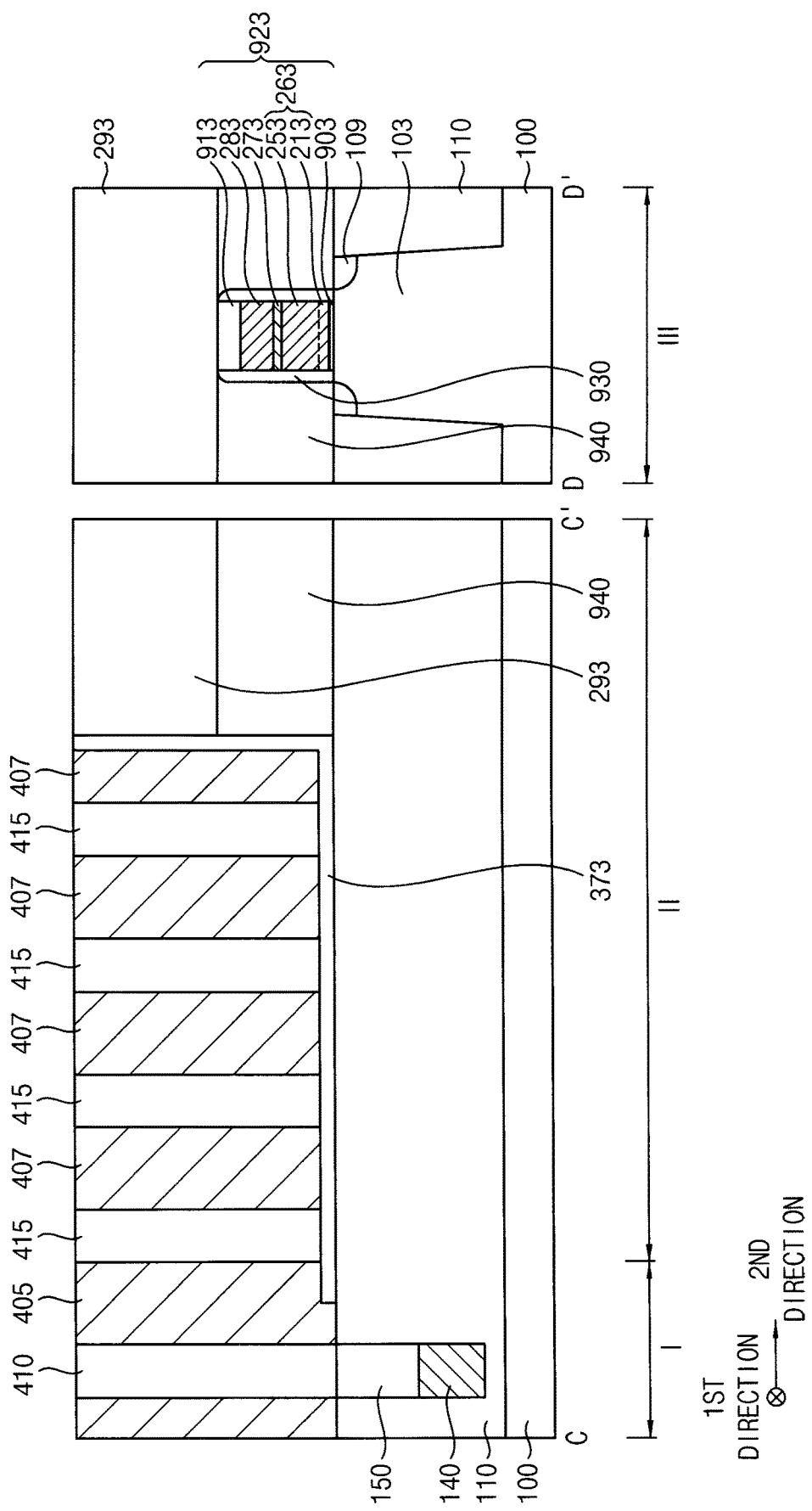

Referring to FIGS. 35 and 36, a lower contact plug layer 400 may be formed to fill the third opening 350 on the first and second regions I and II of the substrate 100 and the fourth recess on the first region I of the substrate 100, and an upper portion of the lower contact plug layer may be planarized until the upper surfaces of the first and second capping patterns 293 and may be exposed. Thus, a portion of the first etch stop layer 373 on the first and second capping patterns 293 and 295 on the second and third regions II and III of the substrate 100 may be removed.

In example embodiments, the lower contact plug layer 400 may extend in the second direction, and a plurality of lower contact plug layers 400 may be formed to be spaced apart from each other in the first direction.

Referring to FIGS. 37 to 40, a fourth mask (not shown) including a plurality of fourth openings arranged in the second direction each of which may extend in the first direction on the first region I of the substrate 100 and a portion of the second region II of the substrate 100 adjacent thereto is formed on the first and second capping patterns 293 and 295 and the lower contact plug layer 400, and the lower contact plug layer 400 is etched using the fourth mask as an etching mask.

In example embodiments, fourth openings may overlap respective first gate structures in a vertical direction substantially perpendicular to the upper surface of the substrate 100 on the first region I of the substrate 100, and fourth openings may be also formed on the second region I of the substrate 100. By the etching process, fifth openings may be formed to expose respective upper surfaces of the first gate masks 150 of the first gate structures 160 between the bit line structures 305 on the first region I of the substrate 100, and sixth openings may be formed to expose upper surfaces of the first etch stop layer 373 between the bit line structures 305 on the second region II of the substrate 100.

After removing the fourth mask, third and fourth capping patterns 410 and 415 may be formed to fill the fifth and sixth openings, respectively, on the first and second regions I and 11, respectively, of the substrate 100. In example embodiments, each of the third and fourth capping patterns 410 and 415 extend in the first direction between adjacent bit line structures 305, and a plurality of third capping patterns 410 and a plurality of fourth capping patterns 415 may be arranged in the second direction. A plurality of third capping patterns 410 in the first region I may form a capping pattern array having capping patterns formed in a matrix arrangement in the first and second directions. Bit line structures 305 may be adjacent to and between consecutive capping patterns 410 in the first direction. Similarly, a plurality of fourth capping patterns 415 in the second region II may form a capping pattern array having capping patterns formed in a matrix arrangement in the first and second directions. Bit line structures 305 may be adjacent to and between consecutive capping patterns 415 in the first direction.

Thus, the lower contact plug layer 400 extending in the second direction and formed between the bit line structures 305 may be transformed into a plurality of lower contact plugs 405 spaced apart from each other in the second direction by the third capping patterns 410 on the first region I of the substrate 100, and the lower contact plug layer 400 extending in the second direction between the bit line structures 305 may be transformed into a plurality of dummy lower contact plugs 407 spaced apart from each other in the second direction by the fourth capping patterns 415 on the second region II of the substrate 100.

Figure 41:
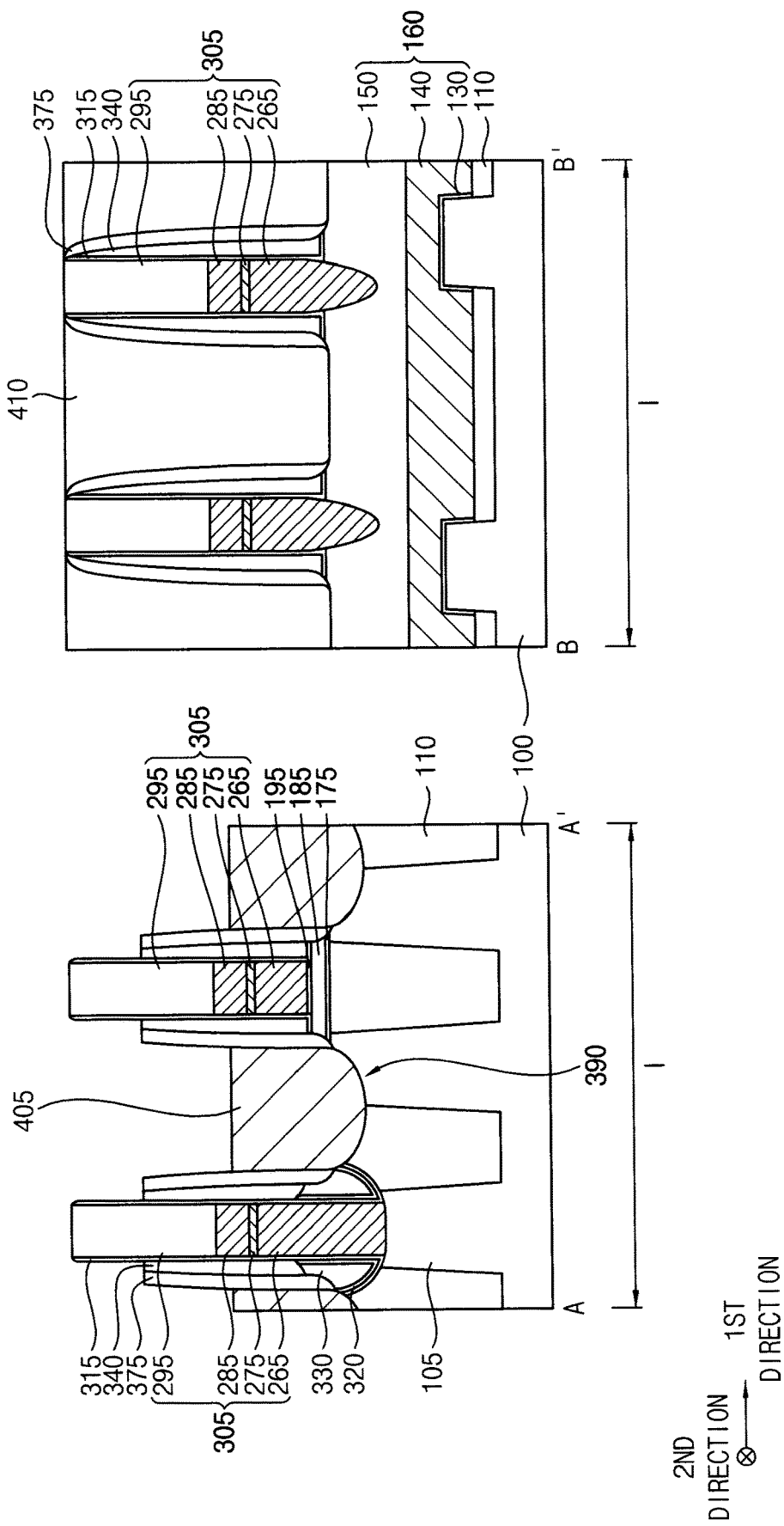
Figure 42:
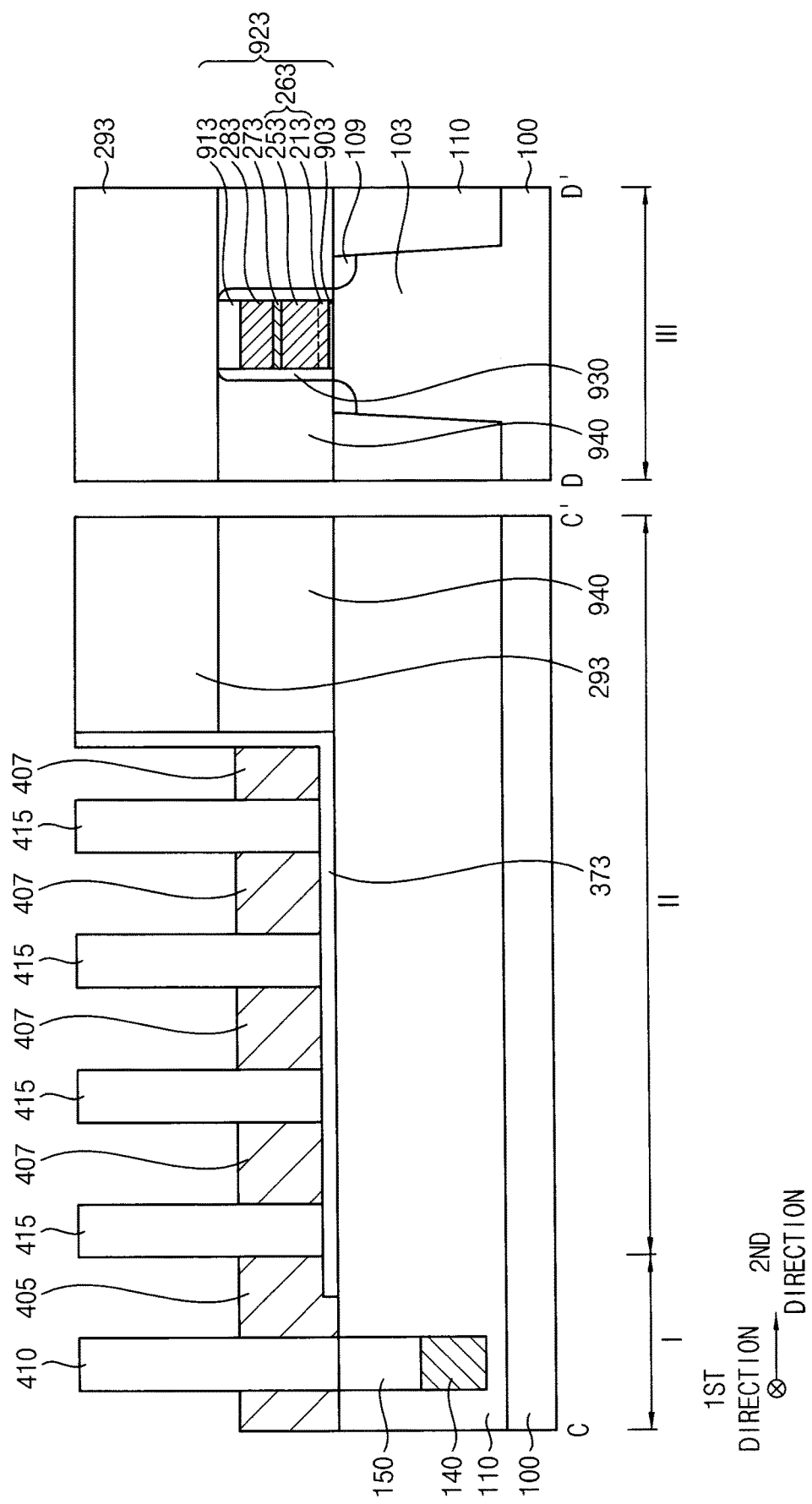

Referring to FIGS. 41 and 42, upper portions of the lower contact plugs 405 and the dummy contact plugs 407 may be removed to expose an upper portion of the preliminary spacer structure on the sidewall of the bit line structure 305, and upper portions of the second and third spacers 340 and 375 of the exposed preliminary spacer structure may be removed.

The dummy lower contact plug 407 and the fourth capping pattern 415 have already been formed on the first etch stop layer 373 on the second region II of the substrate 100, and thus the isolation pattern 110 under the first etch stop layer 373 is not exposed during the etching process.

Upper portions of the lower contact plugs 405 and the dummy lower contact plugs 407 may be further removed. Thus, in example embodiments, upper surfaces of the lower contact plug 405 and the dummy lower contact plug 407 may be lower than upper surfaces of the second and third spacers 340 and 375.

Figure 43:
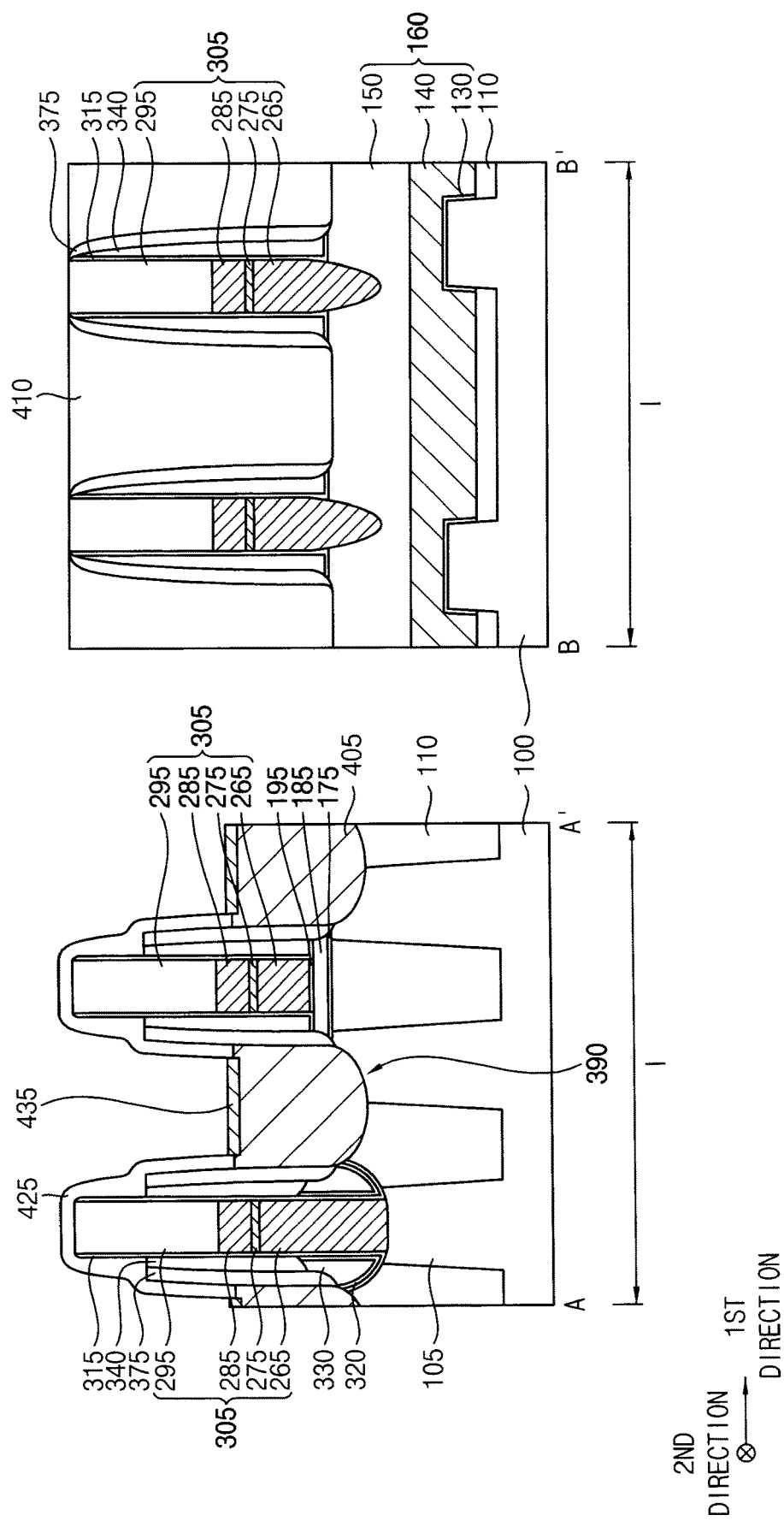
Figure 44:
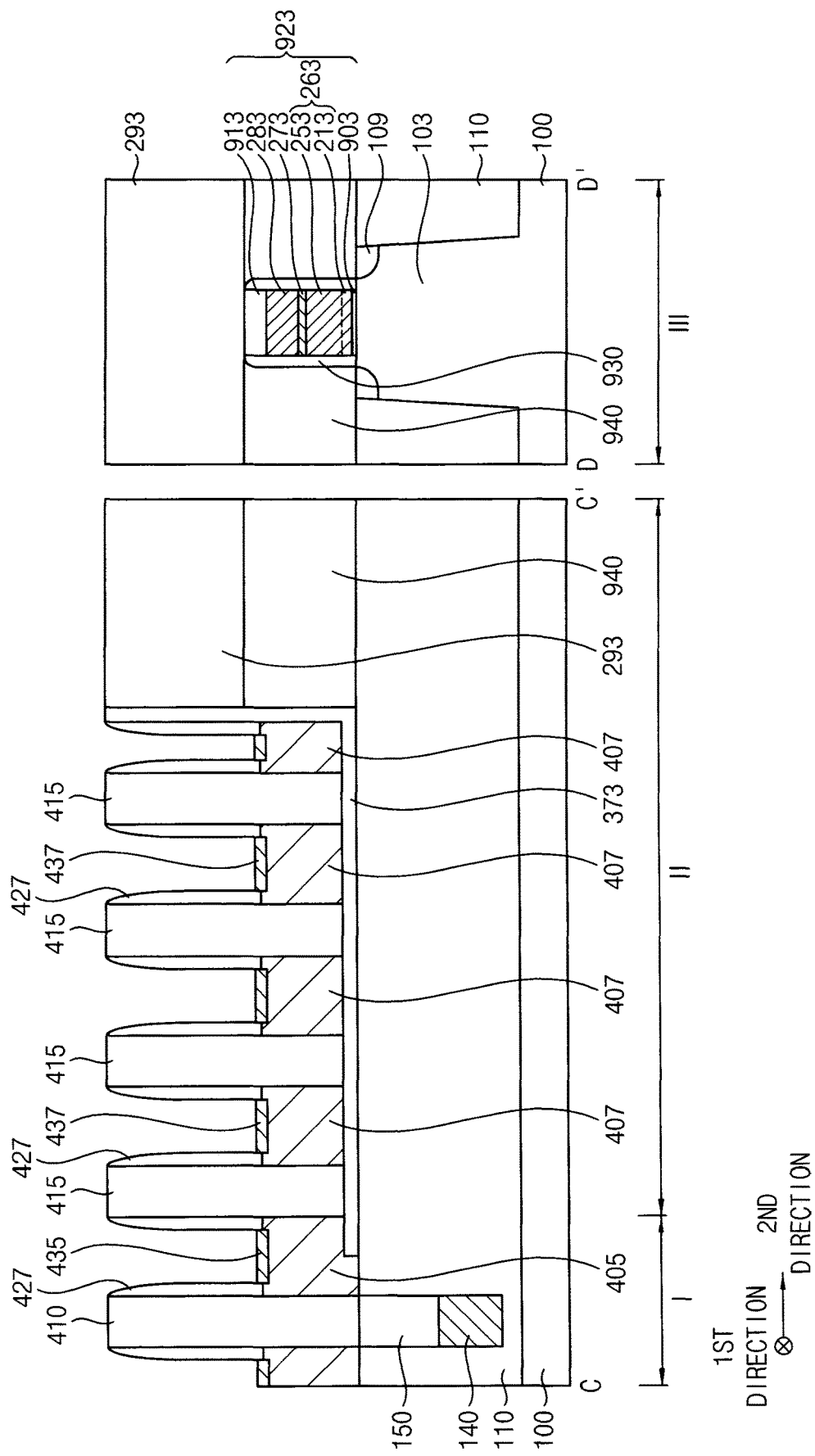
Figure 45:
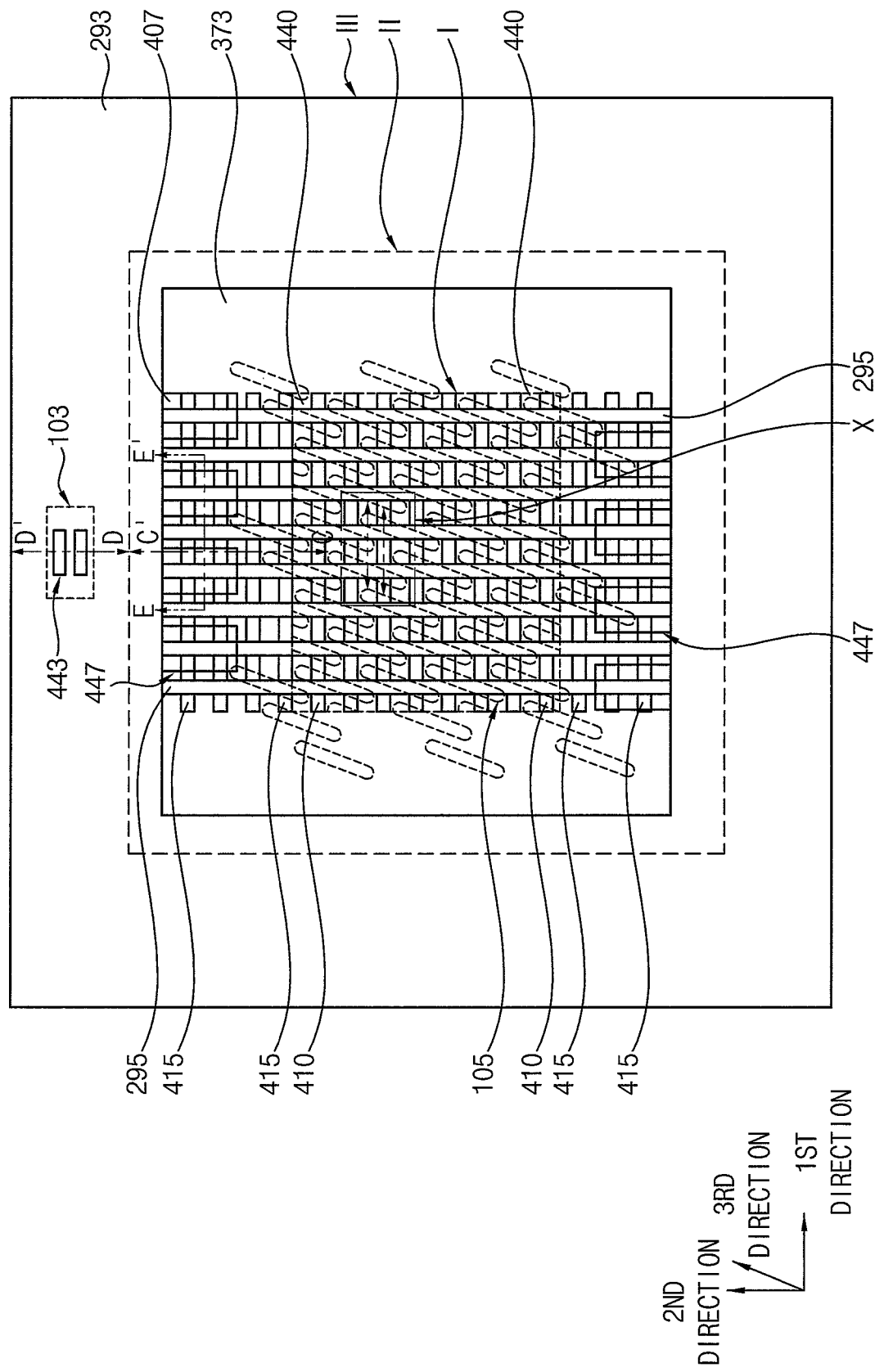
Figure 46:
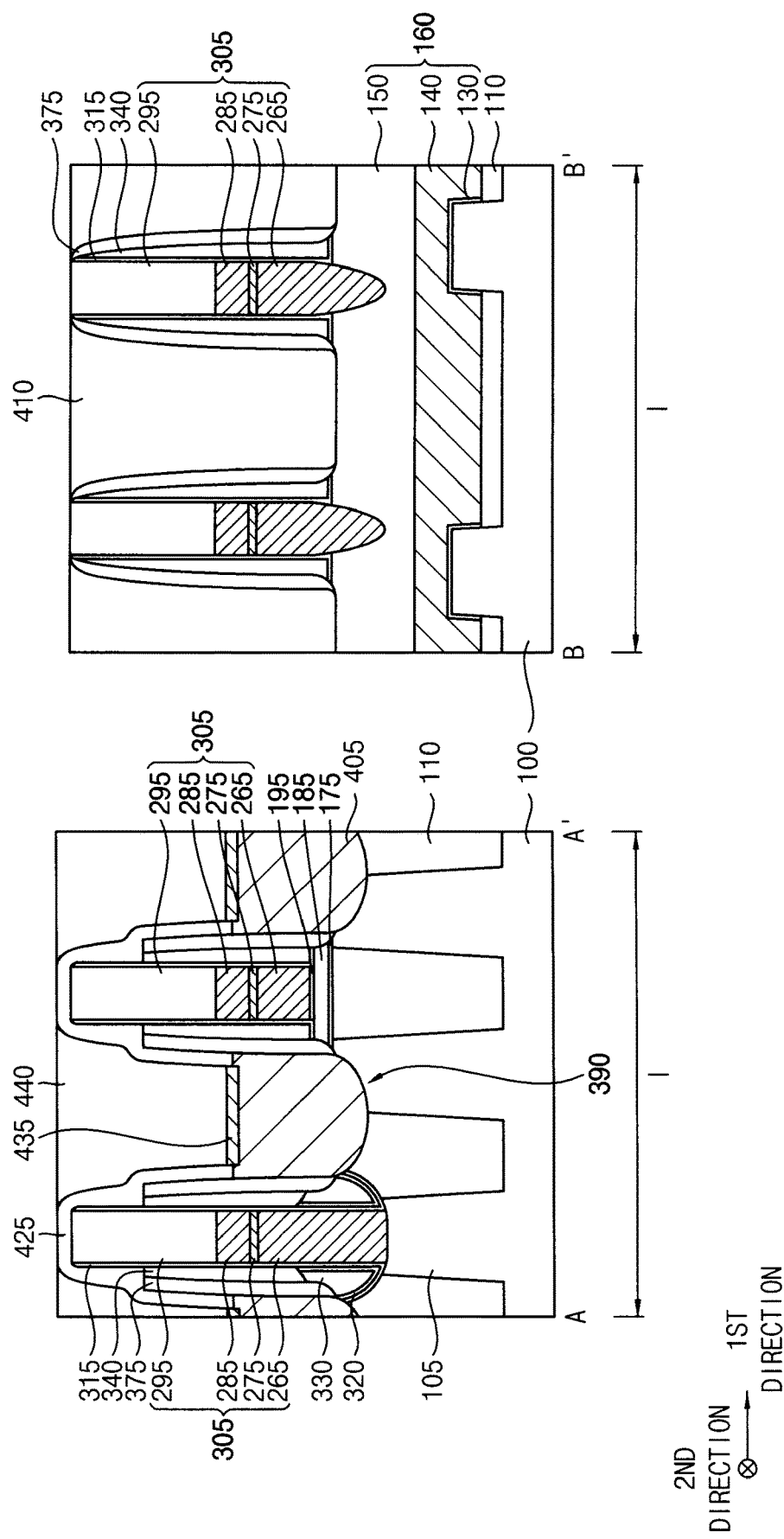

Referring to FIGS. 43 and 44, a fourth spacer layer may be formed on the bit line structure 305, the preliminary spacer structure, the first, third and fourth capping patterns 293, 410 and 415, the lower contact plug 405 and the dummy lower contact plug 407, and anisotropically etched to form a fourth spacer 425 covering the first to third spacers 315, 340 and 375 on each of opposite sidewalls of the bit line structure 305 in the first direction and to form a fifth spacer 427 covering each of opposite sidewalls of the third and fourth capping patterns 410 and 415 in the second direction, and thus upper surfaces of the lower contact plugs 405 and the dummy lower contact plugs 407 may be exposed.

First and second metal silicide patterns 435 and 437 may be formed on the exposed upper surfaces of the lower contact plugs 405 and the dummy lower contact plugs 407, respectively. In example embodiments, the first and second metal silicide patterns 435 and 437 may be formed by forming a third metal layer on the first to fourth capping patterns 293, 295, 410 and 415, the fourth and fifth spacers 425 and 427, the lower contact plug 405 and the dummy lower contact plug 407, performing a heat treatment thereon, and removing an unreacted portion of the third metal layer.

Referring to FIGS. 45 to 48, a first sacrificial layer 440 is formed on the first to fourth capping patterns 293, 295, 410 and 415, the fourth and fifth spacers 425 and 427, the first and second metal silicide patterns 435 and 437, the lower contact plug 405 and the dummy lower contact plug 407, an upper portion of the first sacrificial layer 440 is planarized until upper surfaces of the first to fourth capping patterns 293, 295, 410 and 415 are exposed, and first and second holes and 447 are formed on the third and second regions III and II, respectively, of the substrate 100.

The first sacrificial layer 440 may include, e.g., silicon-on-hardmask (SOH), amorphous carbon layer (ACL), etc.

Figure 47:
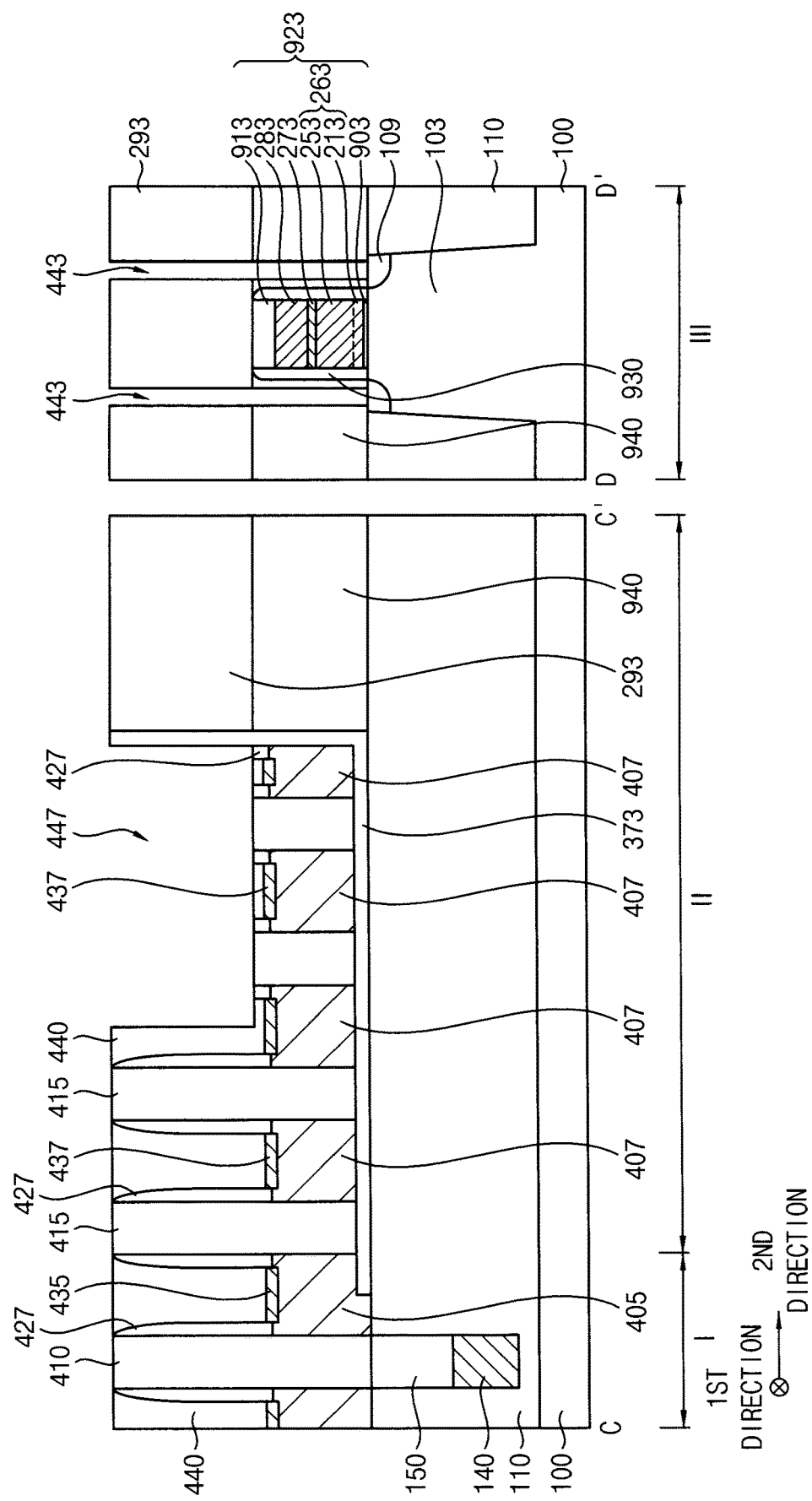
Figure 48:
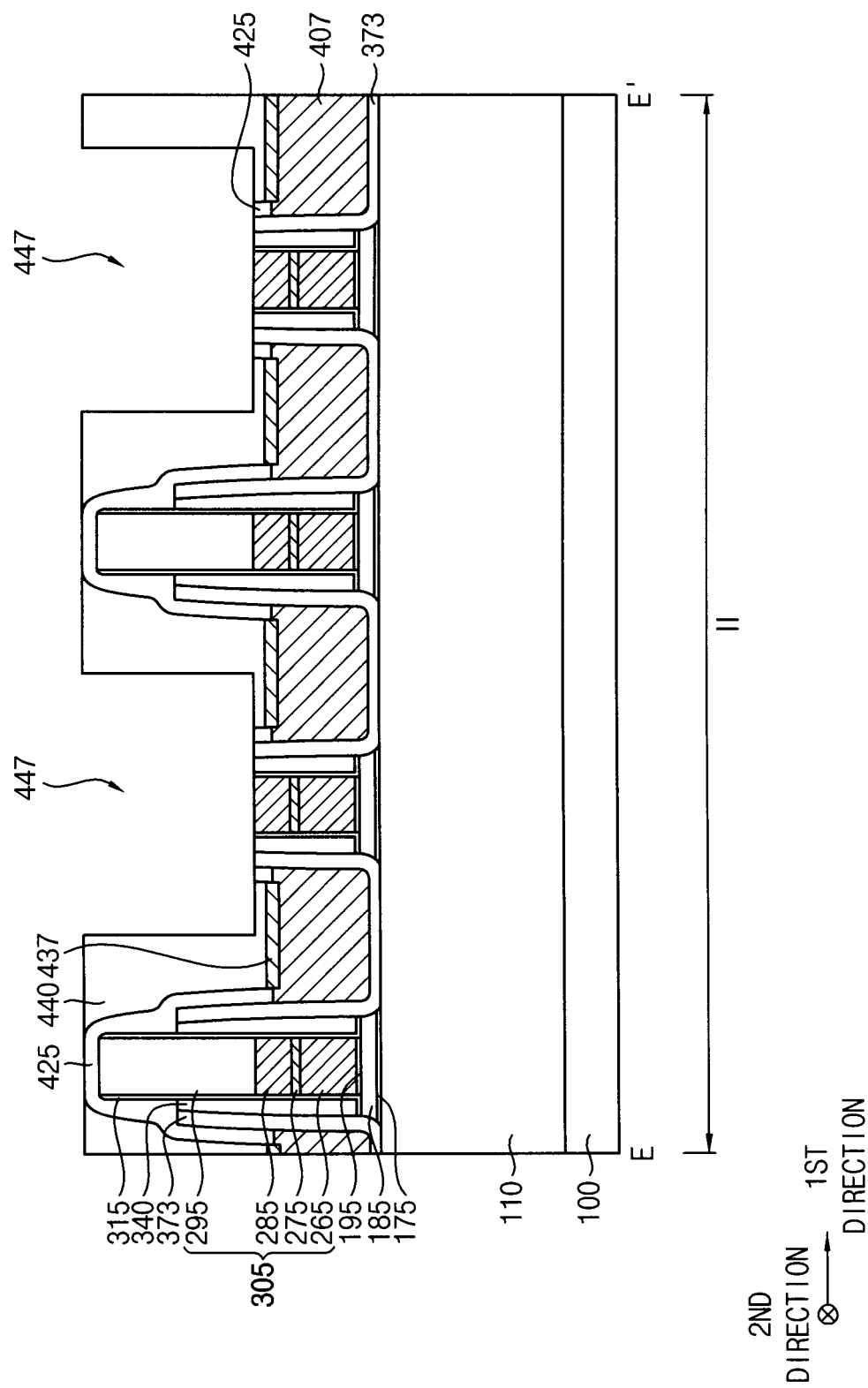

The first hole 443 (actually two first holes 443 as shown in FIG. 47) extends through the first capping pattern 293 and the first insulating interlayer pattern 940 to expose an upper surface of the source/drain layer 109 on the third region III of the substrate 100, and the second hole 447 extends through the second capping pattern 295 of the bit line structure 305 to expose an upper surface of the second metal pattern 285, and also extends through part of the first sacrificial layer 440. During the formation of the second hole 447, the first to fourth spacers 315, 340, 375 and 425 on the sidewall of the bit line structure 305, the fourth capping pattern 415 and the fifth spacer 427 on a sidewall of the fourth capping pattern 415 may be also partially removed.

In example embodiments, the second hole 447 may expose each of the second metal patterns 285 in even-numbered ones of the bit line structures 305 in the first direction on a first portion of the second region II of the substrate 100 adjacent a first side of the first region I of the substrate 100 in the second direction, and may also expose each of the second metal patterns 285 in odd-numbered ones of the bit line structures 305 in the first direction on a second portion of the second region H of the substrate 100 adjacent a second side of the first region I of the substrate in the second direction. For example, a plurality of second holes 447 may be formed on the first and second portions of the second region II of the substrate 100 adjacent the first and second sides, respectively, of the first region I of the substrate 100 in the second direction, and the second holes 447 may be formed in a zigzag pattern from a top down view.

Figure 49:
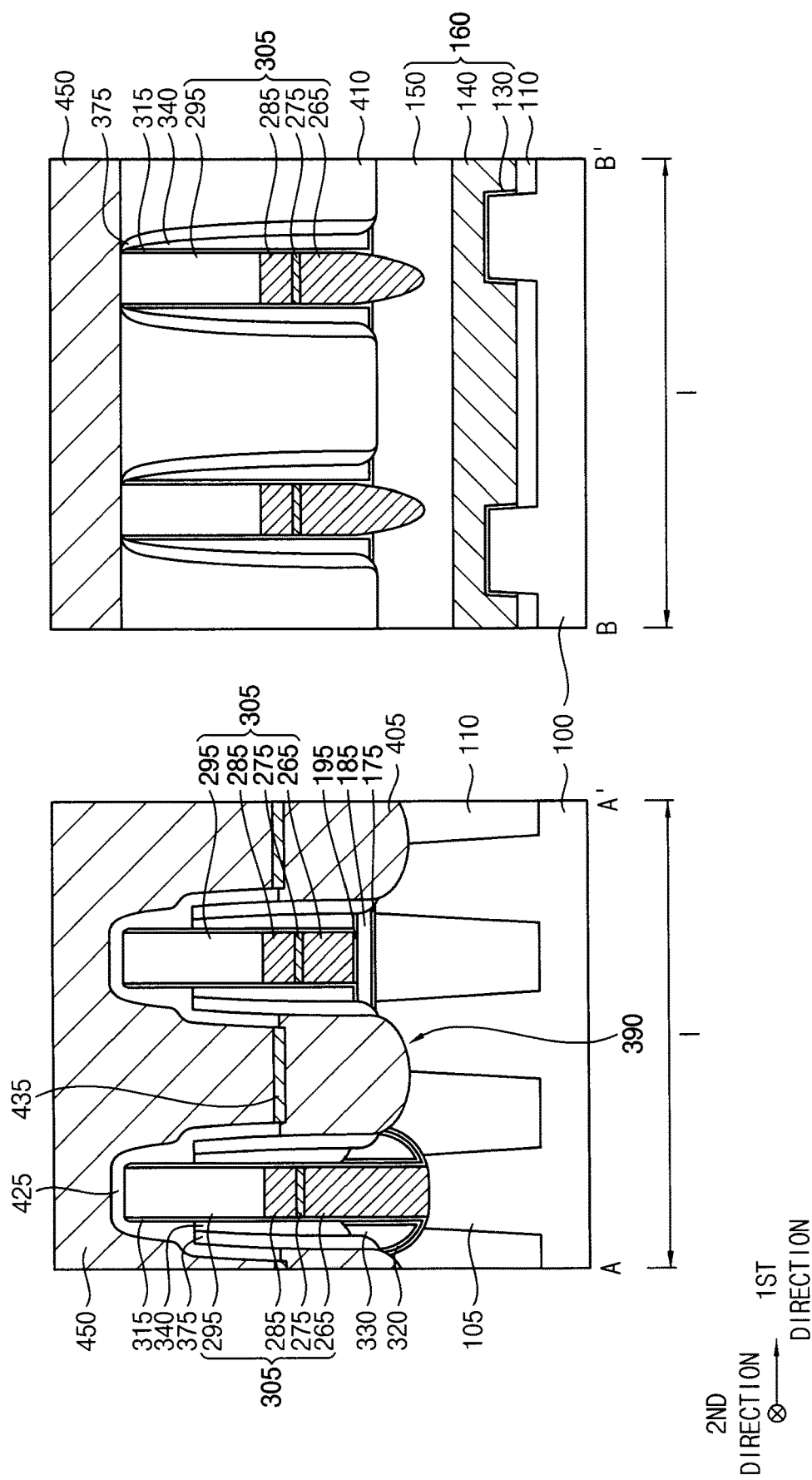
Figure 50:
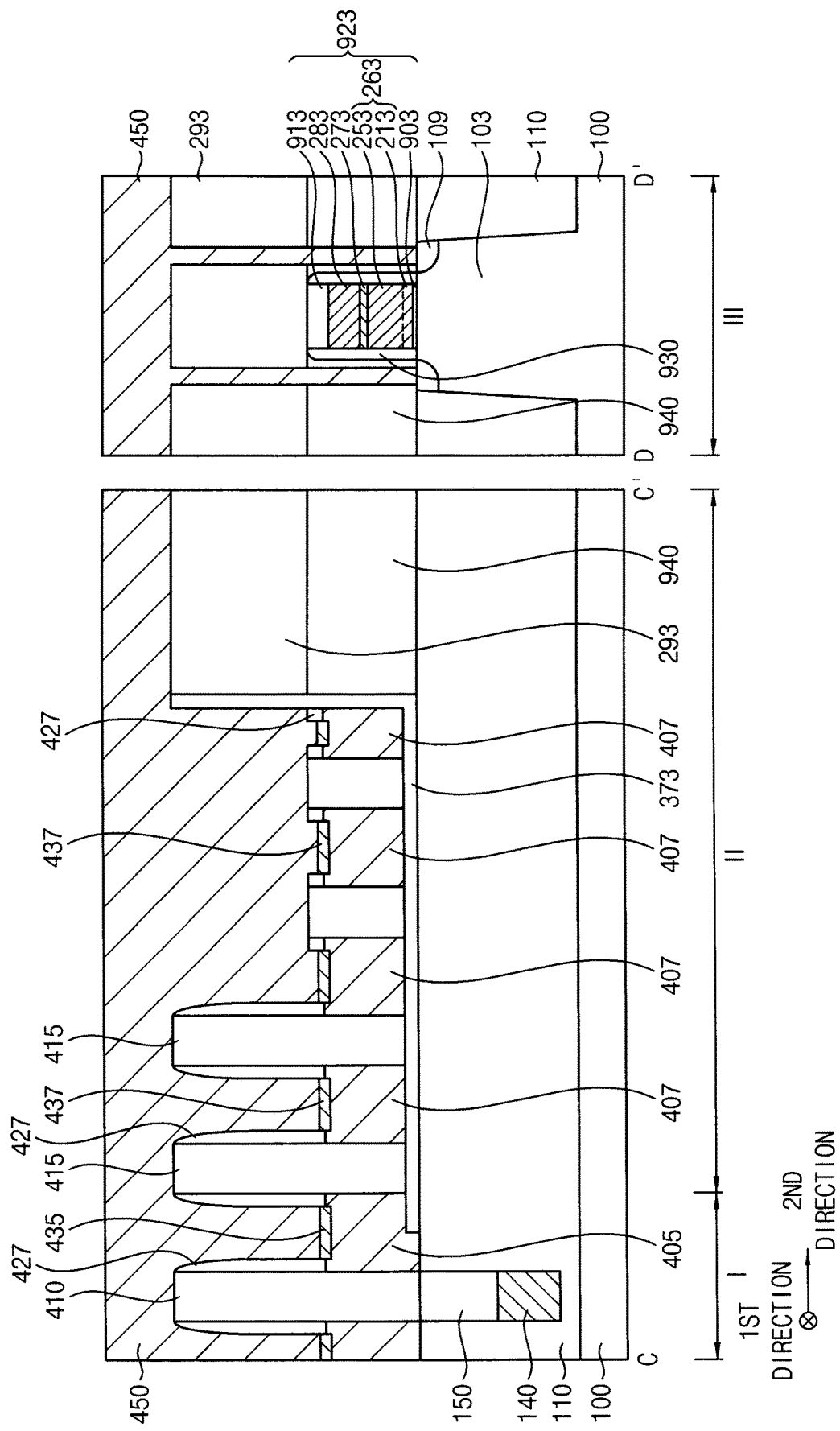
Figure 51:
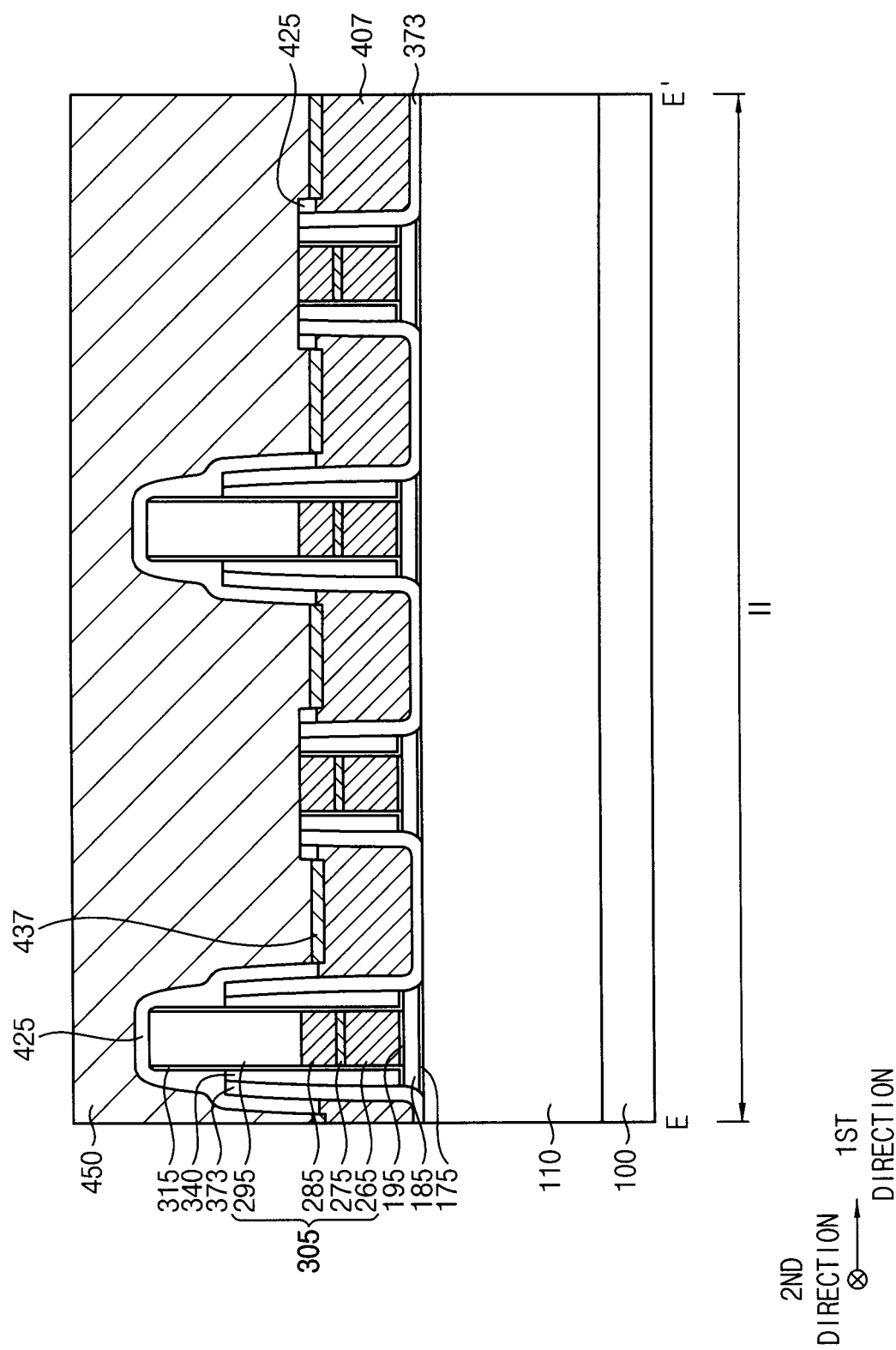

Referring to FIGS. 49 to 51, after removing the first sacrificial layer 440, an upper contact plug layer 450 is formed on the first to fourth capping patterns 293, 295, 410 and 415, the first to fifth spacers 315, 340, 375, 425 and 427, the first and second metal silicide patterns 435 and 437, the lower contact plug 405, the dummy lower contact plug 407, the second metal pattern and the source/drain layer 109, and an upper portion of the upper contact plug layer 450 may be planarized.

In example embodiments, the upper contact plug layer 450 has an upper surface higher than that of the first to fourth capping patterns 293, 295, 410 and 415.

Figure 52:
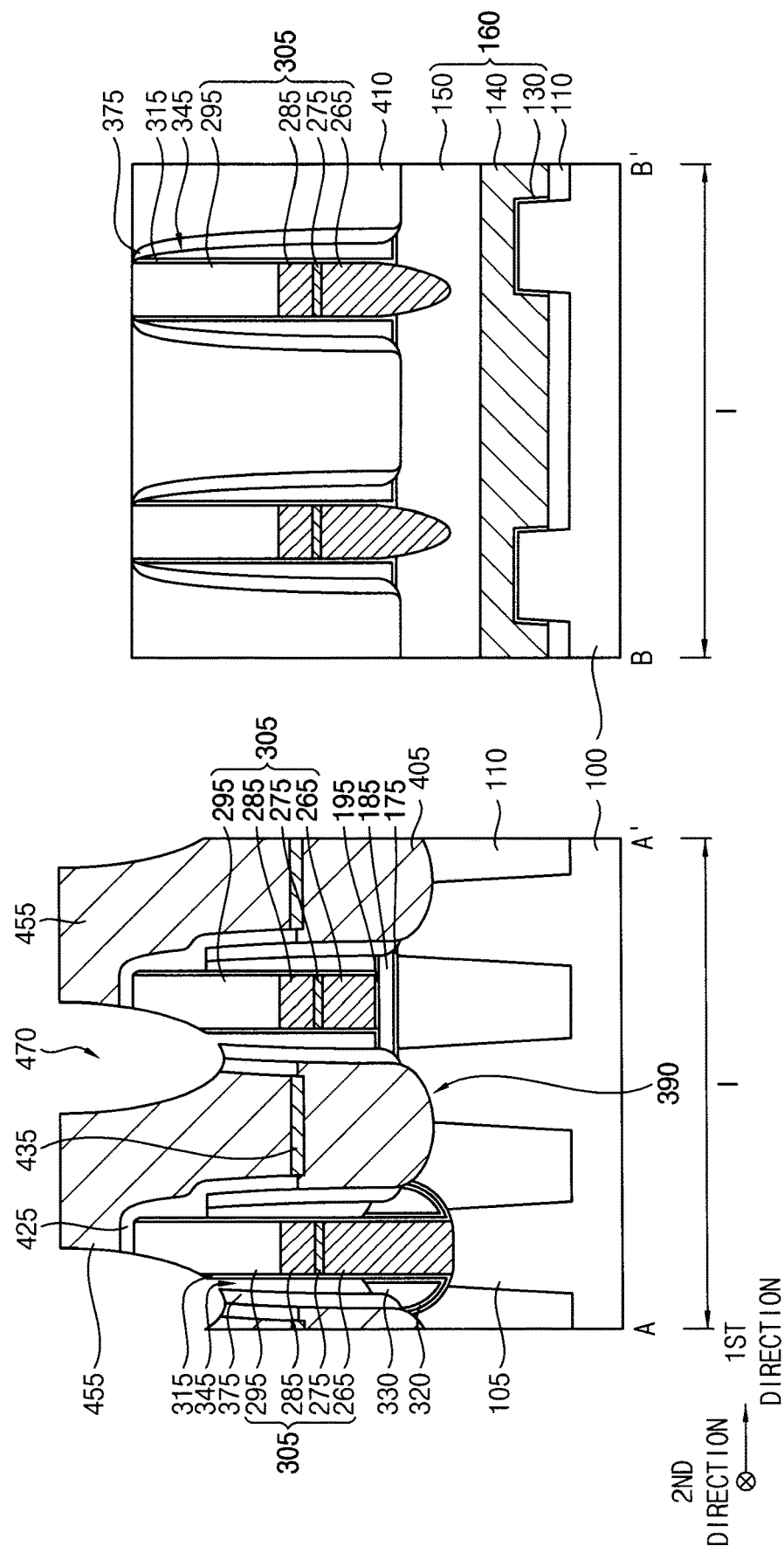
Figure 53:
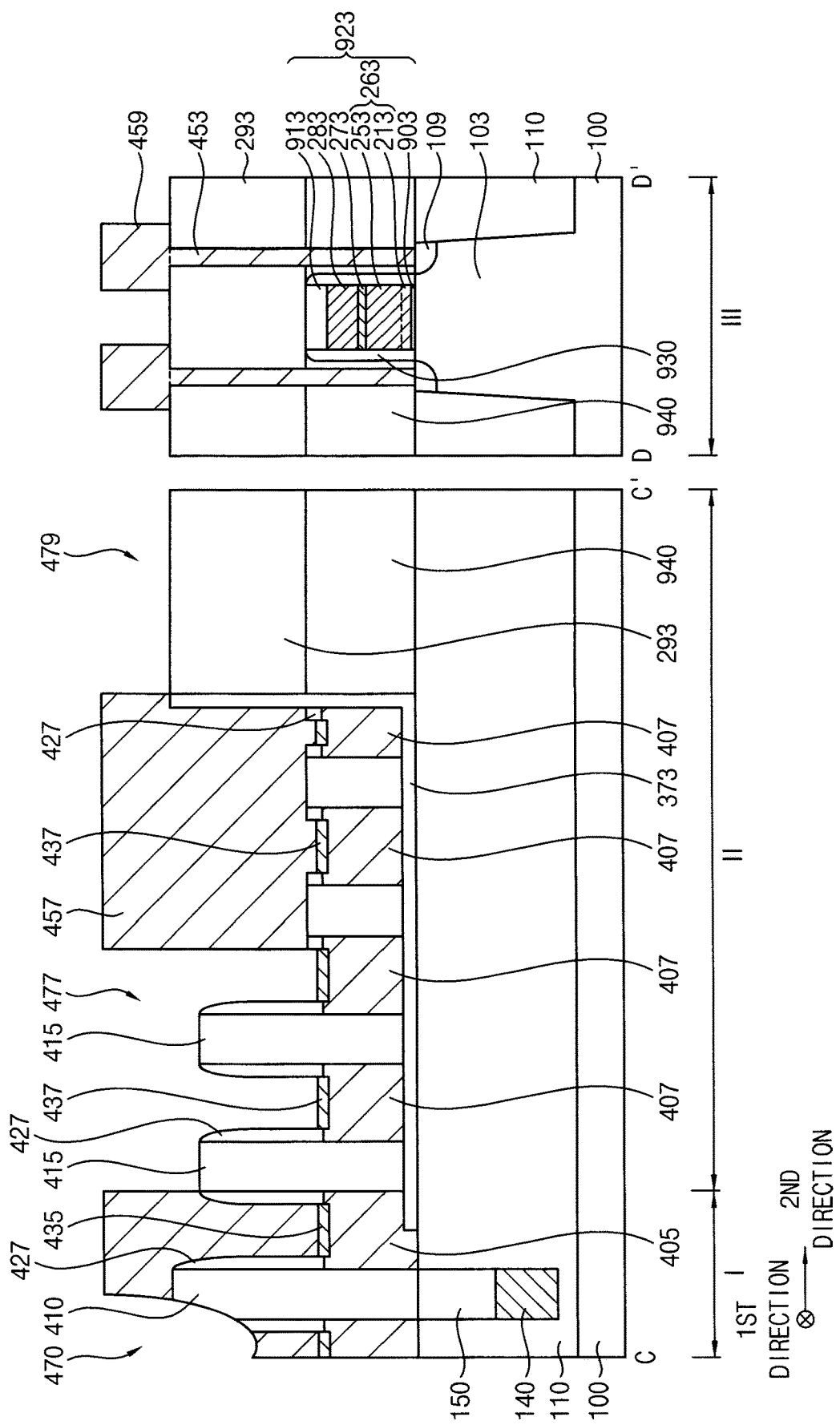
Figure 54:
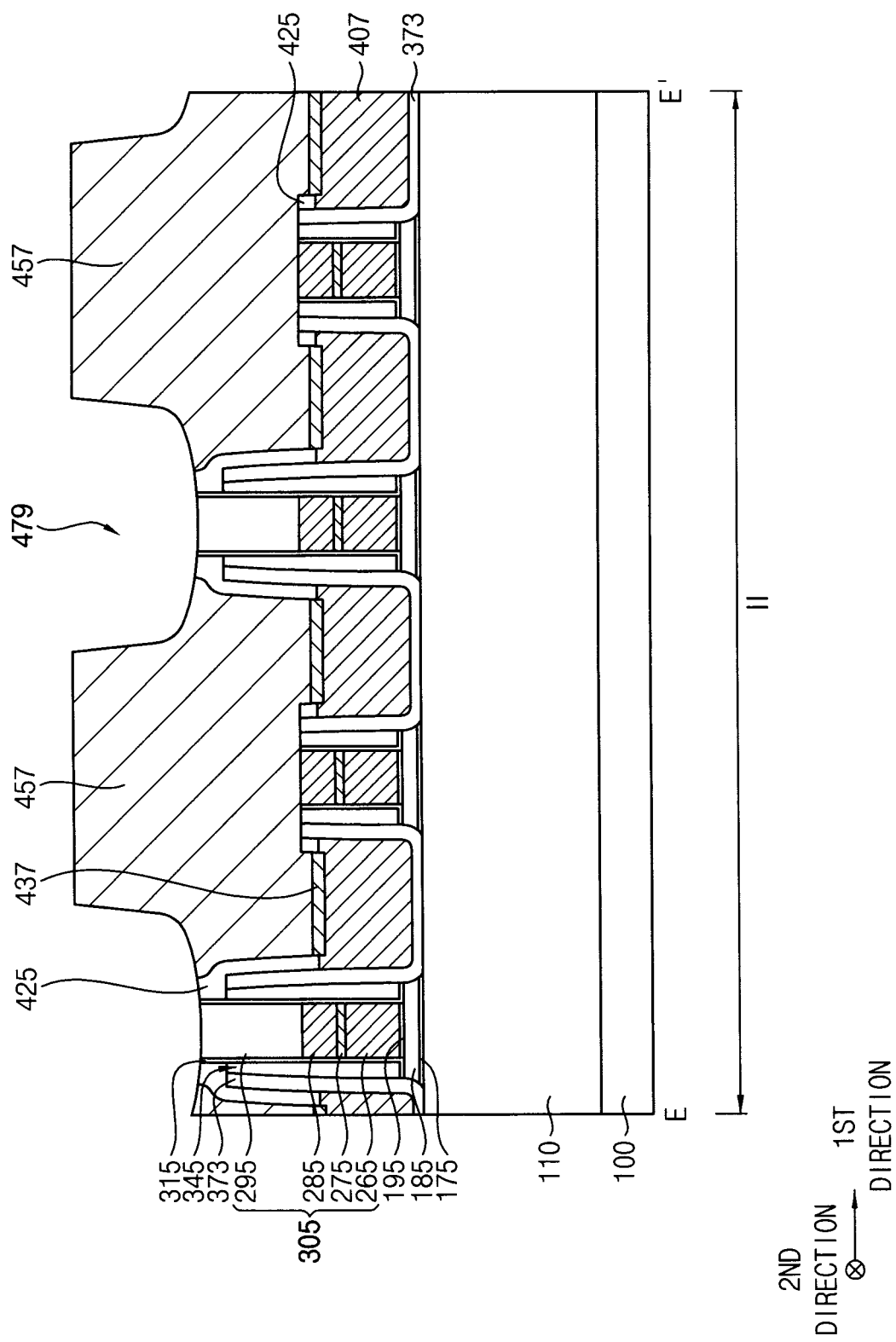

Referring to FIGS. 52 and 53, a portion of the upper contact plug layer 450 on the second region II of the substrate 100 is partially removed to form a seventh opening 477, third and fourth holes 470 and 479 may be formed on the first and second regions I and II, respectively, of the substrate 100, and a portion of the upper contact plug layer 450 on the third region III of the substrate 100 may be patterned.

The seventh opening 477 may be formed by removing a portion of the upper contact plug layer 450 on a portion of the second region II of the substrate 100 adjacent the first region I of the substrate 100, and thus the second and fourth capping patterns 295 and 415, the first, fourth and fifth spacers 315, 425 and 427, and the first and second metal silicide patterns 435 and 437 may be exposed. When the portion of the upper contact plug layer 450 is removed, upper portions of the third capping pattern 410 and the fifth spacer 427 may be also partially removed.

In example embodiments, the seventh opening 477 may extend in the first direction on each of opposite portions of the second region II of the substrate 100 adjacent the first region I of the substrate 100 in the second direction. Additionally, when the upper contact plug layer 450 is formed on each of opposite portions of the second region II of the substrate 100 adjacent the first region I of the substrate 100 in the first direction, the seventh opening 477 may extend in the second direction thereon. For example, the seventh opening 477 may have a bar shape or a rectangular ring shape surrounding the first region I of the substrate 100 in a plan view so that portions of the upper contact plug layer 450 on the first and second regions I and II, respectively, of the substrate 100 are spaced apart from each other.

The third hole 470 may be formed by removing an upper portion of the upper contact plug layer 450, an upper portion of the second capping pattern 295 and upper portions of the first, third and fourth spacers 315, 375 and 425, and thus may expose an upper surface of the second spacer 340.

As the third hole 470 is formed, the upper contact plug layer 450 may be transformed into a first upper contact plug 455 on the first region I of the substrate 100. In example embodiments, a plurality of first upper contact plugs 455 may be formed in each of the first and second directions, which may be disposed in a honeycomb shape in a plan view. Each of the first upper contact plugs 455 may have a shape of a circle, an ellipse, or a polygon in a plan view.

The lower contact plug 405, the first metal silicide pattern 435 and the first upper contact plug 455 sequentially stacked on the first region I of the substrate 100 may form a first contact plug structure.

The fourth hole 479 may be formed by removing a portion of the upper contact plug layer 450 so that an upper surface of the second capping pattern 295 of one of the bit line structures between ones of the bit line structures 305 of which the second metal patterns 285 are exposed by the second hole 447 is exposed. When the fourth hole 479 is formed, an upper portion of the second capping pattern 295 of the one of the bit line structures 305 and the first and fourth spacers 315 and 425 on the sidewall of the one of the bit line structures 305 may be also partially removed, and in some cases, the fourth capping pattern 415 and the fifth spacer 427 adjacent to the one of the bit line structures 305 may be also partially removed. Additionally, when the fourth hole 479 is formed, a portion of the upper contact plug layer 450 on the first capping pattern 293 may be also removed.

As the fourth hole 479 is formed, the upper contact plug layer 450 extending in the first direction on the second region II of the substrate 100 may be divided into a plurality of pieces, which may be referred to as second upper contact plugs 457, respectively. In example embodiments, a plurality of second upper contact plugs 457 may be formed on opposite portions of the second region II of the substrate 100 adjacent the first region I of the substrate 100 in the second direction, and may be disposed in a zigzag pattern in a plan view.

In some embodiments, the portion of the upper contact plug layer 450 on the first capping pattern 293 may not be entirely removed but may partially remain, and thus an upper portion of the second upper contact plug 457 may extend from the second region II of the substrate 100 to the third region II thereof, which may serve as a first wiring.

The dummy lower contact plug 407, the second metal silicide pattern 437 and the second upper contact plug 457 sequentially stacked on the second region II of the substrate 100 may form a second contact plug structure.

As the upper contact plug layer 450 on the third region III of the substrate 100 is patterned, a third contact plug 453 and a second wiring 459 sequentially stacked may be formed, which may be electrically connected to the source/drain layer 109.

The exposed second spacer 340 may be removed to form an air gap 345 connected to the third hole 470. The second spacer 340 may be removed by, e.g., a wet etching process.

In example embodiments, in the second spacer 340 on the sidewall of the bit line structure 305 extending in the second direction, not only a portion of the second spacer 340 exposed by the third hole 470 but also a portion of the second spacer 340 parallel to the exposed portion thereof may be removed. That is, not only a portion of the second spacer 340 exposed by the third hole 470 not to be covered by the first upper contact plug 455, but also a portion of the second spacer 340 adjacent thereto in the second direction to be covered by the third capping pattern 410, and a portion of the second spacer 340 adjacent thereto in the second direction to be covered by the first upper contact plug 455 may be removed.

Figure 55:
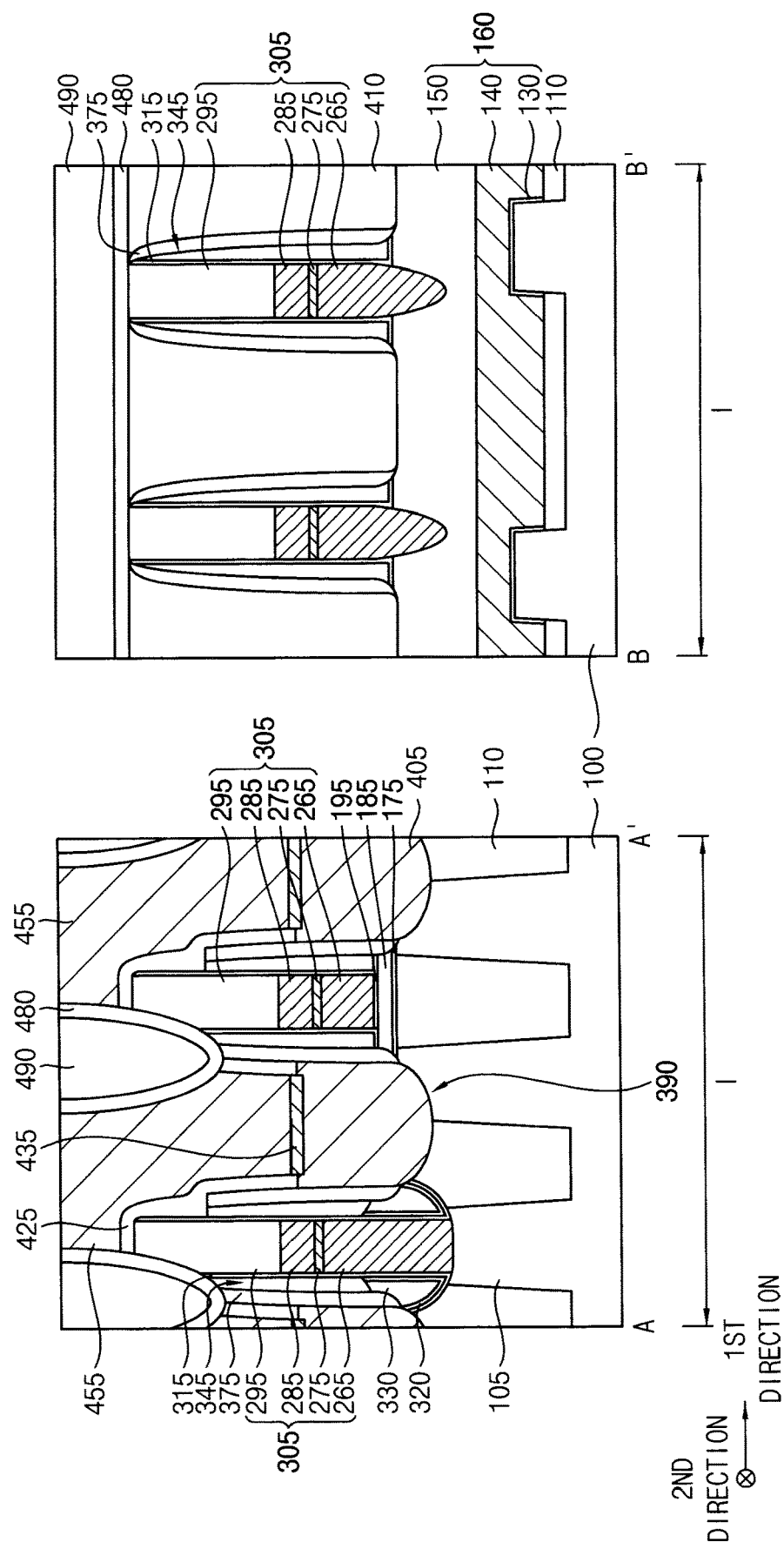

Referring to FIGS. 55 to 57, second and third insulating interlayers 480 and 490 sequentially stacked may be formed to fill the third and fourth holes 470 and 479, the seventh opening 477 on the first and second regions I and II of the substrate 100 and a space between the second wirings 459 on the third region III of the substrate 100.

The second insulating interlayer 480 may include a material having poor gap filling characteristics, and thus the air gap 345 under the third hole 470 may not be filled with the second insulating interlayer 480 but may remain. The air gap 345 may be also referred to as an air spacer 345, and may form a spacer structure together with the first, third, and fourth spacers 315, 375 and 425.

Referring to FIGS. 1 to 5 again, a capacitor 540 may be formed to contact an upper surface of the first upper contact plug 455.

For example, a second etch stop layer 500 and a mold layer (not shown) may be sequentially formed on the first and second upper contact plugs 455 and 457, the first and second insulating interlayers 480 and 490 and the second wiring 459, and partially etched to form an eighth opening (not shown) exposing an upper surface of the first upper contact plug 455.

A lower electrode layer (not shown) may be formed on a sidewall of the eighth opening, the exposed upper surface of the first upper contact plug 455 and the mold layer, a second sacrificial layer (not shown) may be formed on the lower electrode layer to sufficiently fill a remaining portion of the eighth opening, and upper portions of the lower electrode layer and the second sacrificial layer may be planarized until an upper surface of the mold layer is exposed to divide the lower electrode layer. The remaining second sacrificial layer and the mold layer may be removed by, e.g., a wet etching process, and thus a cylindrical lower electrode 510 may be formed on the exposed upper surface of the first upper contact plug 455. Alternatively, a pillar-type lower electrode 510 filling the eighth opening may be formed.

A dielectric layer 520 may be formed on the lower electrode 510 and the second etch stop layer 500, and an upper electrode 530 may be formed on the dielectric layer 520 to form a capacitor 540 including the lower electrode 510, the dielectric layer 520 and the upper electrode 530.

A fourth insulating interlayer 550 may be formed to cover the capacitor 540, which may complete the semiconductor device.

As illustrated above, when the third spacer layer 370 is formed and anisotropically etched to form the third spacer 375 on the sidewall of the bit line structure 305, the third mask 380 including a material having an etching selectivity with respect to the third spacer layer 370, for example, a photoresist pattern may be formed on the second region II of the substrate 100 to protect the portion of the third spacer layer 370 on the isolation pattern 110 so that the portion of the third spacer layer 370 may remain as the first etch stop layer 373. Thus, when the fourth recess 390 is formed on the first region I of the substrate 100 by the etching process using the third spacer 375 as an etching mask to remove the upper portions of the second active pattern 105 and the isolation pattern 110, the portion of the isolation pattern 110 covered by the first etch stop layer 373 on the second region II of the substrate 100 is not etched.

Accordingly, unlike the lower contact plug 405 contacting the second active pattern 105 to be electrically connected thereto on the first region I of the substrate 100, a bottom surface of the dummy lower contact plug 407 may be covered by the first etch stop layer 393 to be electrically insulated from the second active pattern 105 on the second region II of the substrate 100, and thus the electrical short therebetween may be prevented and the dummy lower contact plug 407 may not pass any electrical signal to an active pattern, thereby rendering it a dummy contact plug.

Additionally, like the lower contact plug 405 and the third capping pattern 410 on the first region I of the substrate 100, the dummy lower contact plug 407 and the fourth capping pattern may be also formed on the portion of the second region II of the substrate 100 adjacent the first region I of the substrate 100. Thus, for example, when the upper portions of the second and third spacers 340 and 375 are etched, the dummy lower contact plug 407 and the fourth capping pattern 415 together with the first etch stop layer 373 have been formed on the second region II of the substrate 100, and thus the isolation pattern 110 thereunder may not be removed, and a conductive material may not permeate into a space generated from the removed portion of the isolation pattern 110 so that electrical short between neighboring structures may be prevented.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A semiconductor device comprising:
a substrate including a cell region, a peripheral region, and an interface region that is between the cell region and the peripheral region, the cell region including an active pattern, and the interface region including a device isolation pattern and an active pattern;
a gate structure buried in the cell region of the substrate and including a gate mask pattern, the gate mask pattern having a recess;
a first bit line structure including a first portion that is on the cell region of the substrate and a second portion that is on the interface region of the substrate;
a second bit line structure including a third portion that is on the cell region of the substrate and a fourth portion that is on the interface region of the substrate;
a first contact between the first portion of the first bit line structure and the third portion of the second bit line structure;
a first capping pattern between the first portion of the first bit line structure and the third portion of the second bit line structure and adjacent to the first contact;
a second contact between the second portion of the first bit line structure and the fourth portion of the second bit line structure;
a second capping pattern between the second portion of the first bit line structure and the fourth portion of the second bit line structure and adjacent to the second contact; and a bottom electrode on the first contact, wherein a bottom surface of the first capping pattern contacts the recess of the gate mask pattern of the gate structure, and wherein the bottom surface of the first capping pattern is lower than a bottom surface of the second capping pattern.

2. The semiconductor device of claim 1, further comprising an etch stop insulation layer that is arranged between the second capping pattern and the device isolation pattern of the interface region of the substrate, and/or between the second contact and the device isolation pattern of the interface region of the substrate.

3. The semiconductor device of claim 1, wherein an upper width of the first capping pattern is greater than a lower width of the first capping pattern.

4. The semiconductor device of claim 1, wherein the first contact includes a conductive material, and the second contact includes the same conductive material as that of the first contact.

5. The semiconductor device of claim 1, wherein each of the first contact and the second contact includes doped poly-silicon.

6. The semiconductor device of claim 1, wherein the first contact includes a conductive material, and the second contact includes an insulating material.

7. The semiconductor device of claim 1, wherein a bottom surface of the first contact is lower than a bottom surface of the second contact.

8. The semiconductor device of claim 1, wherein the first contact is electrically connected to the active pattern of the cell region of the substrate and the bottom electrode, and wherein the second contact is not electrically connected to the active pattern of the interface region of the substrate, and/or the second contact is not electrically connected to the bottom electrode.

9. A semiconductor device comprising:

a substrate including a cell region, a peripheral region, and an interface region that is between the cell region and the peripheral region, the cell region including an active pattern, and the interface region including a device isolation pattern and an active pattern;

a gate structure buried in the cell region of the substrate and including a gate mask pattern, the gate mask pattern having a recess;

a first bit line structure including a first portion that is on the cell region of the substrate and a second portion that is on the interface region of the substrate;

a second bit line structure including a third portion that is on the cell region of the substrate and a fourth portion that is on the interface region of the substrate;

a first contact between the first portion of the first bit line structure and the third portion of the second bit line structure;

a first capping pattern between the first portion of the first bit line structure and the third portion of the second bit line structure and adjacent to the first contact;

a second contact between the second portion of the first bit line structure and the fourth portion of the second bit line structure;

a second capping pattern between the second portion of the first bit line structure and the fourth portion of the second bit line structure and adjacent to the second contact;

an etch stop insulation layer on the interface region of the substrate; and a bottom electrode on the first contact, wherein a bottom surface of the first capping pattern contacts the recess of the gate mask pattern of the gate structure, wherein an upper width of the first capping pattern is greater than a lower width of the first capping pattern, and wherein the etch stop insulation layer is arranged between the second capping pattern and the device isolation pattern of the interface region of the substrate, and/or between the second contact and the device isolation pattern of the interface region of the substrate.

10. The semiconductor device of claim 9, wherein the bottom surface of the first capping pattern is lower than a bottom surface of the second capping pattern.

11. The semiconductor device of claim 9, wherein a bottom surface of the first contact is lower than a bottom surface of the second contact.

12. The semiconductor device of claim 9, wherein the first contact includes a conductive material, and the second contact includes the same conductive material as that of the first contact.

13. The semiconductor device of claim 9, wherein each of the first contact and the second contact includes doped poly-silicon.

14. The semiconductor device of claim 9, wherein the first contact includes a conductive material, and the second contact includes an insulating material.

15. The semiconductor device of claim 9, wherein the first contact is electrically connected to the active pattern of the cell region of the substrate and the bottom electrode, and wherein the second contact is not electrically connected to the active pattern of the interface region of the substrate, and/or the second contact is not electrically connected to the bottom electrode.

16. A semiconductor device comprising:

a substrate including a cell region, a peripheral region, and an interface region that is between the cell region and the peripheral region, the cell region including an active pattern, and the interface region including a device isolation pattern and an active pattern;

a gate structure buried in the cell region of the substrate and including a gate mask pattern, the gate mask pattern having a recess;

a first bit line structure including a first portion that is on the cell region of the substrate and a second portion that is on the interface region of the substrate;

a second bit line structure including a third portion that is on the cell region of the substrate and a fourth portion that is on the interface region of the substrate;

a first contact between the first portion of the first bit line structure and the third portion of the second bit line structure;

a first capping pattern between the first portion of the first bit line structure and the third portion of the second bit line structure and adjacent to the first contact;

a second contact between the second portion of the first bit line structure and the fourth portion of the second bit line structure;

a second capping pattern between the second portion of the first bit line structure and the fourth portion of the second bit line structure and adjacent to the second contact; and a bottom electrode on the first contact, wherein a bottom surface of the first capping pattern contacts the recess of the gate mask pattern of the gate structure, wherein a bottom surface of the first contact is lower than a bottom surface of the second contact, and wherein the first contact incudes a conductive material and the second contact includes the same conductive material as that of the first contact.

17. The semiconductor device of claim 16, further comprising an etch stop insulation layer that is arranged between the second capping pattern and the device isolation pattern of the interface region of the substrate, and/or between the second contact and the device isolation pattern of the interface region of the substrate.

18. The semiconductor device of claim 16, wherein a bottom surface of the first capping pattern is lower than a bottom surface of the second capping pattern.

19. The semiconductor device of claim 16, wherein each of the first contact and the second contact includes doped poly-silicon.

20. The semiconductor device of claim 16, wherein the first contact is electrically connected to the active pattern of the cell region of the substrate and the bottom electrode, and wherein the second contact is not electrically connected to the active pattern of the interface region of the substrate, and/or the second contact is not electrically connected to the bottom electrode.

* * * * *